US012631914B2

(12) United States Patent
Ham et al.

(10) Patent No.: US 12,631,914 B2
(45) Date of Patent: May 19, 2026

(54) DISPLAY APPARATUS WITH VIBRATION APPARATUS

(71) Applicant: LG DISPLAY CO., LTD., Seoul (KR)

(72) Inventors: Sungsu Ham, Paju-si (KR); Sungtae Lee, Paju-si (KR); Joongsup Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 264 days.

(21) Appl. No.: 17/541,541

(22) Filed: Dec. 3, 2021

(65) Prior Publication Data

US 2022/0181403 A1    Jun. 9, 2022

(30) Foreign Application Priority Data

Dec. 9, 2020    (KR) ........................ 10-2020-0171550

(51) Int. Cl.
| *G02F 1/1333* | (2006.01) |
| *G02F 1/13* | (2006.01) |
| *H04R 17/00* | (2006.01) |
| *H10K 59/80* | (2023.01) |
| *H10K 59/12* | (2023.01) |

(52) U.S. Cl.
CPC ...... *G02F 1/133305* (2013.01); *G02F 1/1306* (2013.01); *G02F 1/133308* (2013.01); *G02F 1/133394* (2021.01); *H04R 17/00* (2013.01); *H10K 59/871* (2023.02); *H10K 59/12* (2023.02)

(58) Field of Classification Search
CPC ............. G02F 1/133394; G02F 1/1306; G02F 1/133308; G02F 1/133314; G02F 1/133305; H04R 17/00; H04R 17/005; H10K 59/12; G09F 9/30; G09F 9/301

See application file for complete search history.

(56) References Cited

U.S. PATENT DOCUMENTS

| 6,278,790 B1 | 8/2001 | Davis et al. | |
| 10,983,637 B2 | 4/2021 | Lee et al. | |
| 2013/0167881 A1* | 7/2013 | Korbler ................ H10N 30/092 |
| | | | 29/25.35 |
| 2018/0053813 A1* | 2/2018 | Choi ...................... H10K 59/00 |
| 2019/0037165 A1 | 1/2019 | Lee et al. | |

(Continued)

FOREIGN PATENT DOCUMENTS

| CN | 205017565 U | 2/2016 |
| CN | 109946864 A | 6/2019 |

(Continued)

OTHER PUBLICATIONS

Japanese Office Action dated Dec. 19, 2022 issued in Patent Application No. 2021-196751 (7 pages).

(Continued)

*Primary Examiner* — Jennifer D. Carruth
*Assistant Examiner* — Agnes Dobrowolski
(74) *Attorney, Agent, or Firm* — Fish & Richardson P.C.

(57) ABSTRACT

An apparatus comprises a display panel configured to display an image, a vibration apparatus disposed at a rear surface of the display panel and configured to vibrate the display panel, a supporting member disposed at the rear surface of the display panel and including a first member and a second member, and the first member and the second member are disposed on a same surface as the supporting member.

38 Claims, 21 Drawing Sheets

I-I'

(56)                References Cited

U.S. PATENT DOCUMENTS

| | | | |
|---|---|---|---|
| 2019/0182573 A1* | 6/2019 | Shin | H04R 1/028 |
| 2019/0238986 A1* | 8/2019 | Ikeuchi | H04R 1/02 |
| 2020/0097244 A1 | 3/2020 | Kim et al. | |
| 2022/0238787 A1* | 7/2022 | Kagawa | H10N 30/02 |

FOREIGN PATENT DOCUMENTS

| | | | |
|---|---|---|---|
| CN | 110854262 A | | 2/2020 |
| CN | 111629305 A | | 9/2020 |
| JP | S58-172289 U | | 11/1983 |
| JP | S59-164385 U | | 11/1984 |
| JP | H 10-210587 A | | 8/1998 |
| JP | H 11-225389 A | | 8/1999 |
| JP | 2006-287545 A | | 10/2006 |
| JP | 2006-325242 A | | 11/2006 |
| JP | 2007-104650 A | | 4/2007 |
| JP | 2009-290838 A | | 12/2009 |
| JP | 2020-039107 A | | 3/2020 |
| JP | 2020-145674 A | | 9/2020 |
| JP | 2020-167360 A | | 10/2020 |
| JP | 2020-167655 A | | 10/2020 |
| KR | 20150078267 A | | 7/2015 |
| KR | 20190041768 A | * | 4/2019 |
| KR | 20200033557 A | | 3/2020 |
| KR | 20200105393 A | | 9/2020 |
| WO | 2014/050983 A1 | | 4/2014 |

OTHER PUBLICATIONS

Taiwanese Office Action dated Jun. 26, 2023 issued in Patent Application No. 110145070 (8 pages).
Japanese Office Action dated Sep. 1, 2023 issued in Patent Application No. 2021-196751 (7 pages).
Chinese Office Action dated Dec. 4, 2023 issued in Patent Application No. 202111480723.2 (14 pages).
Chinese Office Action dated Jul. 18, 2024 issued in Patent Application No. 202111480723.2 (13 pages).
Japanese Office Action dated Sep. 19, 2024 issued in Patent Application No. 2021-196751 (4 pages).
Office Action in Korean Appln. No. 20200171550, mailed on Jan. 20, 2025, 20 pages (with English translation).

* cited by examiner

211(210)

211(210)

211(210)

: 211a

: 211b

211(210)

: 211a

: 211b

211(210)

☐ : 211a

☐ : 211b

211(210)

☐ : 211a

☐ : 211b

DISPLAY APPARATUS WITH VIBRATION APPARATUS

CROSS-REFERENCE TO RELATED APPLICATION

This application claims the priory of Korean Patent Application No. 10-2020-0171550 filed on Dec. 9, 2020, which is hereby incorporated by reference in its entirety.

BACKGROUND

Field of the Disclosure

The present disclosure relates to an apparatus, and more particularly, to an apparatus including a vibration member having the apparatus vibrated to generate a sound or a vibration for enhancing a sound characteristic and a sound pressure level characteristic.

Description of the Background

In display apparatuses, a display panel displays an image, and a separate speaker should be installed for providing a sound. When there is a speaker in a display apparatus, the speaker occupies a space that causes design and spatial disposition of the display apparatus to be limited.

A speaker applied to the display apparatus may be, for example, an actuator, including a magnet and a coil. However, when the actuator is applied to the display apparatus, a thickness becomes large. Thus, piezoelectric elements that enable thinness to be implemented are attracting much attention.

However, since the piezoelectric elements are fragile, they can be easily damaged by the external impact. As a result, reliability of sound reproduction can be low. Moreover, when a speaker such as a piezoelectric element is applied to a flexible display apparatus, damage on the apparatus can occur due to a fragile characteristic.

SUMMARY

Accordingly, the present disclosure is directed to an apparatus that substantially obviates one or more problems due to limitations and disadvantages described above.

More specifically, the present disclosure is to provide an apparatus including a vibration member (or vibration object) to generate a sound or a vibration and have enhanced sound quality and sound pressure level characteristic.

Additional features and aspects will be set forth in part in the description which follows and in part will become apparent from the description or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, an apparatus comprises a display panel configured to display an image, a vibration apparatus disposed at a rear surface of the display panel and configured to vibrate the display panel, and a supporting member disposed at the rear surface of the display panel and including a first member and a second member, the first member and the second member are disposed on a same surface as the supporting member.

In another aspect, an apparatus comprises a vibration member, a vibration apparatus disposed at the vibration member, and a supporting member disposed at a rear surface of the vibration member, the supporting member comprises a first member overlapping with the vibration apparatus.

An apparatus according to the aspects of the present disclosure may include a vibration apparatus which is configured to vibrate a display panel or a vibration member, and thus, may be configured to generate a sound so that a traveling direction of the sound of the apparatus is a direction toward a forward region in front of the display panel or the vibration member. A forward region in front of the display panel may refer to a region where a user looking at images displayed by the display panel may be disposed. A rear surface may denote a surface facing away from the display panel, a front surface may denote a surface facing towards the display panel.

According to aspects of the present disclosure, a supporting member including a first member and a second member may be provided, thereby improving a reproduction band of the low-pitched sound band and providing an apparatus having an enhanced a sound characteristic and/or a sound pressure level characteristic of the low-pitched sound band.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain principles of the disclosure.

In the drawings.

Figure 1:
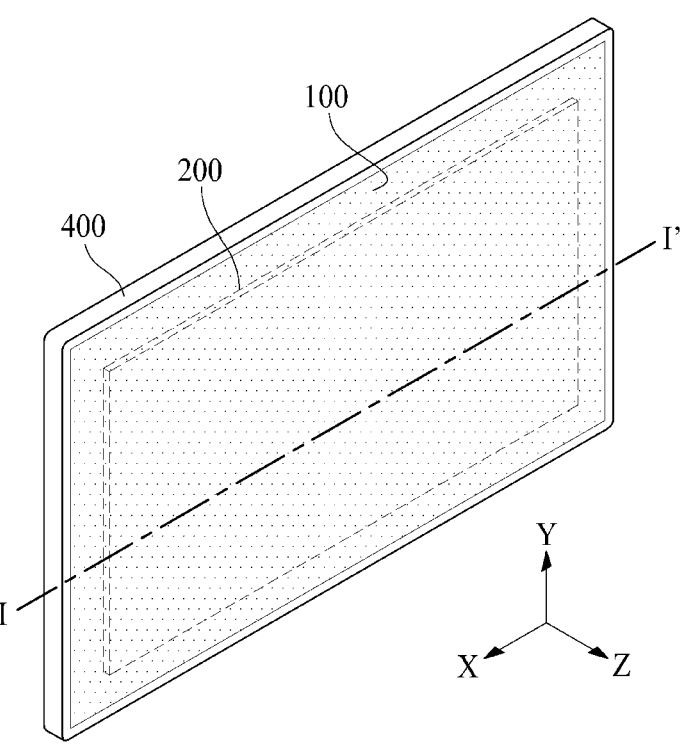
FIG. 1 illustrates an apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element or a layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of aspects, when a structure is described as being positioned "on or above or over" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto, unless otherwise specified.

In the present disclosure, an apparatus may include a display apparatus such as an organic light emitting display (OLED) module, a liquid crystal module (LCM), or the like including a display panel and a driver for driving the display panel. Also, the apparatus may include a set device (or a set apparatus) or a set electronic device such as a notebook computer, a TV, a computer monitor, an equipment apparatus including an automotive apparatus or another type apparatus for vehicles, or a mobile electronic device such as a smartphone or an electronic pad, which is a complete product (or a final product) including an LCM, an OLED module, or the like.

Therefore, in the present disclosure, examples of the apparatus may include a display apparatus itself, such as an LCM, an OLED module, or the like, and a set device which is a final consumer device or an application product including the LCM, the OLED module, or the like.

In some aspects, an LCM or an OLED module including a display panel and a driver may be referred to as a display apparatus, and an electronic device which is a final product including an LCM or an OLED module may be referred to as a set device. For example, the display apparatus may include a display panel, such as an LCD or an OLED, and a source printed circuit board (PCB) which is a controller for driving the display panel. The set device may further include a set PCB which is a set controller electrically connected to the source PCB to overall control the set device.

A display panel applied to an aspect of the present disclosure may use all types of display panels such as a liquid crystal display panel, an organic light emitting diode (OLED) display panel, an electroluminescent display panel, or the like, but aspects of the present disclosure are not limited. For example, the display panel may be a display panel capable of generating a sound by being vibrated by a vibration apparatus according to an aspect of the present disclosure. A display panel applied to a display apparatus according to an aspect of the present disclosure is not limited to a shape or a size of the display panel.

For example, when the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT) which is a switching element for adjusting a light transmittance of each of the plurality of pixels, an upper substrate including a color filter and/or a black matrix or the like, and a liquid crystal layer between the array substrate and the upper substrate.

When the display panel is the organic light emitting display panel (OLED), the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed at the array substrate to cover the organic light emitting device layer. The encapsulation substrate may protect the TFT and the organic light emitting device layer from an external impact and may prevent water or oxygen from penetrating into the organic light emitting device layer.

Also, a layer provided on the array substrate may include an inorganic light emitting layer, for example, a nano-sized material layer, a quantum dot, a light emitting layer, or the like. As another aspect of the present disclosure, the layer provided on the array substrate may include a micro light emitting diode.

The display panel may further include a backing such as a metal plate attached at the display panel. However, aspects of the present disclosure are not limited to the metal plate, and the display panel may further include another structure.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Hereinafter, aspects of the present disclosure will be described in detail with reference to the accompanying drawings. For convenience of description, a scale of each of elements illustrated in the accompanying drawings differs from a real scale, and thus, is not limited to a scale illustrated in the drawings.

In a case where a speaker is provided in a display apparatus so as to realize a sound in the display apparatus, the speaker may be implemented as a film-type, and thus, a thickness of the display apparatus may be thin. A film-type vibration apparatus may be manufactured to have a large area, and may be applied to a display apparatus having a large area. However, because the film-type vibration apparatus is low in a piezoelectric characteristic, it may be difficult to apply the film-type vibration apparatus to a display apparatus having a large area due to a low vibration. When ceramic is used for enhancing a piezoelectric characteristic, the film-type vibration apparatus may be weak in durability, and a size of ceramic may be limited. When a vibration apparatus including a piezoelectric composite including piezoelectric ceramic is applied to a display apparatus, because the piezoelectric composite vibrates in a horizontal direction with respect to a left-right direction (for example, a horizontal direction with respect to a left-right direction of the display apparatus), it may be unable to sufficiently vibrate the display apparatus in a vertical (or front-to-rear) direction. Thus, it may be difficult to apply the vibration apparatus to the display apparatus, and it may be unable to output a desired sound to a forward region in front of the display apparatus. In a case where a film-type piezoelectric element is applied to an apparatus, there may be a problem where a sound pressure level characteristic is lower than that of a speaker such as an actuator. In a case where a stack type piezoelectric element where a plurality of film-type piezoelectric elements are stacked as a plurality of layers is applied to an apparatus, power consumption may increase, and a thickness of the apparatus may be thickened. Also, when one vibration apparatus is disposed at a rear surface of a display panel (for example, a rear surface of a mobile apparatus), a mono sound may be output, but the inventors of the present disclosure have recognized a problem where it is difficult to output a sound including a stereo sound. Therefore, a vibration apparatus may be further disposed at a periphery of a display panel so as to implement the sound including the stereo sound, but the inventors of the present disclosure have recognized a problem where it is difficult to place an exciter in a flexible apparatus where a curved portion is provided in a display panel, and when a speaker including a piezoelectric element, for example, a piezoelectric ceramic is provided, the piezoelectric ceramic is breakable.

Therefore, the inventors of the present disclosure have performed various experiments for implementing a vibration apparatus which may realize a sound characteristic of a sound including a stereo sound, may be applied to a flexible apparatus, and may vibrate in a vertical direction with respect to a widthwise direction of the display panel. Through the various experiments, the inventors of the present disclosure have invented an apparatus including a vibration apparatus having a new structure, which may realize the sound characteristic of the sound including the stereo sound and may be applied to a flexible apparatus. This will be described below in detail.

Figure 2:
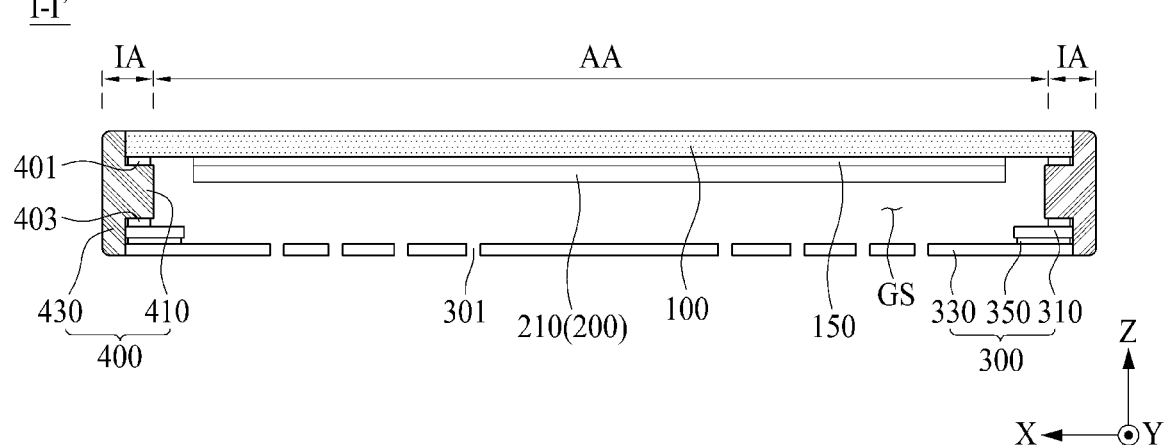
FIG. 2 is a cross-sectional view taken along line I-I' illustrated in FIG. 1.

FIG. 1 illustrates an apparatus according to an aspect of the present disclosure, and FIG. 2 is a cross-sectional view taken along line I-I' illustrated in FIG. 1.

With reference to FIGS. 1 and 2, an apparatus according to an aspect of the present disclosure may include a display panel 100 to display an image, and a vibration apparatus 200 disposed at a rear surface (or a backside surface) of the display panel 100.

The display panel 100 may display an electronic image or a digital image. For example, the display panel 100 may output light to display an image. The display panel 100 may be a curved display panel, or may be any type of display panel, such as a liquid crystal display panel, an organic light-emitting display panel, a quantum dot light-emitting display panel, a micro light-emitting diode display panel, and an electrophoresis display panel. The display panel 100 may be a flexible display panel. For example, the display panel 100 may a flexible light emitting display panel, a flexible electrophoretic display panel, a flexible electro-wetting display panel, a flexible micro light emitting diode display panel, or a flexible quantum dot light emitting display panel, but aspects of the present disclosure are not limited thereto.

The display panel 100 according to an aspect of the present disclosure may include a display area AA (or an active area) for displaying an image according to driving of the plurality of pixels. The display panel 100 may include a non-display area IA (or an inactive area) surrounding the display area AA, but aspect of the present disclosure is not limited thereto.

The display panel 100 according to an aspect of the present disclosure may be configured to display an image in a type such as a top emission type, a bottom emission type, a dual emission type, or the like according to a structure of the pixel array layer including an anode electrode, a cathode electrode, and a light emitting device. In the top emission type, an image may be displayed by outputting visible light generated from the pixel array layer to the forward region of a base substrate. In the bottom emission type, an image may be displayed by outputting visible light generated from the pixel array layer to the backward region of the base substrate.

The display panel 100 according to an aspect of the present disclosure may include a pixel array part disposed in a pixel area configured by a plurality of gate lines and/or a plurality of data lines. The pixel array part may include a plurality of pixels which display an image based on a signal supplied through the signal lines. The signal lines may include a gate line, a data line, a pixel driving power line, and/or the like, but aspects of the present disclosure are not limited thereto.

Each of the plurality of pixels may include a pixel circuit layer including a driving thin film transistor (TFT) provided at the pixel area, an anode electrode electrically connected to the driving TFT, a light emitting device formed over the anode electrode, and a cathode electrode electrically connected to the light emitting device.

The driving TFT may be configured at a transistor region of each pixel area provided at a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), or low temperature poly-Si or may include oxide such as indium-gallium-zinc-oxide (IGZO), but aspects of the present disclosure are not limited thereto.

The anode electrode may be provided at an opening region provided at each pixel area and may be electrically connected to the driving TFT.

A light emitting device according to an aspect may include a light emitting device layer formed over an anode electrode. The light emitting device layer may be implemented to emit light having the same color (for example, white light) for each pixel, or may be implemented to emit light having a different color (for example, red light, green light, or blue light) for each pixel. A cathode electrode (or a common electrode) may be connected to the light emitting device layer provided in each pixel area in common. For example, the light emitting device layer may have a stack structure including a single structure or two or more structures including the same color for each pixel. As another aspect of the present disclosure, the organic light emitting device layer may have a stack structure including two or more structures including one or more different colors for each pixel. The two or more structures including the one or more different colors may be configured with one or more of blue, red, yellow-green, and green or a combination thereof, but aspects of the present disclosure are not limited thereto. An example of the combination may include blue and red, red and yellow-green, red and green, red/yellow-green/green, or the like, but aspects of the present disclosure are not limited thereto. Also, regardless of a stack order thereof, the present disclosure may be applied. The stack structure including two or more structures having the same color or one or more different colors may further include a charge generating layer between the two or more structures. The charge generating layer may have a PN junction structure and may include an N-type charge generating layer and a P-type charge generating layer.

The light emitting device according to another aspect of the present disclosure may include a micro light emitting diode device electrically connected to each of an anode electrode and a cathode electrode. The micro light emitting diode device may be a light emitting diode implemented as an integrated circuit (IC) or chip type. The micro light emitting diode device may include a first terminal electrically connected to the anode electrode and a second terminal electrically connected to the cathode electrode. The cathode electrode may be connected to the second terminal of the micro light emitting diode device provided in each pixel area in common.

An encapsulation part may be formed at the substrate to surround the pixel array part, thereby preventing oxygen or water from penetrating into the light emitting device of the pixel array part. The encapsulation part according to an aspect of the present disclosure may be formed in a multi-layer structure where an organic material layer and an inorganic material layer are alternately stacked, but aspect of the present disclosure is not limited thereto. The inorganic material layer may prevent oxygen or water from penetrating into the light emitting device of the pixel array part. The organic material layer may be formed to have a thickness which is relatively thicker than the inorganic material layer, so as to cover particles occurring in a manufacturing process. For example, the encapsulation part may include a first inorganic layer, an organic layer over the first inorganic layer, and a second inorganic layer over the organic layer. The organic layer may be a particle cover layer, but aspects of the present disclosure are not limited thereto. The touch panel may be disposed over the encapsulation part, or may be disposed at a rear surface of the pixel array part.

The display panel 100 according to an aspect of the present disclosure may include a first substrate, a second substrate, and a liquid crystal layer. The first substrate may be an upper substrate or a thin film transistor (TFT) array substrate. For example, the first substrate may include a pixel array (or a display part or a display area) including a plurality of pixels which are respectively provided in a plurality of pixel areas defined by intersections between a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part provided at a first periphery (or a first non-display part) and a gate driving circuit provided at a second periphery (or a second non-display part).

The pad part may supply a signal, supplied from the outside, to the pixel array and/or the gate driving circuit. For example, the pad part may include a plurality of data pads connected to a plurality of data lines through a plurality of data link lines and/or a plurality of gate input pads connected to the gate driving circuit through a gate control signal line. For example, a size of the first substrate may be greater than the second substrate, but aspects of the present disclosure are not limited thereto.

The gate driving circuit according to an aspect of the present disclosure may be embedded (or integrated) into a second periphery of the first substrate so as to be connected to the plurality of gate lines. For example, the gate driving circuit may be implemented with a shift register including a transistor, which is formed through the same process as the TFT provided at the pixel area. The gate driving circuit according to another aspect of the present disclosure may be implemented as an integrated circuit (IC) and may be provided at a panel driving circuit without being embedded into the first substrate.

The second substrate may be a lower substrate or a color filter array substrate. For example, the second substrate may include a pixel including an opening area overlapping with the pixel area formed in the first substrate, and a color filter layer formed at the opening area. The second substrate may have a size which is smaller than that of the first substrate, but aspects of the present disclosure are not limited thereto. For example, the second substrate may overlap with a remaining portion, other than the first periphery, of the upper substrate. The second substrate may be attached to a remaining portion, other than the first periphery, of the first substrate with a liquid crystal layer therebetween using a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

A second polarization member may be attached at a lower surface of the second substrate and may polarize light which is incident from the backlight and travels to the liquid crystal layer. A first polarization member may be attached at an upper surface of the first substrate and may polarize light which passes through the first substrate and is output to the outside.

The display panel 100 according to an aspect of the present disclosure may drive the liquid crystal layer based on an electric field which is generated in each pixel by the data voltage and the common voltage applied to each pixel, and thus, may display an image based on light passing through the liquid crystal layer.

In display panel 100 according to another aspect of the present disclosure, the first substrate may be implemented as the color filter array substrate, and the second substrate may be implemented as the TFT array substrate. For example, the display panel 100 according to another aspect of the present disclosure may have a type where an upper portion and a lower portion of the display panel 100 according to an aspect of the present disclosure are reversed therebetween. For example, a pad part of the display panel 100 according to another aspect of the present disclosure may be covered by a separate mechanism or structure.

The display panel 100 according to another aspect of the present disclosure may include a bending portion that may be bent or curved to have a curved shape or a certain curvature radius.

The bending portion of the display panel 100 may be in at least one of one periphery and the other periphery of the display panel 100, which are parallel to each other. The one periphery and/or the other periphery, where the bending portion is implemented, of the display panel 100 may include only the non-display area IA, or may include a periphery of the display area AA and the non-display area IA. The display panel 100 including the bending portion implemented by bending of the non-display area IA may have a one-side bezel bending structure or a both-side bezel bending structure. Moreover, the display panel 100 including the bending portion implemented by bending of the periphery of the display area AA and the non-display area IA may have a one-side active bending structure or a both-side active bending structure.

The vibration apparatus 200 may be configured to vibrate the display panel 100. For example, the vibration apparatus 200 may be implemented at the rear surface of the display panel 100 to directly vibrate the display panel 100. For example, the vibration apparatus 200 may be configured to vibrate the display panel 100 at the rear surface of the display panel 100, thereby providing a sound and/or a haptic feedback based on the vibration of the display panel 100 to a user (or a viewer).

According to an aspect of the present disclosure, the vibration apparatus 200 may be configured to vibrate according to a voice signal synchronized with an image displayed by the display panel 100 to vibrate the display panel 100. As another aspect of the present disclosure, the vibration apparatus 200 may be configured to vibrate according to a haptic feedback signal (or a tactile feedback signal) synchronized with a user touch applied to a touch panel (or a touch sensor layer) which is disposed at the display panel 100 or embedded into the display panel 100 and may be configured to vibrate the display panel 100. Accordingly, the display panel 100 may be configured to vibrate based on a vibration of the vibration apparatus 200 to provide a user (or a viewer) with at least one or more of a sound and a haptic feedback.

The vibration apparatus 200 according to an aspect of the present disclosure may be implemented to have a size corresponding to the display area AA of the display panel 100. A size of the vibration apparatus 200 may be 0.9 to 1.1 times a size of the display area AA, but aspects of the present disclosure are not limited thereto. For example, a size of the vibration apparatus 200 may be the same as or smaller than the size of the display area AA. For example, a size of the vibration apparatus 200 may be the same as or approximately same as the display area AA of the display panel 100, and thus, the vibration apparatus 200 may cover a most region of the display panel 100 and a vibration generated by the vibration apparatus 200 may be configured to vibrate a whole portion of the display panel 100, and thus, localization of a sound may be high, and satisfaction of a user may be improved. Also, a contact area (or panel coverage) between the display panel 100 and the vibration apparatus 200 may increase, and thus, a vibration region of the display panel 100 may increase, thereby improving a sound of a middle-low-pitched sound band generated based on a vibration of the display panel 100. Also, a vibration apparatus 200 applied to a large-sized display apparatus may be configured to vibrate the whole display panel 100 having a large size (or a large area), and thus, localization of a sound based on a vibration of the display panel 100 may be further enhanced, thereby realizing an improved sound effect. Therefore, the vibration apparatus 200 according to an aspect of the present disclosure may be on the rear surface of the display panel 100 to sufficiently vibrate the display panel 100 in a vertical (or front-to-rear) direction, thereby outputting a desired sound to a forward region in front of the apparatus or the display apparatus. For example, the vibration apparatus 200 according to an aspect of the present disclosure may be disposed at the rear surface of the display panel 100 to sufficiently vibrate the display panel 100 in a vertical (or front-to-rear) direction with respect to a first direction (X) of the display panel 100, thereby outputting a desired sound to a forward region in front of the apparatus or the display apparatus.

The vibration apparatus 200 may include a vibration generator 210 disposed at or connected to a rear surface (or a backside surface) of the display panel 100. The vibration apparatus 200 according to an aspect of the present disclosure may be implemented as a film-type. Since the vibration apparatus 200 may be implemented as a film-type, it may have a thickness which is thinner than the display panel 100, and thus, an increase in the thickness of the display apparatus may be minimized due to the arrangement of the vibration apparatus 200. For example, the vibration apparatus 200 may be a vibration generating module, a vibration generating apparatus, a film actuator, a film-type piezoelectric composite actuator, a film speaker, a film-type piezoelectric speaker, a film-type piezoelectric composite speaker, or the like, which uses the display panel 100 or a vibration member as a vibration plate, but aspects of the present disclosure are not limited thereto. As another aspect of the present disclosure, the vibration apparatus 200 may not be disposed at the rear surface of the display panel 100 and may be applied to a non-display panel instead of the display panel. For example, the vibration apparatus 200 may be applied to wood, plastic, glass, cloth, paper, a vehicle interior material, a building indoor ceiling, an aircraft interior material, and the like, but aspects of the present disclosure are not limited thereto. In this case, the non-display panel may be applied as a vibration plate, and the vibration apparatus 200 may be configured to vibrate the non-display panel to output a sound.

For example, the apparatus according to an aspect of the present disclosure may include a vibration member (or a vibration object) and a vibration apparatus 200 disposed at the vibration member. For example, the vibration member may include a display panel including a pixel displaying an image, or may include a non-display panel. For example, the vibration member may include a display panel including a pixel displaying an image, or may include one or more of wood, plastic, glass, cloth, paper, a vehicle interior material, a vehicle glass window, a building indoor ceiling, a building glass window, a building interior material, an aircraft interior material, an aircraft glass window, but aspects of the present disclosure are not limited thereto. For example, the non-display panel may be a light emitting diode lighting panel (or apparatus), an organic light emitting lighting panel (or apparatus), an inorganic light emitting lighting panel (or apparatus), and the like, but aspects of the present disclosure are not limited thereto. For example, the vibration member may include a display panel including a pixel displaying an image, or may include one or more of a light emitting diode lighting panel (or apparatus), an organic light emitting lighting panel (or apparatus), and an inorganic light emitting lighting panel (or apparatus), but aspects of the present disclosure are not limited thereto.

According to another aspect of the present disclosure, the vibration member may include a plate, and the plate may include a metal material, or may include a single nonmetal material or a composite nonmetal material of any one of wood, plastic, glass, cloth, paper, and leather, but aspects of the present disclosure are not limited thereto. According to another aspect of the present disclosure, the vibration member may include one or more of wood, plastic, glass, cloth, paper, and leather, but aspects of the present disclosure are not limited thereto. For example, the paper may be cone paper for speaker. For example, the cone paper may be pulp or foamed plastic, but aspects of the present disclosure are not limited thereto.

The vibration apparatus 200 may be disposed at the rear surface of the display panel 100 to overlap with the display area of the display panel 100. For example, the vibration apparatus 200 may overlap with half or more of the display area of the display panel 100. As another aspect of the present disclosure, the vibration apparatus 200 may overlap with the whole display area of the display panel 100.

The vibration apparatus 200 according to an aspect of the present disclosure may be configured to vibrate by alternately and repeatedly contract and expand based on an inverse piezoelectric effect when an alternating current (AC) voltage is applied, thereby directly vibrating the display panel 100 through the vibration thereof. For example, the vibration generator 210 may be configured to vibrate according to a voice signal synchronized with an image displayed by the display panel 100 to vibrate the display panel 100. As another aspect of the present disclosure, the vibration apparatus 200 may be configured to vibrate according to a haptic feedback signal (or a tactile feedback signal) synchronized with a user touch applied to a touch panel (or a touch sensor layer) which is disposed over the display panel 100 or embedded into the display panel 100 and may be configured to vibrate the display panel 100. Accordingly, the display panel 100 may be configured to vibrate based on a vibration of the vibration generator 210 to provide a user (or a viewer) with at least one or more of a sound and a haptic feedback.

Therefore, the apparatus according to an aspect of the present disclosure may output a sound, generated by a vibration of the display panel 100 based on a vibration of the vibration apparatus 200, in a forward region in front of the display panel. Moreover, in the apparatus according to an aspect of the present disclosure, a most region of the display panel 100 may be vibrated by the vibration apparatus 200 having a film-type, thereby more enhancing a sense of sound localization and a sound pressure level characteristic of a sound based on the vibration of the display panel 100.

The apparatus according to an aspect of the present disclosure may further include a connection member (or a first connection member) 150 disposed between the display panel 100 and the vibration apparatus 200.

For example, the connection member 150 may be disposed between the rear surface of the display panel 100 and the vibration apparatus 200, and may connect or couple the vibration apparatus 200 to the rear surface of the display panel 100. For example, the vibration apparatus 200 may be connected or coupled to the rear surface of the display panel 100 by the connection member 150, and thus, may be supported by or disposed at the rear surface of the display panel 100. For example, the vibration generator 210 may be disposed at the rear surface of the display panel 100 by the connection member 150.

The connection member 150 according to an aspect of the present disclosure may include a material including an adhesive layer which is good in adhesive force or attaching force with respect to each of the rear surface of the display panel 100 and the vibration apparatus 200. For example, the connection member 150 may include a foam pad, a double-sided tape, an adhesive, or the like, but aspects of the present disclosure are not limited thereto. For example, the adhesive layer of the connection member 150 may include epoxy, acrylic, silicone, or urethane, but aspects of the present disclosure are not limited thereto. For example, the adhesive layer of the connection member 150 may include an acrylic-based material which is relatively better in adhesive force and hardness of acrylic and urethane. Accordingly, a vibration of the vibration apparatus 200 may be transferred to the display panel 100 well.

The adhesive layer of the connection member 150 may further include an additive, such as a tackifier or an adhesion enhancing agent, a wax component, an anti-oxidation agent, or the like. The additive may prevent or reduce the connection member 150 from being detached (stripped) from the display panel 100 by a vibration of the vibration apparatus 200. For example, the tackifier may be rosin derivative or the like, and the wax component may be paraffin wax or the like. For example, the anti-oxidation agent may be a phenol-based anti-oxidation agent, such as thioester, but aspects of the present disclosure are not limited thereto.

The connection member 150 according to another aspect of the present disclosure may further include a hollow portion between the display panel 100 and the vibration apparatus 200. The hollow portion of the connection member 150 may provide an air gap between the display panel 100 and the vibration apparatus 200. Due to the air gap, a sound wave (or a sound pressure) based on a vibration of the vibration apparatus 200 may not be dispersed by the connection member 150, and may concentrate on the display panel 100. Thus, the loss of a vibration caused by the connection member 150 may be minimized, thereby increasing or improving a sound characteristic and/or a sound pressure level characteristic of a sound generated based on a vibration of the display panel 100.

The apparatus according to an aspect of the present disclosure may further include a supporting member 300 disposed at a rear surface of the display panel 100.

The supporting member 300 may be disposed at the rear surface of the display panel 100. For example, the supporting member 300 may cover a rear surface of the display panel 100. For example, the supporting member 300 may cover a whole rear surface of the display panel 100 with a gap space GS therebetween. For example, the supporting member 300 may include at least one or more of a glass material, a metal material, and a plastic material. For example, the supporting member 300 may be a rear surface structure or a set structure. For example, the supporting member 300 may be referred to as the other term such as a cover bottom, a plate bottom, a back cover, a base frame, a metal frame, a metal chassis, a chassis base, m-chassis, or the like. For example, the supporting member 300 may be implemented as an arbitrary type frame or a plate-shaped structure disposed at a rear surface of the display panel 100.

A periphery or a sharp corner of the supporting member 300 may have an inclined shape or a curved shape through a chamfer process or a corner rounding process. For example, the supporting member 300 of the glass material may be sapphire glass. As another aspect of the present disclosure, the supporting member 300 of the metal material may include one or more of aluminum (Al), an Al alloy, a magnesium (Mg), a magnesium (Mg) alloy, and an iron (Fe)-nickel (Ni) alloy.

In a case where the vibration apparatus 200 is configured with a film type vibration apparatus, a sound characteristic of a low-pitched sound band may be reduced, and thus, the inventors have performed various experiments for improving the sound characteristic of the low-pitched sound band. Through the various experiments, the inventors have invented an apparatus having a new structure for enhancing the sound characteristic of the low-pitched sound band. This will be described below.

The inventors have recognized that an internal air pressure of an apparatus should be reduced for improving the sound characteristic of the low-pitched sound band. For example, a sound of a vibration apparatus may be improved for discharging an internal air pressure of an apparatus to the outside. The vibration apparatus 200 may be disposed between the display panel 100 and the supporting member 300, and thus, may need a structure for discharging an air pressure to the outside. In order to decrease an air pressure of an apparatus by discharging the air pressure to the outside, the supporting member 300 may include a plurality of holes 301. The plurality of holes 301 of the supporting member 300 may be disposed in a certain region of the supporting member 300 so as to reduce an air pressure of a gap space GS of the apparatus. For example, the plurality of holes 301 of the supporting member 300 may enlarge a band of the low-pitched sound band by reducing an air pressure of the gap space GS, thereby improving a sound characteristic of the low-pitched sound band. In a case where the plurality of holes 301 are not disposed in the supporting member 300, the air pressure of the gap space GS may be increased by a sound or a sound wave generated by a vibration of the vibration apparatus 200, whereby the sound characteristic of the low-pitched sound band may decrease. According to an aspect of the present disclosure, the holes 301 may be provided in the supporting member 300, and thus, even when a sound wave or a sound is generated by a vibration of the vibration apparatus 200, air may be discharged through the holes 301, whereby an air pressure of the gap space GS may be lowered. Accordingly, a band of the low-pitched sound band may be enlarged, thereby improving a sound of the low-pitched sound band.

For example, the holes 301 may be disposed at a position for decreasing the air pressure of the gap space GS when a sound wave is generated by a vibration of the vibration apparatus 200. For example, the shape, number, and size of holes 301 may be variously adjusted. As illustrated in FIG. 2, the holes 301 may be arranged at a certain interval (or distance) in a region, corresponding to the vibration apparatus 200, of the supporting member 300. For example, the holes 301 may be disposed along a portion of the vibration apparatus 200 (for example, a periphery of the vibration apparatus 200).

The supporting member 300 according to an aspect of the present disclosure may include a first supporting member 310 and a second supporting member 330.

The first supporting member 310 may be disposed between a rear surface of the display panel 100 and the second supporting member 330. For example, the first supporting member 310 may be disposed between a rear periphery portion of the display panel 100 and a front periphery portion of the supporting member 300. The first supporting member 310 may be configured to support one or more of a periphery portion of the display panel 100 and a periphery portion of the supporting member 300. As another aspect of present disclosure, the first supporting member 310 may cover the rear surface of the display panel 100. For example, the first supporting member 310 may cover the whole rear surface of the display panel 100. For example, the first supporting member 310 may be a member which covers a whole rear surface of the display panel 100. For example, the first supporting member 310 may include one or more materials of a glass material, a metal material, and a plastic material. For example, the first supporting member 310 may be an inner plate, but aspects of the present disclosure are not limited thereto. For example, the first supporting member 310 may be omitted.

The first supporting member 310 may be spaced apart from a rearmost surface of the display panel 100 or the vibration apparatus 200 with a gap space GS therebetween. For example, the gap space GS may be referred to as an air gap, a vibration space, a sound resonance box, or the like, but aspects of the present disclosure are not limited thereto.

The second supporting member 330 may be disposed at a rear surface of the first supporting member 310. The second supporting member 330 may be a member which covers the whole rear surface of the first supporting member 310. For example, the second supporting member 330 may include at least one or more of a glass material, a metal material, and a plastic material. For example, the second supporting member 330 may be an outer plate, a rear plate, a back plate, a back cover, a rear cover, but aspects of the present disclosure are not limited thereto. For example, the plurality of holes 301 may be disposed at the second supporting member 330.

The supporting member 300 according to an aspect of the present disclosure may further include a connection member (or a second connection member) 350.

The connection member 350 may be disposed between the first supporting member 310 and the second supporting member 330. For example, the first supporting member 310 and the second supporting member 330 may be coupled or connected to each other by the connection member 350. For example, the connection member 350 may be an adhesive resin, a double-sided tape, or a double-sided adhesive foam pad, but aspects of the present disclosure are not limited thereto. For example, the connection member 350 may have elasticity for absorbing an impact, but aspects of the present disclosure are not limited thereto. For example, the connection member 350 may be disposed at a whole region between the first supporting member 310 and the second supporting member 330. As another aspect of the present disclosure, the connection member 350 may be provided in a mesh structure including an air gap between the first supporting member 310 and the second supporting member 330.

The apparatus according to an aspect of the present disclosure may further include a middle frame 400. The middle frame 400 may be disposed between a rear periphery of the display panel 100 and a front periphery of the supporting member 300. The middle frame 400 may support at least one or more of the rear periphery of the display panel 100 and the front periphery of the supporting member 300. The middle frame 400 may surround one or more of side surfaces of each of the display panel 100 and the supporting member 300. The middle frame 400 may provide a gap space GS between the display panel 100 and the supporting member 300. The middle frame 400 may be referred to as a middle cabinet, a middle cover, a middle chassis, or the like, but aspects of the present disclosure are not limited thereto.

The middle frame 400 according to an aspect of the present disclosure may include a first supporting portion 410 and a second supporting portion 430. For example, the first supporting portion 410 may be a supporting part, but aspects of the present disclosure are not limited thereto. For example, the second supporting portion 430 may be a sidewall portion, but aspects of the present disclosure are not limited thereto.

The first supporting portion 410 may be disposed between the rear periphery of the display panel 100 and the front periphery of the supporting member 300, and thus, may provide a gap space GS between the display panel 100 and the supporting member 300. A front surface of the first supporting portion 410 may be coupled or connected to the rear periphery of the display panel 100 by a first connection member 401. A rear surface of the first supporting portion 410 may be coupled or connected to the front periphery of the supporting member 300 by a second connection member 403. For example, the first supporting portion 410 may have a single picture frame structure having a square shape or a frame structure having a plurality of divided bar shapes, but aspects of the present disclosure are not limited thereto.

The second supporting portion 430 may be disposed in parallel with a thickness direction Z of the apparatus. For example, the second supporting portion 430 may be vertically coupled to an outer surface of the first supporting portion 410 in parallel with a thickness direction Z of the apparatus. The second supporting portion 430 may surround one or more of an outer surface of the display panel 100 and an outer surface of the supporting member 300, thereby protecting the outer surface of each of the display panel 100 and the supporting member 300. The first supporting portion 410 may protrude from an inner surface of the second supporting portion 430 toward the gap space GS between the display panel 100 and the supporting member 300.

The apparatus according to an aspect of the present disclosure may include a panel connection member (or connection member) instead of the middle frame 400.

The panel connection member may be disposed between the rear periphery of the display panel 100 and the front periphery of the supporting member 300 and may provide the gap space GS between the display panel 100 and the supporting member 300. The panel connection member may be disposed between the rear periphery of the display panel 100 and the front periphery of the supporting member 300 to adhere the display panel 100 and the supporting member 300. For example, the panel connection member may be a double-sided tape, a single-sided tape, or a double-sided adhesive foam pad, but aspects of the present disclosure are not limited thereto. For example, the panel connection member may include epoxy, acrylic, silicone, or urethane, but aspects of the present disclosure are not limited thereto. For example, to minimize the vibration of the display panel 100 from being transmitted to the supporting member 300, an adhesive layer of the panel connection member may include a urethane-based material which relatively has a ductile characteristic compared to acrylic, among acrylic and urethane. Accordingly, a vibration of the display panel 100 transmitted to the supporting member 300 may be minimized.

In the apparatus according to an aspect of the present disclosure, when the apparatus includes a panel connection member instead of a middle frame 400, the supporting member 300 may include a bending sidewall which is bent from an end (or an end portion) of the second supporting member 330 and surrounds one or more of an outer surface (or an outer sidewall) of each of the first supporting member 310, the panel connection member, and the display panel 100. The bending sidewall according to an aspect of the present disclosure may have a single sidewall structure or a hemming structure. The hemming structure may be a structure where end portions of an arbitrary member are bent in a curve shape and overlap with each other or are apart from each other in parallel. For example, in order to enhance a sense of beauty in design, the bending sidewall may include a first bending sidewall, bent from one side of the second supporting member 330, and a second bending sidewall bent from the first bending sidewall to a region between the first bending sidewall and an outer surface of the display panel 100. The second bending sidewall may be spaced apart from an inner surface of the first bending sidewall to minimize contact with the inner surface of the first bending sidewall or external impact in a lateral direction from being transmitted to the outer surface of the display panel 100. Therefore, the second bending sidewall may prevent the outer surface of the display panel 100 from contacting an inner surface of the first bending sidewall or may prevent a lateral direction external impact from being transferred to the outer surface of the display panel 100.

According to another aspect of the present disclosure, the middle frame 400 may be omitted. The apparatus according to another aspect of the present disclosure may include the panel connection member or adhesive member instead of the middle frame 400. The apparatus according to another aspect of the present disclosure may include a partition instead of the middle frame 400.

Figure 3:
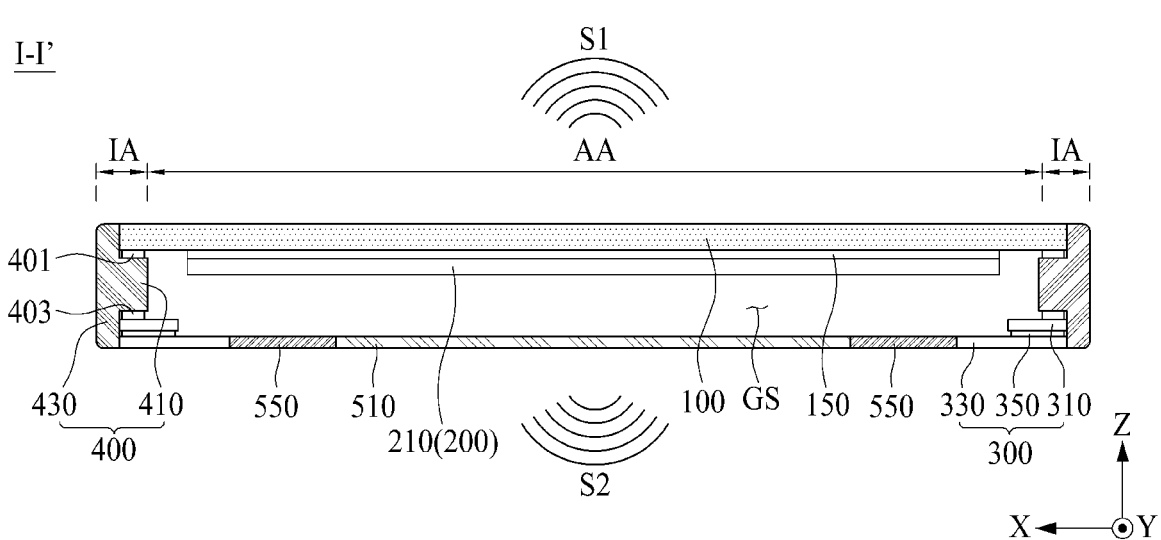
FIG. 3 is another cross-sectional view taken along line I-I' illustrated in FIG. 1.

FIG. 3 is another cross-sectional view taken along line I-I' illustrated in FIG. 1.

With reference to FIGS. 1 and 3, an apparatus according to an aspect of the present disclosure may include a display panel 100 and a vibration apparatus 200 disposed at a rear surface of the display panel 100.

As described above with reference to FIG. 2, an apparatus according to an aspect of the present disclosure includes a plurality of holes 301 provided at a supporting member 300, and thus, a band of a low-pitched sound band of the vibration apparatus 200 may be enlarged. However, due to the plurality of holes 301, there may be a problem where particles penetrate from the outside or there is a drawback in terms of a design of the apparatus. In a case where the plurality of holes 301 are covered for solving the problem, there may be a problem where a sound of the low-pitched sound band is considerably reduced. For example, in a case where a plurality of holes are provided and are covered by a cover or an adhesive, the inventor have recognized that a sound pressure level characteristic in a frequency of about 400 Hz is reduced by about 16 dB compared to a case where a plurality of holes are provided and are not covered by a cover member or an adhesive. Accordingly, the inventors have performed various experiments so that a sound of the low-pitched sound band is equal or similar to a case where a plurality of holes are provided. Based on the various experiments, the inventors have invented an apparatus having a new structure for enhancing a sound and/or a sound pressure level of the low-pitched sound band without a hole.

With reference to FIG. 3, the supporting member 300 may include a first region overlapping with a center of the vibration apparatus 200 and a second region overlapping with a periphery of the vibration apparatus 200. For example, a second supporting member 330 may include the first region overlapping with the center of the vibration apparatus 200, the second region overlapping with the periphery of the vibration apparatus 200, and a third region between the first region and the second region. For example, the first region may be a region which a vibration or a sound wave having first intensity from the vibration apparatus 200 reaches. One or more of the second region and the third region may be a region which a vibration or a sound wave having intensity which is less than the first intensity reaches.

The supporting member 300 may include a first member 510 and a second member 550. For example, the second supporting member 330 may include the first member 510 and the second member 550. For example, air in a gap space GS may be configured to vibrate based on a vibration of the vibration apparatus 200, and thus, the first member 510 may be disposed so that a vibration of the air is transferred to a rear surface of the apparatus or the display panel 100. For example, the first member 510 may be disposed at the first region which a vibration or a sound wave having the first intensity reaches. For example, the first member 510 may be disposed at the first region of the supporting member 300. For example, the first member 510 may be disposed at the first region of the second supporting member 330. Therefore, the first member 510 may be disposed in a region overlapping with the vibration apparatus 200. For example, the first member 510 may be disposed at the first region overlapping with the center of the vibration apparatus 200. The first member 510 may be radiation member or a sound radiation member, but aspects of present disclosure are not limited thereto.

The second member 550 may prevent the occurrence of an abnormal vibration when the first member 510 is vibrating. The second member 550 may be a suspension, an edge, or a resonance member, but aspects of present disclosure are not limited thereto. For example, the second member 550 may be disposed on the same surface as the first member 510. The second member 550 may be disposed on the same surface as the supporting member 300. For example, the second member 550 may be disposed on the same surface as the second supporting member 300. The second member 550 may be connected to the supporting member 300. For example, the second member 550 may be connected to the second supporting member 300. For example, the first member 510 may be connected to the second member 550. For example, the first member 510 may be disposed between adjacent second members 550. For example, the first member 510 may be connected to the second member 550 to each other. The second member 550 and the second supporting member 330 may be provided as one body. For example, one or more of the first member 510 and the second member 550 may overlap with the vibration apparatus 200. For example, the second member 550 may be disposed at the third region of the supporting member 300. For example, the second member 550 may be disposed at the third region of the second supporting member 330. The second member 550 may be configured with a material including elasticity. For example, the second member 550 may be configured with rubber, silicon, coated cloth, metal, a polymer film, plastic, paper, or epoxy resin, but aspects of present disclosure are not limited thereto. For example, the second member 550 may be configured to have a smaller thickness than the first member 510.

According to an aspect of the present disclosure, the first member 510 may be configured to vibrate based on a vibration of the vibration apparatus 200. Therefore, the first member 510 may output or generate a sound or a vibration toward a rear surface of the supporting member 300. Based on a vibration of the first member 510, a second sound or a second vibration S2 may be generated toward the rear surface of the apparatus or the display panel 100. For example, the first member 510 may be configured to vibrate along with a vibration of the vibration apparatus 200, and thus, the second sound or the second vibration S2 may be generated toward the rear surface of the apparatus or the display panel 100. The second sound or the second vibration S2 may be referred to as a rear low sound, a rear sound, or a rear vibration, but aspects of present disclosure are not limited thereto. By the second member 550, an abnormal vibration may be reduced when the first member 510 is vibrating, and the low-pitched sound band where sound quality is enhanced may be reproduced. Also, based on a vibration of the vibration apparatus 200, a first sound or a first vibration S1 may be generated toward a front surface of the display panel 100. The first sound or the first vibration S1 may be referred to as a front sound or a front vibration, but aspects of present disclosure are not limited thereto. Therefore, according to an aspect of the present disclosure, an apparatus having a sound and/or a sound pressure level characteristic of the low-pitched sound band to a high-pitched sound band may be provided. Also, because a supporting member including no hole is provided, a problem where particles and/or water penetrate(s) through a hole from the outside may be solved, thereby implementing a clean back design of an apparatus.

Figure 4:
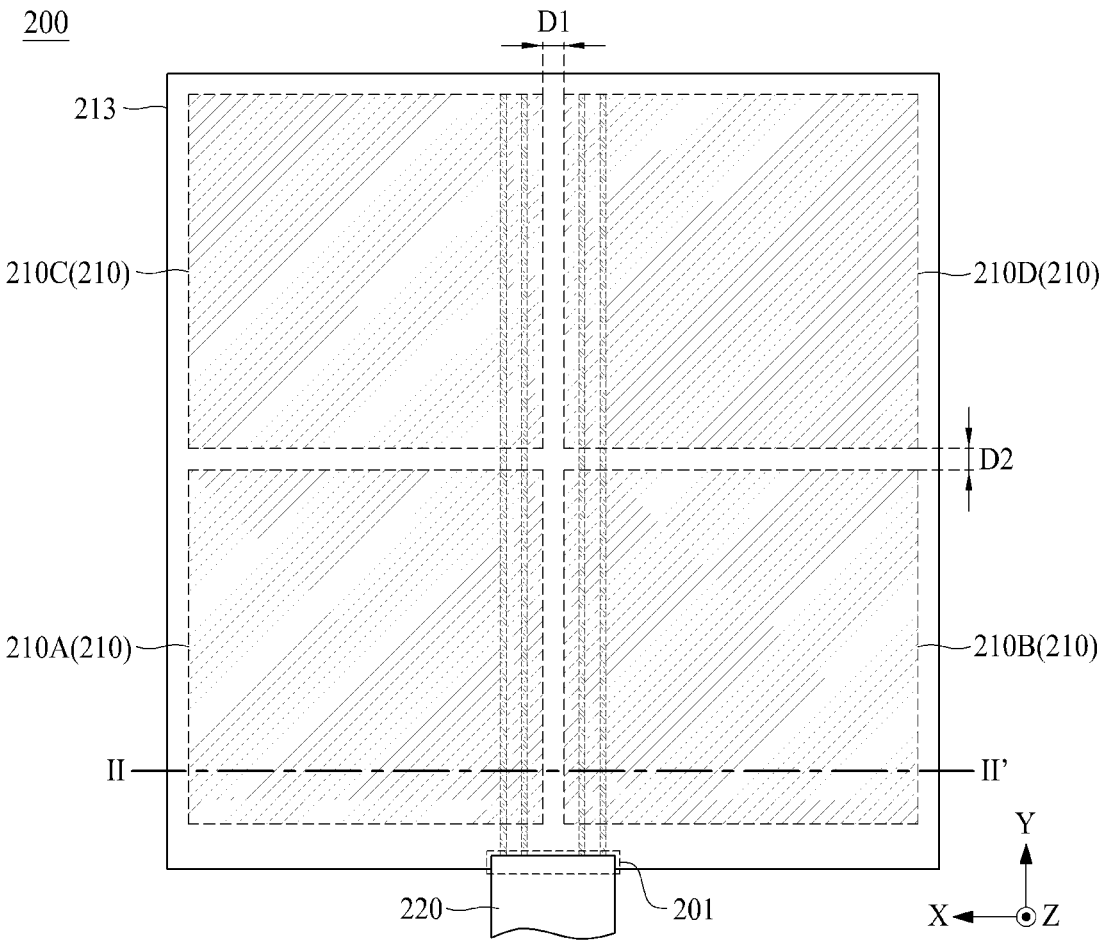
FIG. 4 illustrates a vibration apparatus according to an aspect of the present disclosure.
Figure 5:
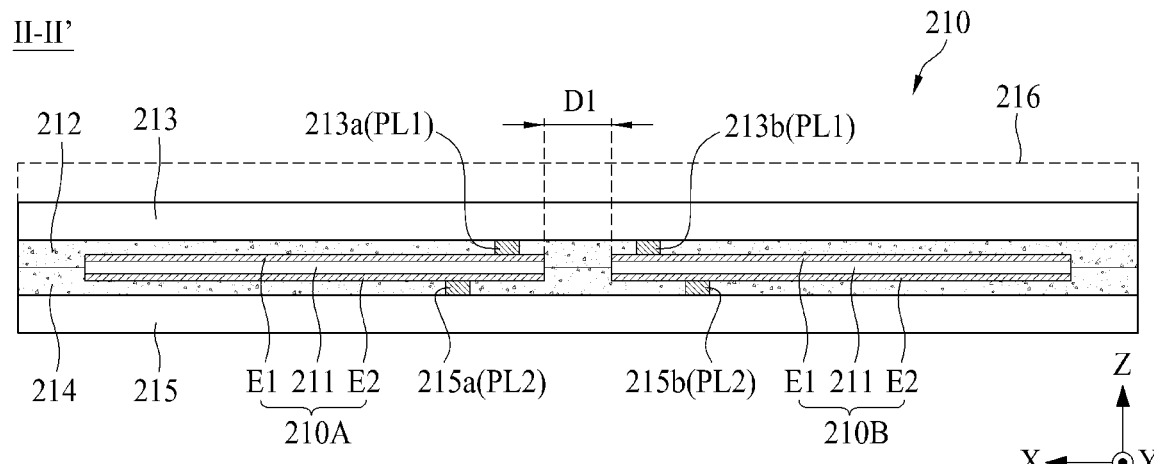
FIG. 5 is a cross-sectional view taken along line II-IF illustrated in FIG. 4.

FIG. 4 illustrates a vibration apparatus according to an aspect of the present disclosure. FIG. 5 is a cross-sectional view taken along line illustrated in FIG. 4.

With reference to FIGS. 2 to 5, the vibration apparatus 200 according to an aspect of the present disclosure may include a vibration generator 210. For example, the vibration generator 210 may include two or more vibration structures (or two or more vibration modules).

The vibration generator 210 according to an aspect of the present disclosure may include a plurality of vibration structures 210A to 210D which are electrically disconnected from one another and are disposed spaced apart from one another in a first direction X (or a widthwise direction) and a second direction Y (or a lengthwise direction) intersecting with the first direction X. Each of the plurality of vibration structures 210A to 210D may alternately and repeatedly contract and expand based on a piezoelectric effect (or a piezoelectric characteristic) to vibrate. The vibration generator 210 according to an aspect of the present disclosure may alternately and repeatedly contract and expand based on an inverse piezoelectric effect (or a piezoelectric characteristic) to vibrate in a thickness direction Z, thereby directly vibrating the display panel 100. The vibration generator 210 may include the plurality of vibration structures 210A to 210D which are disposed or tiled at a certain interval (or distance). The vibration generator 210 may be referred to as a vibration array, a vibration array portion, a vibration module array portion, a vibration array structure, a tiling vibration array, a tiling vibration array module, or a tiling vibration film, but aspects of the present disclosure are not limited thereto.

Each of the plurality of vibration structures 210A to 210D according to an aspect of the present disclosure may have a tetragonal shape or a square shape, but aspects of the present disclosure are not limited thereto. For example, each of the plurality of vibration structures 210A to 210D may have a tetragonal shape having a width of about 5 cm or more. For example, each of the plurality of vibration structures 210A to 210D may have a square shape having a size of 5 cm×5 cm or more.

The plurality of vibration structures 210A to 210D may be disposed or tiled in i×j form on the same plane, and thus, the vibration generator 210 may have an enlarged area based on tiling of the plurality of vibration structures 210A to 210D having a relatively small size. For example, i may be the number of vibration structures arranged in the first direction X or may be a natural number of 2 or more, and j may be the number of vibration structures arranged in the second direction Y or may be a natural number of 1 or more which is the same as or different from i.

The plurality of vibration structures 210A to 210D may be disposed or tiled at a certain interval (or distance), and thus, may be implemented as one vibration apparatus (or a single vibration apparatus) which is driven as one complete single body without being independently driven. According to an aspect of the present disclosure, with respect to the first direction X, a first separation distance D1 between the plurality of vibration structures 210A to 210D may be 0.1 mm or more and smaller than 3 cm, but aspects of the present disclosure are not limited thereto. Also, with respect to the second direction Y, a second separation distance D2 between the plurality of vibration structures 210A to 210D may be 0.1 mm or more and smaller than 3 cm, but aspects of the present disclosure are not limited thereto. For example, the first separation distance D1 may be the same as the second separation distance D2. For example, the first separation distance D1 may be the same as the second separation distance D2 within a process error range.

According to an aspect of the present disclosure, the plurality of vibration structures 210A to 210D may be disposed or tiled to have the separation distances (or intervals) D1 and D2 of 0.1 mm or more and smaller than 3 cm, and thus, may be driven as one vibration apparatus. Thereby, a reproduction band and a sound pressure level characteristic of a sound which is generated based on a single vibration of the plurality of vibration structures 210A to 210D may be increased or improved. For example, the plurality of vibration structures 210A to 210D may be arranged at an interval of 0.1 mm or more and smaller than 5 mm, in order to increase a reproduction band of a sound generated based on a single vibration of the plurality of vibration structures 210A to 210D and to increase a sound of a low-pitched sound band (for example, a sound pressure level characteristic in 500 Hz or less).

According to an aspect of the present disclosure, in a case where the plurality of vibration structures 210A to 210D are arranged at the intervals D1 and D2 of smaller than 0.1 mm or without the intervals D1 and D2, the reliability of the vibration structures 210A to 210D or the vibration generator 210 may be reduced due to damage or a crack caused by a physical contact therebetween which occurs when each of the vibration structures 210A to 210D vibrates.

According to an aspect of the present disclosure, in a case where the plurality of vibration structures 210A to 210D are arranged at the intervals D1 and D2 of 3 cm or more, the plurality of vibration structures 210A to 210D may not be driven as one vibration apparatus due to an independent vibration of each of the plurality of vibration structures 210A to 210D. Therefore, a reproduction band and a sound pressure level characteristic of a sound which is generated based on vibrations of the plurality of vibration structures 210A to 210D may be reduced. For example, in a case where the plurality of vibration structures 210A to 210D are arranged at the intervals D1 and D2 of 3 cm or more, a sound characteristic and a sound pressure level characteristic of the low-pitched sound band (for example, in 500 Hz or less) may each be reduced.

According to an aspect of the present disclosure, in a case where the plurality of vibration structures 210A to 210D are arranged at an interval of 5 mm, each of the plurality of vibration structures 210A to 210D may not be perfectly driven as one vibration apparatus, and thus, a sound characteristic and a sound pressure level characteristic of the low-pitched sound band (for example, in 200 Hz or less) may each be reduced.

According to another aspect of the present disclosure, in a case where the plurality of vibration structures 210A to 210D are arranged at an interval of 1 mm, each of the plurality of vibration structures 210A to 210D may be driven as one vibration apparatus, and thus, a reproduction band of a sound may increase and a sound of the low-pitched sound band (for example, a sound pressure level characteristic in 500 Hz or less) may increase. For example, in a case where the plurality of vibration structures 210A to 210D are arranged at an interval of 1 mm, the vibration generator 210 may be implemented as a large-area vibrator which is enlarged based on optimization of a separation distance between the plurality of vibration structures 210A to 210D. Therefore, the vibration generator 210 may be driven as a large-area vibrator based on a single vibration of the plurality of vibration structures 210A to 210D, and thus, a sound characteristic and a sound pressure level characteristic may each increase in the low-pitched sound band and a reproduction band of a sound generated based on a large-area vibration of the vibration generator 210.

Therefore, in order to implement a single vibration (or one vibration apparatus) of the plurality of vibration structures 210A to 210D, a separation distance between the plurality of vibration structures 210A to 210D may be adjusted to 0.1 mm or more and smaller than 3 cm. Also, in order to implement a single vibration (or one vibration apparatus) of the plurality of vibration structures 210A to 210D and to increase a sound pressure level characteristic of a sound of the low-pitched sound band, the separation distance between the plurality of vibration structures 210A to 210D may be adjusted to 0.1 mm or more and smaller than 5 mm.

The vibration generator 210 according to an aspect of the present disclosure may include first to fourth vibration structures 210A to 210D. The first to fourth vibration structures 210A to 210D may be electrically disconnected from one another and are disposed spaced apart from one another along each of the first direction X and the second direction Y. For example, the first to fourth vibration structures 210A to 210D may be arranged or tiled in 2×2 form.

According to an aspect of the present disclosure, the first and second vibration structures 210A and 210B may be spaced apart from each other along the first direction X. The third and fourth vibration structures 210C and 210D may be spaced apart from each other along the first direction X and may be spaced apart from each of the first and second vibration structures 210A and 210B along the second direction Y. The first and third vibration structures 210A and 210C may be spaced apart from each other along the second direction Y to face each other. The second and fourth vibration structures 210B and 210D may be spaced apart from each other along the second direction Y to face each other.

According to an aspect of the present disclosure, the first to fourth vibration structures 210A to 210D may be arranged (or tiled) at the intervals D1 and D2 of 0.1 mm or more and smaller than 3 cm or may be arranged (or tiled) at the interval of 0.1 mm or more and smaller than 5 mm in each of the first direction X and the second direction Y, so that the first to fourth vibration structures 210A to 210D are driven as one vibration apparatus or are driven for a single vibration or a vibration of a large-area vibrator of the vibration apparatus 200.

Each of the first to fourth vibration structures 210A to 210D according to an aspect of the present disclosure may include a vibration portion 211, a first electrode layer E1, and a second electrode layer E2.

The vibration portion 211 may include a piezoelectric material, a composite piezoelectric material, or an electro-active material, and the piezoelectric material, the composite piezoelectric material and the electroactive material may have a piezoelectric effect. The vibration portion 211 may be referred to as a vibration layer, a piezoelectric material layer, a piezoelectric composite layer, an electroactive layer, a piezoelectric material portion, a piezoelectric composite portion, an electroactive portion, a piezoelectric structure, a piezoelectric composite, or a piezoelectric ceramic composite, but aspects of the present disclosure are not limited thereto.

The vibration portion 211 according to an aspect of the present disclosure may include a ceramic-based material capable of realizing a relatively high vibration. For example, the vibration portion 211 may include a 1-3 composite structure or a 2-2 composite structure. For example, a piezoelectric deformation coefficient "d33" of the vibration portion 211 in a thickness direction Z may have 1,000 pC/N or more, but aspects of the present disclosure are not limited thereto.

The first electrode layer E1 may be disposed at a first surface (or an upper surface) of the vibration portion 211 and may be electrically connected to the first surface of the vibration portion 211. For example, the first electrode layer E1 may have a single-body electrode type (or a common electrode type) which is disposed at a whole first surface of the vibration portion 211. The first electrode layer E1 according to an aspect of the present disclosure may include a transparent conductive material, a semitransparent (or translucent) conductive material, or an opaque conductive material. For example, examples of the transparent conductive material or the semitransparent conductive material may include indium tin oxide (ITO) or indium zinc oxide (IZO), but aspects of the present disclosure are not limited thereto. The opaque conductive material may include aluminum (Al), copper (Cu), gold (Au), silver (Ag), molybdenum (Mo), magnesium (Mg), or the like, and an alloy of any thereof, but aspects of the present disclosure are not limited thereto.

The second electrode layer E2 may be at a second surface (or a rear surface) opposite to the first surface of the vibration portion 211, and may be electrically connected to the second surface of the vibration portion 211. For example, the second electrode layer E2 may have a single-body electrode type (or a common electrode type) which is disposed at a whole second surface of the vibration portion 211. The second electrode layer E2 according to an aspect of the present disclosure may include a transparent conductive material, a semitransparent conductive material, or an opaque conductive material. For example, the second electrode layer E2 may include the same material as the first electrode layer E1, but aspects of the present disclosure are not limited thereto. As another aspect of the present disclosure, the second electrode layer E2 may include a material different from the first electrode layer E1.

The vibration portion 211 may be polarized (or poling) by a certain voltage applied to the first electrode layer E1 and the second electrode layer E2 in a certain temperature atmosphere, or in a temperature atmosphere that may be changed from a high temperature to a room temperature, but aspects of the present disclosure are not limited thereto.

The vibration generator 210 according to an aspect of present disclosure may further include a first protection member 213 and a second protection member 215.

The first protection member 213 may be disposed at the first surface of the vibration generator 210. For example, the first protection member 213 may cover the first electrode layer E1 disposed at a first surface of each of the plurality of vibration structures 210A to 210D. Thus, the first protection member 213 may be connected to the first surface of each of the plurality of vibration structures 210A to 210D in common or may support the first surface of each of the plurality of vibration structures 210A to 210D in common. Accordingly, the first protection member 213 may protect the first surface of each of the plurality of vibration structures 210A to 210D or the first electrode layer E1.

The first protection member 213 according to an aspect of the present disclosure may be disposed at the first surface of each of the plurality of vibration structures 210A to 210D by a first adhesive layer 212. For example, the first protection member 213 may be directly disposed at the first surface of each of the plurality of vibration structures 210A to 210D by a film laminating process using the first adhesive layer 212. Accordingly, the plurality of vibration structures 210A to 210D may be integrated (or disposed) or tiled with the first protection member 213 to have the certain intervals D1 and D2.

The second protection member 215 may be disposed at the second surface of the vibration generator 210. For example, the second protection member 215 may cover the second electrode layer E2 disposed at a second surface of each of the plurality of vibration structures 210A to 210D. Thus, the second protection member 215 may be connected to the second surface of each of the plurality of vibration structures 210A to 210D in common or may support the second surface of each of the plurality of vibration structures 210A to 210D in common. Accordingly, the second protection member 215 may protect the second surface of each of the plurality of vibration structures 210A to 210D or the second electrode layer E2.

The second protection member 215 according to an aspect of the present disclosure may be disposed at the second surface of each of the plurality of vibration structures 210A to 210D by a second adhesive layer 214. For example, the second protection member 215 may be directly disposed at the second surface of each of the plurality of vibration structures 210A to 210D by a film laminating process using the second adhesive layer 214. Accordingly, the plurality of vibration structures 210A to 210D may be integrated (or disposed) or tiled with the second protection member 215 to have the certain intervals D1 and D2.

Each of the first protection member 213 and the second protection member 215 according to an aspect of the present disclosure may include a plastic film. For example, each of the first protection member 213 and the second protection member 215 may be a polyimide (PI) film or a polyethylene terephthalate (PET) film, but aspects of the present disclosure are not limited thereto.

The first adhesive layer 212 may be disposed between the first surface of each of the plurality of vibration structures 210A to 210D and between the plurality of vibration structures 210A to 210D. For example, the first adhesive layer 212 may be formed at a rear surface (or an inner surface) of the first protection member 213 facing the first surface of the vibration generator 210, disposed at the first surface of each of the plurality of vibration structures 210A to 210D, and filled between the plurality of vibration structures 210A to 210D.

The second adhesive layer 214 may be disposed between the second surface of each of the plurality of vibration structures 210A to 210D and between the plurality of vibration structures 210A to 210D. For example, the second adhesive layer 214 may be formed at a front surface (or an inner surface) of the second protection member 215 facing the second surface of the vibration generator 210, disposed at the second surface of each of the plurality of vibration structures 210A to 210D, and filled between the plurality of vibration structures 210A to 210D.

The first adhesive layer 212 and the second adhesive layer 214 may be connected to each other between the plurality of vibration structures 210A to 210D. Therefore, each of the plurality of vibration structures 210A to 210D may be surrounded by the first and second adhesive layers 212 and 214. For example, the first adhesive layer 212 and the second adhesive layer 214 may entirely surround the whole plurality of vibration structures 210A to 210D. For example, the first adhesive layer 212 and the second adhesive layer 214 may be referred to as a cover member, but aspects of the present disclosure are not limited thereto. When each of the first adhesive layer 212 and the second adhesive layer 214 is a cover member, the first protection member 213 may be disposed at a first surface of the cover member, and the second protection member 215 may be disposed at a second surface of the cover member. For example, for convenience of description, the first adhesive layer 212 and the second adhesive layer 214 are illustrated as first adhesive layer 212 and the second adhesive layer 214, but aspects of the present disclosure are not limited thereto and may be provided as one adhesive layer.

Each of the first adhesive layer 212 and the second adhesive layer 214 according to an aspect of the present disclosure may include an electric insulating material which has adhesiveness and may include a material capable of compression and decompression. For example, each of the first adhesive layer 212 and the second adhesive layer 214 may include an epoxy resin, an acrylic resin, a silicone resin, or a urethane resin, but aspects of the present disclosure are not limited thereto.

The vibration apparatus 200 or the vibration generator 210 according to an aspect of the present disclosure may further include a first power supply line PL1, a second power supply line PL2, and a pad part 201.

The first power supply line PL1 may be disposed at the first protection member 213. For example, the first power supply line PL1 may be disposed at a rear surface of the first protection member 213 facing the first surface of the vibration generator 210. The first power supply line PL1 may be electrically connected to the first electrode layer E1 of each of the plurality of vibration structures 210A to 210D. For example, the first power supply line PL1 may be directly and electrically connected to the first electrode layer E1 of each of the plurality of vibration structures 210A to 210D. For example, the first power supply line PL1 may be electrically connected to the first electrode layer E1 of each of the plurality of vibration structures 210A to 210D by an anisotropic conductive film. As another aspect of the present disclosure, the first power supply line PL1 may be electrically connected to the first electrode layer E1 of each of the plurality of vibration structures 210A to 210D by a conductive material (or particle) included in the first adhesive layer 212.

The first power supply line PL1 according to an aspect of the present disclosure may include first and second upper power lines 213a and 213b disposed in a second direction Y. For example, the first upper power line 213a may be electrically connected to the first electrode layer E1 of each of the first vibration structure 210A the third vibration structure 210C (or a first group) parallel to the second direction Y of the plurality of vibration structures 210A to 210D. The second upper power line 213b may be electrically connected to the first electrode layer E1 of each of the second vibration structure 210B and the fourth vibration structure 210D (or a second group) parallel to the second direction Y of the plurality of vibration structures 210A to 210D.

The second power supply line PL2 may be disposed at the second protection member 215. For example, the second power supply line PL2 may be disposed at a front surface of the second protection member 215 facing the second surface of the vibration generator 210. The second power supply line PL2 may be electrically connected to the second electrode layer E2 of each of the plurality of vibration structures 210A to 210D. For example, the second power supply line PL2 may be directly and electrically connected to the second electrode layer E2 of each of the plurality of vibration structures 210A to 210D. For example, the second power supply line PL2 may be electrically connected to the second electrode layer E2 of each of the plurality of vibration structures 210A to 210D by an anisotropic conductive film. As another aspect of the present disclosure, the second power supply line PL2 may be electrically connected to the second electrode layer E2 of each of the plurality of vibration structures 210A to 210D by a conductive material (or particle) included in the second adhesive layer 214.

The second power supply line PL2 according to an aspect of the present disclosure may include first and second lower power lines 215a and 215b disposed in a second direction Y. For example, the first lower power line 215a may be electrically connected to the second electrode layer E2 of each of the first vibration structure 210A and the third vibration structure 210C (or a first group) parallel to the second direction Y of the plurality of vibration structures 210A to 210D. The second lower power line 215b may be electrically connected to the second electrode layer E2 of each of the second vibration structure 210B and the fourth vibration structure 210D (or a second group) parallel to the second direction Y of the plurality of vibration structures 210A to 210D.

The pad part 201 may be electrically connected to each of the first power supply line PL1 and the second power supply line PL2. The pad part 201 may be disposed at the vibration generator 210 so as to be electrically connected to one portion (or one end or one side) of each of the first power supply line PL1 and the second power supply line PL2. The pad part 201 according to an aspect of the present disclosure may include a first pad electrode and a second pad electrode. The first pad electrode may be electrically connected to one portion of the first power supply line PL1. The second pad electrode may be electrically connected to one portion of the second power supply line PL2.

The first pad electrode may be connected to one portion of each of the first and second upper power lines 213a and 213b of the first power supply line PL1 in common. For example, the one portion of each of the first and second upper power lines 213a and 213b may branch from the first pad electrode.

The second pad electrode may be connected to one portion of each of the first and second lower power lines 215a and 215b of the second power supply line PL2 in common. For example, the one portion of each of the first and second lower power lines 215a and 215b may branch from the second pad electrode.

The vibration apparatus 200 or the vibration generator 210 according to an aspect of the present disclosure may further include a flexible cable 220.

The flexible cable 220 may be electrically connected to the pad part 201 disposed at the vibration apparatus 200 or the vibration generator 210 and may supply the vibration apparatus 200 or the vibration generator 210 with vibration driving signals (or a sound signal) provided from a sound processing circuit. The flexible cable 220 according to an aspect of the present disclosure may include a first terminal and a second terminal. A first terminal may be electrically connected to the first pad electrode of the pad part 201. The second terminal may be electrically connected to the second pad electrode of the pad part 201. For example, the flexible cable 220 may be configured with a flexible printed circuit cable or a flexible flat cable, but aspects of the present disclosure are not limited thereto.

The sound processing circuit may be configured to generate an alternating current (AC) vibration driving signal including a first vibration driving signal and a second vibration driving signal based on a sound source. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode layer E1 of each of the plurality of vibration structures 210A to 210D through a first terminal of the flexible cable 220, the first pad electrode of the pad part 201, and the first power supply line PL1. The second vibration driving signal may be supplied to the second electrode layer E2 of each of the plurality of vibration structures 210A to 210D through a second terminal of the flexible cable 220, the second pad electrode of the pad part 201, and the second power supply line PL2.

The vibration generator 210 according to an aspect of the present disclosure may further include a plate 216.

The plate 216 may be disposed at the first protection member 213 or the second protection member 215. For example, the plate 216 may have the same shape as the first protection member 213 (or the second protection member 215). The plate 216 may have a size which is greater than or equal to the first protection member 213 (or the second protection member 215).

The plate 216 according to an aspect of the present disclosure may be disposed at a front surface (or a first surface) of the first protection member 213. The plate 216 may be disposed at the front surface of the first protection member 213 of the vibration generator 210 by a connection member 150 (see FIG. 2). The plate 216 according to an aspect of the present disclosure may be disposed between the display panel 100 and the vibration generator 210. For example, the plate 216 may be disposed at the rear surface of the display panel 100 by the connection member 150.

According to another aspect of the present disclosure, the plate 216 may be disposed at a rear surface (or a second surface) of the second protection member 215. The plate 216 may be disposed at the rear surface of the second protection member 215 of the vibration generator 210 by a connection member 150. According to another aspect of the present disclosure, the plate 216 may be disposed between the vibration generator 210 and the supporting member 300.

The plate 216 according to an aspect of the present disclosure may include a metal material, and for example, may include one or more materials of stainless steel, aluminum (Al), a magnesium (Mg), a magnesium (Mg) alloy, a magnesium-lithium (Mg—Li) alloy, and an aluminum (Al) alloy, but aspects of the present disclosure are not limited thereto. The plate 216 may be disposed at the first protection member 213 (or the second protection member 215) and may reinforce or increase a mass of the vibration generator 210 to decrease a resonance frequency of the vibration generator 210 based on an increase in mass, and thus, may increase or improve a sound characteristic and a sound pressure level characteristic of the low-pitched sound band generated based on a vibration of the vibration generator 210 and may enhance the flatness of a sound characteristic. For example, the flatness of a sound characteristic may be a magnitude of a deviation between a highest sound pressure level and a lowest sound pressure level.

Therefore, the vibration apparatus 200 according to an aspect of the present disclosure may include the vibration generator 210 including the plurality of vibration structures 210A to 210D which are arranged (or tiled) at a certain interval so as to be implemented as a single vibrator without being independently driven, and thus, may be driven as a large-area vibrator based on a single vibration of the plurality of vibration structures 210A to 210D. Accordingly, the vibration apparatus 200 may be configured to vibrate the whole area of the display panel 100, and thus, a sound characteristic and a sound pressure level characteristic in the low-pitched sound band and a reproduction band of a sound generated based on a large-area vibration of the display panel 100 may each be increased or enhanced.

Moreover, the vibration apparatus 200 according to an aspect of the present disclosure may further include the plate 216 disposed in the vibration generator 210, and thus, a resonance frequency of the vibration generator 210 may be decreased. Accordingly, the vibration apparatus 200 according to an aspect of the present disclosure may increase or improve a sound characteristic, a sound pressure level characteristic of the low-pitched sound band, and a flatness of a sound characteristic of a sound generated according to a vibration of the display panel 100 based on a vibration of the vibration generator 210.

FIGS. 6A to 6F illustrate a vibration portion according to an aspect of the present disclosure.

Figure 6A:
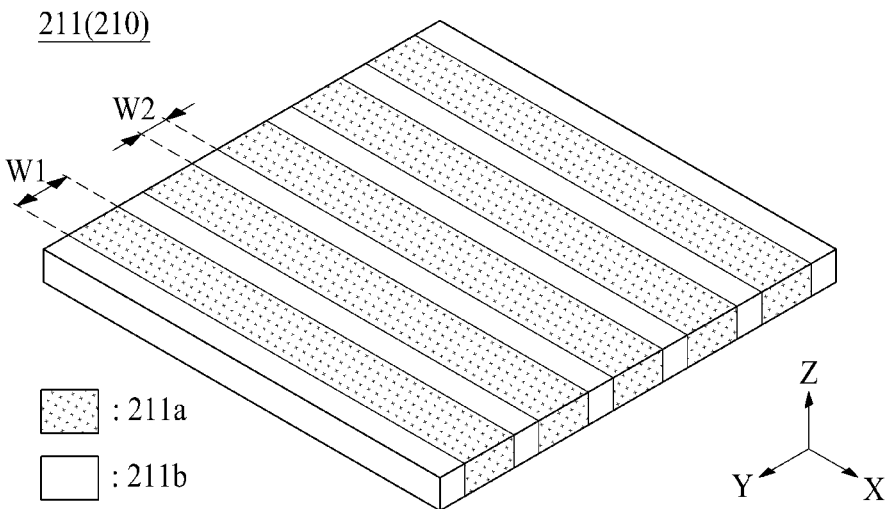
FIGS. 6A to 6F illustrate a vibration portion according to another aspect of the present disclosure.

With reference to FIGS. 4, 5, and 6A, each of the plurality of vibration structures 210A to 210D arranged (or tiled) in the vibration generator 210 according to an aspect of the present disclosure may include a vibration portion 211. For example, the vibration apparatus according to the aspect of the present disclosure may include two or more vibration structures. For example, each of the two or more vibration structures may include a first portion 211a and a second portion 211b. For example, the first portion 211a may include an inorganic material, and the second portion 211b may include an organic material. For example, the first part 211a may have a piezoelectric characteristic, and the second part 211b may have a ductile characteristic. For example, the inorganic material of the first portion 211a may have piezoelectric characteristic, and the organic material of the second portion 211b may have a ductile characteristic. The vibration portion 211 may include a plurality of first portions 211a and a plurality of second portions 211b. For example, the plurality of first portions 211a and the plurality of second portions 211b may be alternately and repeatedly arranged along a second direction Y. Each of the plurality of first portions 211a may be disposed between two adjacent second portions 211b of the plurality of second portions 211b. For example, each of the plurality of first portions 211a may have a first width W1 parallel to the second direction Y and a length parallel to a first direction X. Each of the plurality of second portions 211b may be disposed in parallel to the second direction Y. For example, each of the plurality of second portions 211b may have a second width W2 and a length parallel to the first direction X. Each of the plurality of second portions 211b may have the same size, for example, the same width, area, or volume. For example, each of the plurality of second portions 211b may have the same size (for example, the same width, area, or volume) within a process error range (or an allowable error) occurring in a manufacturing process. The first width W1 may be the same as or different from the second width W2. For example, the first width W1 may be greater than the second width W2. For example, the first portion 211a and the second portion 211b may include a line shape or a stripe shape which has the same size or different sizes. Therefore, the vibration portion 211 illustrated in FIG. 6A may include a 2-2 composite structure and thus may have a resonance frequency of 20 kHz or less, but aspects of the present disclosure are not limited thereto and a resonance frequency of the vibration portion 211 may vary based on at least one or more of a shape, a length, and a thickness of the vibration portion.

Figure 6B:
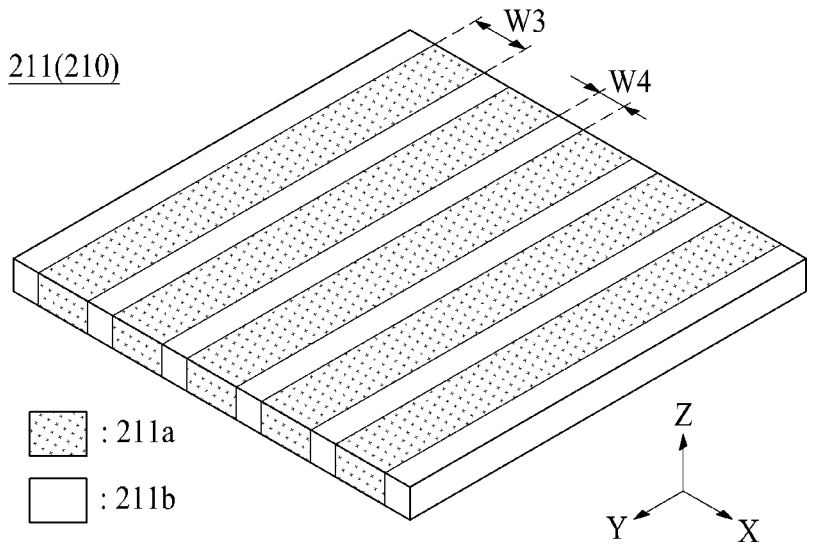

With reference to FIGS. 4, 5, and 6B, a vibration portion 211 of each of the plurality of vibration structures 210A to 210D arranged (or tiled) in the vibration generator 210 according to another aspect of the present disclosure may include a plurality of first portions 211a and a plurality of second portions 211b, which are alternately and repeatedly arranged in a first direction X. Each of the plurality of first portions 211a may be disposed between two adjacent second portions 211b of the plurality of second portions 211b. For example, each of the plurality of first portions 211a may have a third width W3 parallel to the first direction X and a length parallel to a second direction Y. Each of the plurality of second portions 211b may have a fourth width W4 parallel to the first direction X and may have a length parallel to the second direction Y. The third width W3 may be the same as or different from the fourth width W4. For example, the third width W3 may be greater than the fourth width W4. For example, the first portion 211a and the second portion 211b may include a line shape or a stripe shape which has the same size or different sizes. Therefore, the vibration portion 211 illustrated in FIG. 6B may include a 2-2 composite structure and thus may have a resonance frequency of 20 kHz or less, but aspects of the present disclosure are not limited thereto and a resonance frequency of the vibration portion 211 may vary based on at least one or more of a shape, a length, and a thickness of the vibration portion.

In the vibration portion 211 illustrated in each of FIGS. 6A and 6B, each of the plurality of first portions 211a and each of the plurality of second portions 211b may be disposed (or arranged) in parallel on the same plane (or the same layer). Each of the plurality of second portions 211b may be configured to fill a gap between two adjacent first portions 211a. Each of the plurality of second portions 211b may be connected to or attached at an adjacent first portion 211a. Accordingly, the vibration portion 211 may be enlarged to have a desired size or length based on side coupling (or side connection) between the first portion 211a and the second portion 211b.

In the vibration portion (or vibration layer) 211 illustrated in each of FIGS. 6A and 6B, a width (or a size) W2 and W4 of each of the plurality of second portions 211b may progressively decrease in a direction from a center portion to both peripheries (or both sides or both ends) of the vibration portion 211 or the vibration apparatus.

According to another aspect of the present disclosure, a second portion 211b, having a largest width (W2, W4) of the plurality of second portions 211b, may be located at a portion on which a highest stress may concentrate when the vibration portion 211 or the vibration apparatus is vibrating in a vertical (or upper and lower) direction Z (or a thickness direction). A second portion 211b, having a smallest width (W2, W4) of the plurality of second portions 211b, may be located at a portion where a relatively low stress may occur when the vibration portion 211 or the vibration apparatus is vibrating in the vertical direction Z. For example, the second portion 211b, having the largest width (W2, W4) of the plurality of second portions 211b, may be disposed at the center portion of the vibration portion 211, and the second portion 211b, having the smallest width (W2, W4) of the plurality of second portions 211b may be disposed at each of the both peripheries of the vibration portion 211. Therefore, when the vibration portion 211 or the vibration apparatus is vibrating in the vertical direction Z, interference of a sound wave or overlapping with of a resonance frequency, each occurring in the portion on which the highest stress concentrates, may be reduced or minimized. Thus, dip phenomenon of a sound pressure level occurring in the low-pitched sound band may be reduced, thereby improving flatness of a sound characteristic in the low-pitched sound band. For example, flatness of a sound characteristic may be a level of a deviation between a highest sound pressure and a lowest sound pressure.

In the vibration portion 211 illustrated in each of FIGS. 6A and 6B, each of the plurality of first portions 211a may have different sizes (or widths). For example, a size (or a width) of each of the plurality of first portions 211a may progressively decrease or increase in a direction from the center portion to the both peripheries (or both sides or both ends) of the vibration portion 211 or the vibration apparatus. For example, in the vibration portion 211, a sound pressure level characteristic of a sound may be enhanced and a sound reproduction band may increase, based on various natural vibration frequencies according to a vibration of each of the plurality of first portions 211a having different sizes.

Figure 6C:
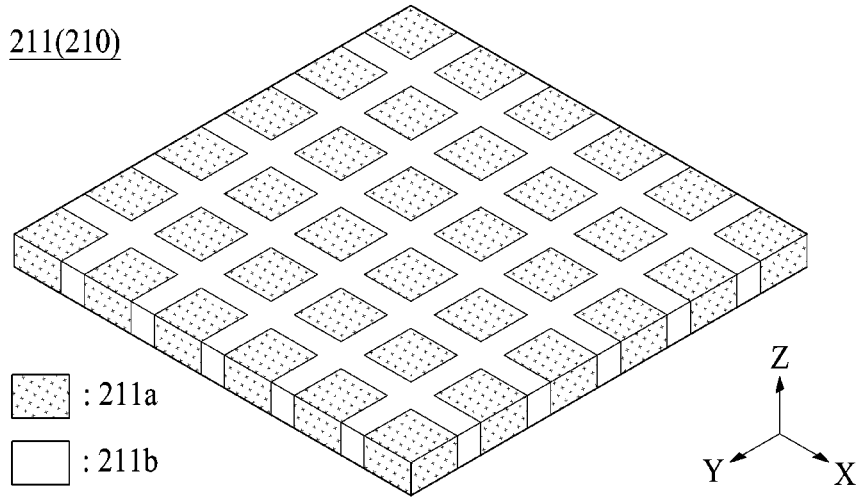

With reference to FIGS. 4, 5, and 6C, a vibration portion 211 of each of the plurality of vibration structures 210A to 210D arranged (or tiled) in the vibration generator 210 according to another aspect of the present disclosure may include a plurality of first portions 211a, which are spaced apart from one another in a first direction X and a second direction Y, and a second portion 211b disposed between the plurality of first portions 211a. The plurality of first portions 211a may be disposed to be spaced apart from one another in the first direction X and the second direction Y. For example, each of the plurality of first portions 211a may have a hexahedral shape (or a six-sided object shape) having the same size and may be disposed in a lattice shape. The second portion 211b may be disposed between the plurality of first portions 211a in each of the first direction X and the second direction Y. The second portion 211b may be configured to fill a gap or a space between two adjacent first portions 211a or to surround each of the plurality of first portions 211a. Thus, the second portion 211b may be connected to or attached to an adjacent first portion 211a. For example, a width of a second portion 211b disposed between two first portions 211a adjacent to each other in the first direction X may be the same as or different from the first portion 211a, and a width of a second portion 211b disposed between two first portions 211a adjacent to each other in the second direction Y may be the same as or different from the first portion 211a. Therefore, the vibration portion 211 illustrated in FIG. 6C may have a resonance frequency of 30 MHz or less according to a 1-3 composite structure, but aspects of the present disclosure are not limited thereto and a resonance frequency of the vibration portion 211 may vary based on at least one or more of a shape, a length, and a thickness of the vibration portion.

Figure 6D:
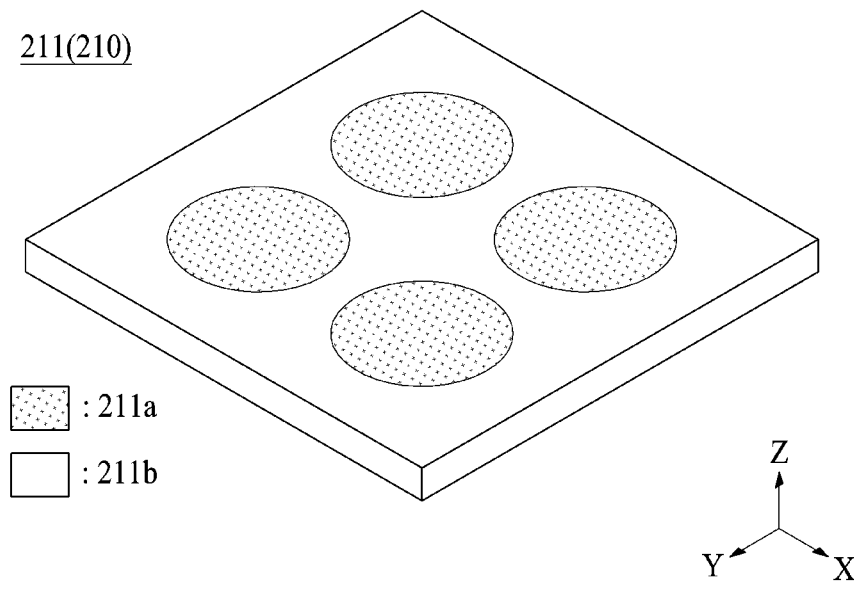

With reference to FIGS. 4, 5, and 6D, a vibration portion 211 of each of the plurality of vibration structures 210A to 210D arranged (or tiled) in the vibration generator 210 according to another aspect of the present disclosure may include a plurality of first portions 211a, which are spaced apart from one another in a first direction X and a second direction Y, and a second portion 211b which surrounds each of the plurality of first portions 211a. Each of the plurality of first portions 211a may have a flat structure of a circular shape. For example, each of the plurality of first portions 211a may have a circular shape, but aspects of the present disclosure are not limited thereto and may have a dot shape including an oval shape, a polygonal shape, or a donut shape. The second portion 211b may be configured to surround each of the plurality of first portions 211a. Thus, the second portion 211b may be connected to or attached on a side surface of each of the plurality of first portions 211a. The plurality of first portions 211a and the second portion 211b may be disposed (or arranged) in parallel on the same plane (or the same layer). Therefore, the vibration portion 211 illustrated in FIG. 6D may include a 1-3 composite structure and may be implemented as a circular vibration source (or vibrator), and thus, may be enhanced in vibration characteristic or sound output characteristic and may have a resonance frequency of 30 MHz or less, but aspects of the present disclosure are not limited thereto and a resonance frequency of the vibration portion 211 may vary based on at least one or more of a shape, a length, and a thickness of the vibration portion.

Figure 6E:
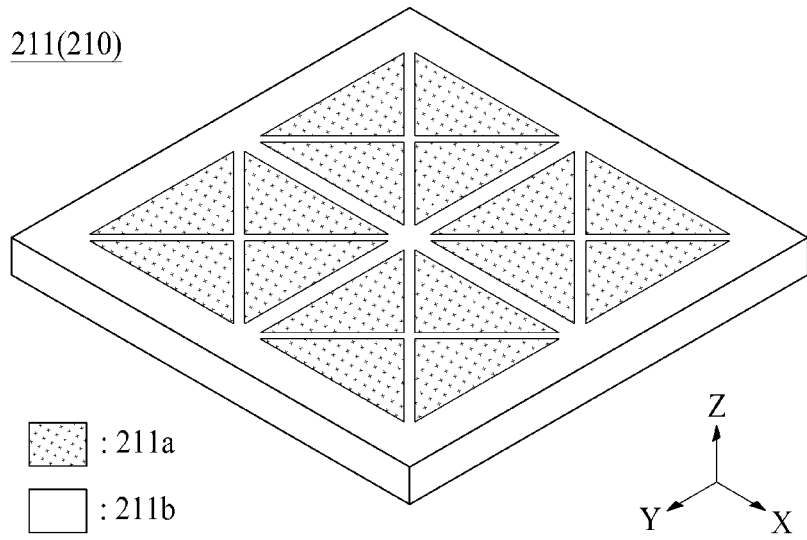

With reference to FIGS. 4, 5, and 6E, a vibration portion 211 of each of the plurality of vibration structures 210A to 210D arranged (or tiled) in the vibration generator 210 according to another aspect of the present disclosure may include a plurality of first portions 211a, which are spaced apart from one another in a first direction X and a second direction Y, and a second portion 211b which surrounds each of the plurality of first portions 211a. Each of the plurality of first portions 211a may have a flat structure of a triangular shape. For example, each of the plurality of first portions 211a may have a triangular plate shape.

As another aspect of the present disclosure, four adjacent first portions 211a of the plurality of first portions 211a may be adjacent to one another to form a tetragonal or quadrilateral shape (or a square shape). Vertices of the four adjacent first portions 211a forming a tetragonal shape may be adjacent to one another in a center portion (or a central portion) of the tetragonal shape. The second portion 211b may be configured to surround each of the plurality of first portions 211a. Thus, the second portion 211b may be connected to or attached to a side surface (or a lateral surface) of each of the plurality of first portions 211a. The plurality of first portions 211a and the second portion 211b may be disposed (or arranged) in parallel on the same plane (or the same layer). Therefore, the vibration portion 211 illustrated in FIG. 6E may have a resonance frequency of 30 MHz or less according to a 1-3 composite structure, but aspects of the present disclosure are not limited thereto and a resonance frequency of the vibration portion 211 may vary based on at least one or more of a shape, a length, and a thickness of the vibration portion.

Figure 6F:
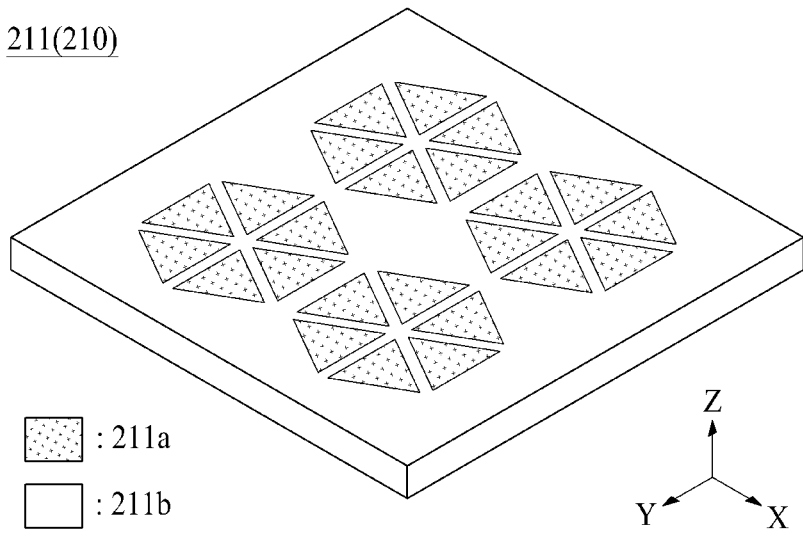

As another aspect of the present disclosure, as illustrated in FIG. 6F, six adjacent first portions 211a of the plurality of first portions 211a may be adjacent to one another to form a hexagonal shape (or a regularly hexagonal shape). Vertices of the six adjacent first portions 211a forming a hexagonal shape may be adjacent to one another in a center portion (or a central portion) of the hexagonal shape. The second portion 211b may be configured to surround each of the plurality of first portions 211a. Thus, the second portion 211b may be connected to or attached on a side surface (or a lateral surface) of each of the plurality of first portions 211a. The plurality of first portions 211a and the second portion 211b may be disposed (or arranged) in parallel on the same plane (or the same layer). Therefore, the vibration portion 211 illustrated in FIG. 6F may include a 1-3 composite structure and may be implemented as a circular vibration source (or vibrator), and thus, may be enhanced in vibration characteristic or sound output characteristic and may have a resonance frequency of 30 MHz or less, but aspects of the present disclosure are not limited thereto, and a resonance frequency of the vibration portion 211 may vary based on at least one or more of a shape, a length, and a thickness of the vibration portion.

With reference to FIGS. 6E and 6F, 2N (where N is a natural number greater than or equal to 2) adjacent first portions 200 of the plurality of first portions 211a having the triangular shape may be disposed adjacent to one another to form a 2N-angular shape.

In FIGS. 6A to 6F, the plurality of first portions 211a according to an aspect of the present disclosure may each be configured with an inorganic material portion. The inorganic material portion may include a piezoelectric material or an electroactive material. The piezoelectric material or the electroactive material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. As described above with reference to FIG. 5, a first surface of each of the plurality of first portions 211a may be electrically connected to the first electrode layer E1, and a second surface of each of the plurality of first portions 211a may be electrically connected to the second electrode layer E2.

In FIGS. 6A to 6F, the inorganic material portion included in each of the plurality of first portions 211a may include a ceramic-based material for generating a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "ABO3". In the chemical formula, "A" may include a divalent metal element, and "B" may include a tetravalent metal element. For example, in the chemical formula "ABO3", "A", and "B" may be cations, and "O" may be anions. For example, the first portions 211a may include one of lead(II) titanate (PbTiO3), lead zirconate (PbZrO3), lead zirconate titanate(PbZrTiO3), barium titanate (BaTiO3), and strontium titanate (SrTiO3), but aspects of the present disclosure are not limited thereto.

When the perovskite crystalline structure includes a center ion (for example, lead(II) titanate), a position of a titanium (Ti) ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure, and thus, a piezoelectric effect may be generated. In a tetragonal (or quadrilateral), orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

According to an aspect of the present disclosure, the inorganic material portion included in each of the plurality of first portions 211a may include one or more materials of lead (Pb), zirconium (Zr), titanium (Ti), zinc (Zn), nickel (Ni), and niobium (Nb), but aspects of the present disclosure are not limited thereto.

According to another aspect of the present disclosure, the inorganic material portion included in each of the plurality of first portions 211a may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but aspects of the present disclosure are not limited thereto. Also, the inorganic material portion may include at least one or more of calcium titanate (CaTiO3), BaTiO3, and SrTiO3, each without Pb, but aspects of the present disclosure are not limited thereto.

According to another aspect of the present disclosure, an inorganic material portion included in each of the plurality of first portions 211a may have a piezoelectric deformation coefficient "d33" of 1,000 pC/N or more in a thickness direction Z. The vibration apparatus may be applied to a display panel or a vibration member (or a vibration object) having a large size and may need to have a high piezoelectric deformation coefficient "d33", for having a sufficient vibration characteristic or piezoelectric characteristic. For example, in order to have the high piezoelectric deformation coefficient "d33", the inorganic material portion may include a PZT-based material (PbZrTiO3) as a main component and may include a softener dopant material doped into A site (Pb) and a relaxor ferroelectric material doped into B site (ZrTi).

The softener dopant material may enhance a piezoelectric characteristic and a dielectric characteristic of the inorganic material portion, and for example, may increase the piezoelectric deformation coefficient "d33" of the inorganic material portion. The softener dopant material according to an aspect of the present disclosure may include a dyad element "+2" to a triad element "+3". Morphotropic phase boundary (MPB) may be implemented by adding the softener dopant material to the PZT-based material (PbZrTiO3), and thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, ions (Sr2+, Ba2+, La2+, Nd3+, Ca2+, Y3+, Er3+, Yb3+) of the softener dopant material doped into the PZT-based material (PbZrTiO3) may substitute a portion of lead (Pb) in the PZT-based material (PbZrTiO3), and a substitution rate thereof may be about 2 mol % to about 20 mol %. For example, when the substitution rate is smaller than 2 mol % or greater than 20 mol %, a perovskite crystal structure may be broken, and thus, an electromechanical coupling coefficient "kP" and the piezoelectric deformation coefficient "d33" may decrease. When the softener dopant material is substituted, the MPB may be formed, and a piezoelectric characteristic and a dielectric characteristic may be high in the MPB, thereby implementing a vibration apparatus having a high piezoelectric characteristic and a high dielectric characteristic.

According to an aspect of the present disclosure, the relaxor ferroelectric material doped into the PZT-based material (PbZrTiO3) may enhance an electric deformation characteristic of the inorganic material portion. The relaxor ferroelectric material according to an aspect of the present disclosure may include a lead magnesium niobate (PMN)-based material or a lead nickel niobate (PNN)-based material, but aspects of the present disclosure are not limited thereto. The PMN-based material may include Pb, Mg, and Nb, and for example, may include Pb(Mg, Nb)O3. The PNN-based material may include Pb, Ni, and Nb, and for example, may include Pb(Ni, Nb)O3. For example, the relaxor ferroelectric material doped into the PZT-based material (PbZrTiO3) may substitute a portion of each of zirconium (Zr) and titanium (Ti) in the PZT-based material (PbZrTiO3), and a substitution rate thereof may be about 5 mol % to about 25 mol %. For example, when the substitution rate is smaller than 5 mol % or greater than 25 mol %, a perovskite crystal structure may be broken, and thus, the electromechanical coupling coefficient "kP" and the piezoelectric deformation coefficient "d33" may decrease.

According to an aspect of the present disclosure, the inorganic material portion provided in each of the plurality of first portions 211 may further include a donor material doped into B site (ZrTi) of the PZT-based material (PbZrTiO3), in order to more enhance a piezoelectric coefficient. For example, the donor material doped into the B site (ZrTi) may include a tetrad element "+4" or a hexad element "+6". For example, the donor material doped into the B site (ZrTi) may include tellurium (Te), germanium (Ge), uranium (U), bismuth (Bi), niobium (Nb), tantalum (Ta), antimony (Sb), or tungsten (W).

The inorganic material portion provided in each of the plurality of first portions 211 according to an aspect of the present disclosure may have a piezoelectric deformation coefficient "d33" of 1,000 pC/N or more in a thickness direction Z, thereby implementing a vibration apparatus having an enhanced vibration characteristic. For example, a vibration apparatus having an enhanced vibration characteristic may be implemented in a large-area apparatus or a large-area vibration member (or a large-area vibration object).

In FIGS. 6A to 6F, the second portion 211b may be disposed between the plurality of first portions 211a, or may be disposed to surround each of the plurality of first portions 211a. Therefore, in the vibration portion 211 of the vibration generator 210 or the vibration apparatus 200, vibration energy based on a link in a unit lattice of each first portion 211a may increase by a corresponding second portion 211b. Thus, a vibration may increase, and a piezoelectric characteristic and flexibility may be secured. For example, the second portion 211b may include one of an epoxy-based polymer, an acrylic-based polymer, and a silicone-based polymer, but aspects of the present disclosure are not limited thereto.

The second portion 211b according to an aspect of the present disclosure may be configured with an organic material portion. For example, the organic material portion may be disposed between the inorganic material portions and may absorb an impact applied to the inorganic material portion (or the first portion), may release a stress concentrating on the inorganic material portion to enhance the total durability of the vibration portion 211 of the vibration generator 210 or the vibration apparatus, and may provide flexibility to the vibration portion 211 of the vibration generator 210 or the vibration apparatus.

The second portion 211b according to an aspect of the present disclosure may have modulus (or Young's modulus) and viscoelasticity that are lower than those of each first portion 211a. Thus, the second portion 211b may enhance the reliability of each first portion 211a vulnerable to an impact due to a fragile characteristic. For example, the second portion 211b may include a material having a loss coefficient of about 0.01 to about 1.0 and modulus of about 0.1 [GPa] to about 10 [GPa].

The organic material portion included in the second portion 211b may include one or more of an organic material, an organic polymer, an organic piezoelectric material, and an organic non-piezoelectric material that has a flexible characteristic or a ductile characteristic in comparison with the inorganic material portion of the first portions 211a. For example, the second portion 211b may be referred to as an adhesive portion, a stretch portion, a bending portion, a damping portion, or a flexible portion, or the like, but aspects of the present disclosure are not limited thereto. Therefore, the plurality of first portions 211a and the second portion 211b may be disposed at (or connected to) the same plane, and thus, the vibration portion 211 of the vibration generator 210 according to various aspects of the present disclosure may have a single thin film-type. For example, the vibration portion 211 may be vibrated in a vertical (or upper and lower) direction (or a thickness direction) by the first portion 211a having a vibration characteristic and may be bent in a curved shape by the second portion 211b having flexibility or ductility. Also, in the vibration portion 211 of the vibration generator 210 according to various aspects of the present disclosure, a size of the first portion 211a and a size of the second portion 211b may be adjusted based on a piezoelectric characteristic and flexibility needed for the vibration portion 211. For example, in a case where the vibration portion 211 needs a piezoelectric characteristic rather than flexibility, a size of the first portion 211a may be adjusted to be greater than the second portion 211b. As another aspect of the present disclosure, in a case where the vibration portion 211 needs flexibility rather than a piezoelectric characteristic, a size of the second portion 211b may be adjusted to be greater than the first portion 211a. Accordingly, a size of the vibration portion 211 may be adjusted based on a characteristic needed therefor, and thus, the vibration portion 211 may be easy to design.

One or more of the vibration portions 211 illustrated in FIGS. 6A to 6F may be at least one or more the vibration portion 211 of the plurality of vibration structures 210A to 210D illustrated in FIG. 4. For example, each of the plurality of vibration structures 210A to 210D may be implemented with one or more of the vibration portion 211 described above with reference to FIGS. 6A to 6F, based on a desired characteristic of a sound generated based on a vibration of the vibration apparatus 200.

According to an aspect of the present disclosure, each of the plurality of vibration structures 210A to 210D may include one or more of the vibration portions 211 described above with reference to FIGS. 6A to 6F, or may include different vibration portion 211.

According to an aspect of the present disclosure, some and the other vibration structures of the plurality of vibration structures 210A to 210D may include different vibration portion 211 of the vibration portion 211 described above with reference to FIGS. 6A to 6F. For example, in the first to fourth vibration structures 210A to 210D illustrated in FIG. 4, each of the first and second vibration structures 210A and 210B may include one or more of the vibration portions 211 described above with reference to FIGS. 6A to 6F, and each of the third and fourth vibration structures 210C and 210D may include the vibration portion 211, which differs from the vibration portion 211 of the first and second vibration structures 210A and 210B, of the vibration portion 211 described above with reference to FIGS. 6A to 6F. For example, in the first to fourth vibration structures 210A to 210D illustrated in FIG. 4, the first and fourth vibration structures 210A and 210D disposed in a first diagonal direction may include one or more of the vibration portions 211 described above with reference to FIGS. 6A to 6F, and the second and third vibration structures 210B and 210C disposed in a second diagonal direction may include the vibration portion 211, which differs from the vibration portion 211 of the first and fourth vibration structures 210A and 210D disposed in the first diagonal direction, of the vibration portion 211 described above with reference to FIGS. 6A to 6F.

Figure 7:
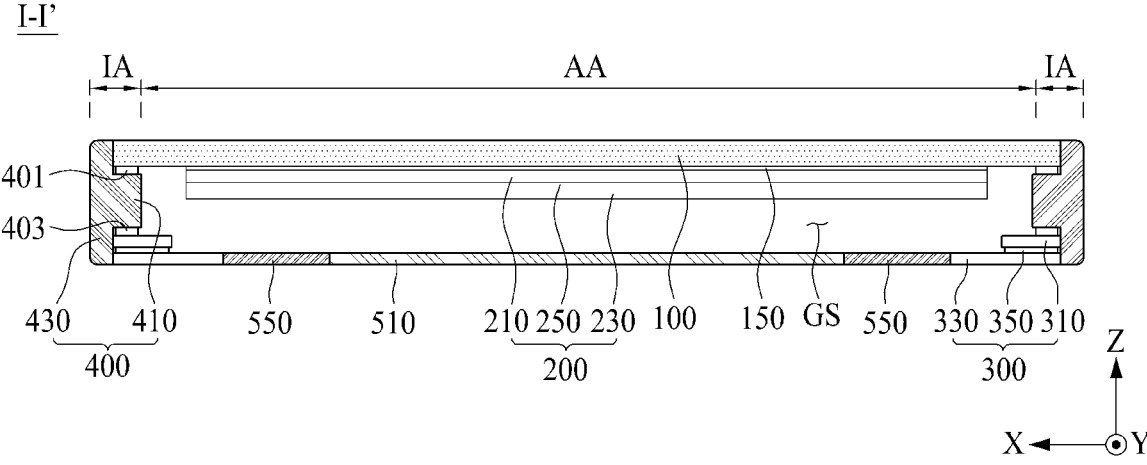
FIG. 7 illustrates an apparatus according to another aspect of the present disclosure.

FIG. 7 illustrates an apparatus according to another aspect of the present disclosure. FIG. 7 is another cross-sectional view taken along line I-I' illustrated in FIG. 1.

A vibration apparatus including one vibration generator may have a problem where it is unable to output a sufficient sound. For example, when a vibration apparatus including one vibration generator is applied to an apparatus such as a television (TV) or the like, there may be a problem where it is difficult to secure a sufficient sound. Therefore, when a vibration apparatus implemented with two vibration generators is applied to an apparatus, an attachment area between the display panel 100 or the vibration member (or the vibration object) and the vibration apparatus may be enlarged. As the attachment area is enlarged, when the vibrating device is attached to the rear surface of the display panel 100, it may be difficult to attach the vibration apparatus on the rear surface of the display panel 100 without an air bubble. For example, when the display panel 100 may be a light emitting display panel, there may be a problem where it is difficult to attach the vibration apparatus on an encapsulation substrate without an air bubble. Also, in a vibration apparatus implemented with two vibration generators arranged in parallel, because vibrations of adjacent vibration generators differ, there may be a problem of a division vibration where different vibrations occur. Due to this, there may be a problem where it is difficult to output a sound having enhanced flatness of a sound characteristic. There may be a problem where a division vibration increases as an attachment area of a vibration apparatus increases.

The vibration apparatus 200 according to an aspect of the present disclosure may include a plurality of vibration generators 210 and 230 which overlap with (or stack) with each other. The vibration apparatus 200 may include the plurality of vibration generators 210 and 230 which overlap with or are stacked to be displaced (or vibrated or driven) in the same direction. For example, the vibration apparatus 200 may include the plurality of vibration generators 210 and 230 which overlaps with or are stacked to have the same driving direction.

The plurality of vibration generators 210 and 230 may overlap with or be stacked to be displaced (or vibrated or driven) in the same direction. For example, the plurality of vibration generators 210 and 230 may contract or expand in the same driving direction (or displacement direction or vibration direction) based on a vibration driving signal in a state where the plurality of vibration generators 210 and 230 overlap with or are stacked, and thus, a displacement amount (or a bending force or a flexural force) or an amplitude displacement of the display panel 100 may increase or may be maximized. Therefore, the plurality of vibration generators 210 and 230 may increase (or maximize) a displacement amount (or a bending force or a flexural force) or an amplitude displacement of the display panel 100, thereby enhancing a sound pressure level characteristic of a sound and a sound characteristic of a middle-low-pitched sound band generated based on a vibration of the display panel 100. For example, the plurality of vibration generators 210 and 230 may be implemented so that the plurality of vibration generators 210 and 230 overlap with or are stacked to have the same driving direction, and thus, a driving force of each of the plurality of vibration generators 210 and 230 may increase or may be maximized, thereby enhancing a sound pressure level characteristic of a sound and a sound characteristic of a middle-low-pitched sound band generated by the display panel 100 based on vibrations of the plurality of vibration generators 210 and 230. For example, the middle-low-pitched sound band may be 200 Hz to 1 kHz, but aspects of the present disclosure are not limited thereto.

Each of the plurality of vibration generators 210 and 230 may include a vibration portion (or a piezoelectric structure, or a vibration portion, or a piezoelectric vibration portion) including piezoelectric ceramic having a piezoelectric characteristic, but aspects of the present disclosure are not limited thereto. For example, each of the plurality of vibration generators 210 and 230 may include piezoelectric ceramic having a perovskite crystalline structure, and thus, may be configured to vibrate (or mechanical displacement) in response to an electrical signal applied from the outside. For example, when a vibration driving signal (or a voice signal) is applied, each of the plurality of vibration generators 210 and 230 may alternately and repeatedly contract and expand based on an inverse piezoelectric effect of the vibration portion (or the piezoelectric structure, or the vibration module, or the piezoelectric vibration portion), and thus, may be displaced (or vibrated or driven) in the same direction based on a bending phenomenon where a bending direction is alternately changed, thereby increasing or maximizing a displacement amount (or a bending force or a flexural force) or an amplitude displacement of the vibration apparatus 200 or/and the display panel 100.

A first vibration generator 210 disposed at the display panel 100 of the plurality of vibration generators 210 and

230 may be one main vibration generator. For example, the remaining second vibration generator 230 of the plurality of vibration generators 210 and 230 may be at least one auxiliary vibration generator which is stacked on the first vibration generator 210. The second vibration generator 230 may have the same structure as the first vibration generator 210, but aspects of the present disclosure are not limited thereto.

The vibration apparatus 200 according to an aspect of the present disclosure may further include a connection member 250 (or a third connection member) disposed between the plurality of vibration generators 210 and 230.

The connection member 250 according to an aspect of the present disclosure may be disposed between the plurality of vibration generators 210 and 230. For example, the connection member 250 may include a material including an adhesive layer which is good in adhesive force or attaching force with respect to each of the plurality of vibration generators 210 and 230. For example, the connection member 250 may include a foam pad, a double-sided tape, or an adhesive, but aspects of the present disclosure are not limited thereto. For example, the adhesive layer of the connection member 250 may include epoxy, acrylic, silicone, or urethane, but aspects of the present disclosure are not limited thereto. For example, the adhesive layer of the connection member 250 may include a urethane-based material which relatively has a ductile characteristic compared to acrylic, among acrylic and urethane. Accordingly, the vibration loss of the vibration apparatus 200 caused by displacement interference between the plurality of vibration generators 210 and 230 may be minimized, or each of the plurality of vibration generators 210 and 230 may be freely displaced (or vibrated or driven).

The plurality of vibration generators 210 and 230 according to an aspect of the present disclosure may be integrated as one structure (or an element) by a laminating process using the connection member 250.

The apparatus according to an aspect of the present disclosure may further include a connection member 150 (or a first connection member) disposed between the display panel 100 and the vibration apparatus 200.

The connection member 150 may be disposed between the display panel 100 and the vibration apparatus 200, and thus, may connect or couple the vibration apparatus 200 to the rear surface of the display panel 100. For example, the vibration apparatus 200 may be connected or coupled to the rear surface of the display panel 100 by the connection member 150, and thus, may be supported by or disposed at the rear surface of the display panel 100.

The connection member 150 according to an aspect of the present disclosure may include a material including an adhesive layer which is good in adhesive force or attaching force with respect to each of the rear surface of the display panel 100 and the vibration apparatus 200. For example, the connection member 150 may include a foam pad, a double-sided tape, an adhesive, or the like, but aspects of the present disclosure are not limited thereto. For example, the adhesive layer of the connection member 150 may include epoxy, acrylic, silicone, or urethane, but aspects of the present disclosure are not limited thereto. For example, the adhesive layer of the connection member 150 may differ from the adhesive layer of the connection member 250. For example, the adhesive layer of the connection member 150 may include an acrylic-based material which is relatively better in adhesive force and hardness of acrylic and urethane so that the vibration of the vibration apparatus 200 may be transmitted to the display panel 100 well. Accordingly, a vibration of the vibration apparatus 200 may be transferred to the display panel 100 well.

The adhesive layer of the connection member 150 may further include an additive, such as a tackifier or an adhesion enhancing agent, a wax component, an anti-oxidation agent, or the like. The additive may prevent or reduce the connection member 150 from being detached (stripped) from the display panel 100 by a vibration of the vibration apparatus 200. For example, the tackifier may be rosin derivative or the like, and the wax component may be paraffin wax or the like. For example, the anti-oxidation agent may be a phenol-based anti-oxidation agent, such as thioester, but aspects of the present disclosure are not limited thereto.

The connection member 150 according to another example of the present disclosure may further include a hollow portion between the display panel 100 and the vibration apparatus 200. The hollow portion of the connection member 150 may provide an air gap between the display panel 100 and the vibration apparatus 200. Due to the air gap, a sound wave (or a sound pressure) based on a vibration of the vibration apparatus 200 may not be dispersed by the connection member 150, and may concentrate on the display panel 100. Thus, the loss of a vibration caused by the connection member 150 may be minimized, thereby increasing or improving a sound pressure level characteristic of a sound generated based on a vibration of the display panel 100.

The apparatus according to an aspect of the present disclosure may further include a supporting member 300 and a middle frame 400 disposed at a rear surface of the display panel 100. A description of a supporting member 300 and a middle frame 400 may be substantially the same as descriptions given above with reference to FIGS. 1 and 2, and thus, their repetitive descriptions may be omitted.

The apparatus according to an aspect of the present disclosure may further include a first member 510 and a second member 550. A description of the first member 510 and the second member 550 may be substantially the same as descriptions given above with reference to FIG. 3, and thus, their repetitive descriptions may be omitted.

Figure 8:
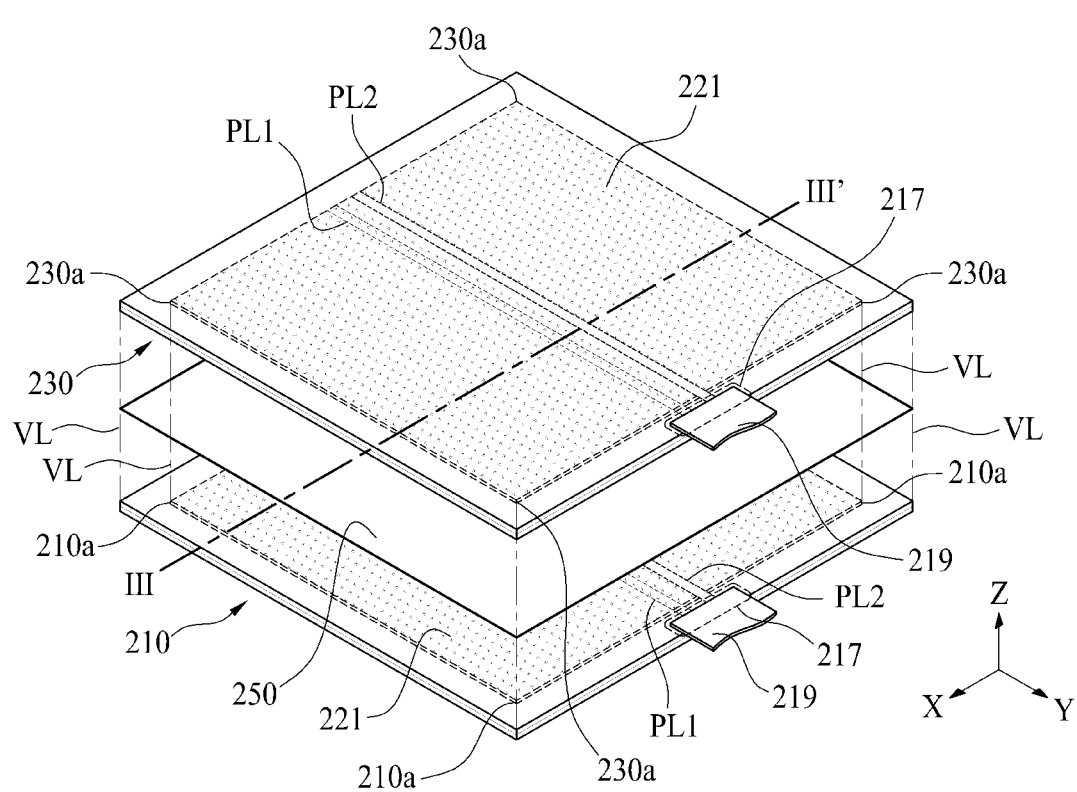
FIG. 8 illustrates an apparatus according to another aspect of the present disclosure.
Figure 9:
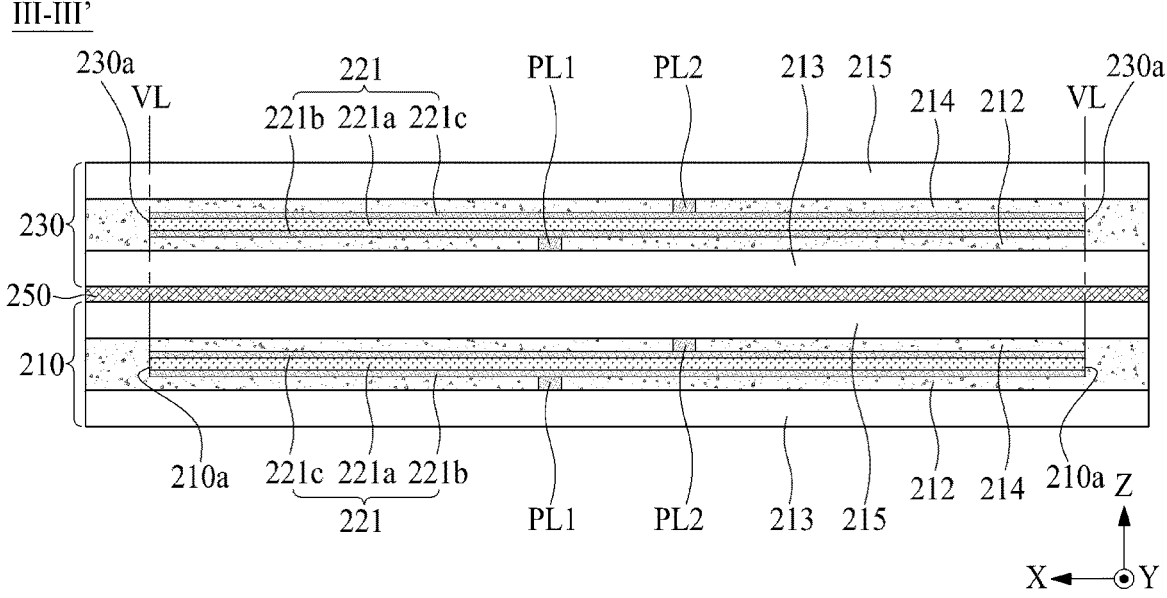
FIG. 9 is a cross-sectional view taken along line illustrated in FIG. 8.

FIG. 8 illustrates a vibration apparatus according to another aspect of the present disclosure. FIG. 9 is a cross-sectional view taken along line illustrated in FIG. 8.

With reference to FIGS. 8 and 9, the vibration apparatus 200 according to an aspect of the present disclosure may include a plurality of vibration generators 210 and 230 and a connection member 250. For example, the vibration apparatus 200 may include two or more vibration generators.

The plurality of vibration generators 210 and 230 may overlap with or be stacked to be displaced (or driven or vibrated) in the same direction in order to maximize an amplitude displacement of the vibration apparatus 200 and/or an amplitude displacement of the display panel 100. For example, the plurality of vibration generators 210 and 230 may have substantially the same size, but aspects of the present disclosure are not limited thereto. For example, the plurality of vibration generators 210 and 230 may have substantially the same size within an error range of a manufacturing process, but aspects of the present disclosure are not limited thereto. Therefore, the plurality of vibration generators 210 and 230 may maximize an amplitude displacement of the vibration apparatus 200 and/or an amplitude displacement of the display panel 100. One sides (or end portions, or outer surfaces, or each corner portion) 210a and 230a of the plurality of vibration generators 210 and 230 may be aligned on a virtual extension line VL extending in a thickness direction Z of the display panel 100, or may be disposed at the virtual extension line VL.

According to an aspect of the present disclosure, in at least one of the plurality of vibration generators 210 and 230, displacement directions and amplitude displacements of the plurality of vibration generators 210 and 230 may not match, and thus, an amplitude displacement of the vibration apparatus 200 may not be maximized. For example, when at least one of the plurality of vibration generators 210 and 230 has a different size departing from an error range of a manufacturing process, the displacement directions and the amplitude displacements of the plurality of vibration generators 210 and 230 may not match, and thus, the amplitude displacement of the vibration apparatus 200 may not be maximized. Also, when at least one of the plurality of vibration generators 210 and 230 is displaced in a different direction, the displacement directions of the plurality of vibration generators 210 and 230 may not match, and thus, the amplitude displacement of the vibration apparatus 200 may not be maximized.

The vibration apparatus 200 according to an aspect of the present disclosure may include two or more vibration generators 210 and 230 which are stacked to be displaced in the same direction. In the following description, an example where the vibration apparatus 200 includes the vibration generators 210 and 230 will be described.

According to an aspect of the present disclosure, a first vibration generator 210 may be connected to or disposed at a rear surface of the display panel 100 by a connection member 150 (or a first connection member). A second vibration generator 230 may be disposed or attached on the first vibration generator 210 by a connection member 250 (or a third connection member).

The first and second vibration generators 210 and 230 according to an aspect of the present disclosure may each include a vibration portion 221, a first protection member 213, and a second protection member 215.

The vibration portion 221 may include a piezoelectric material (or a piezoelectric element) having a piezoelectric characteristic (or a piezoelectric effect). For example, the piezoelectric material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto.

The vibration portion 221 according to an aspect of the present disclosure may include a vibration layer 221*a* including a piezoelectric material, a first electrode layer 221*b* disposed at a first surface of the vibration layer 221*a*, and a second electrode layer 221*c* disposed at a second surface, which is opposite to the first surface, of the vibration layer 221*a*.

The vibration layer 221*a* may include a piezoelectric material. The vibration layer 221*a* may be referred to as a piezoelectric layer, a piezoelectric material layer, an electroactive layer, a piezoelectric vibration portion, a piezoelectric material portion, an electroactive portion, an inorganic material layer, or an inorganic material portion, or the like, but aspects of the present disclosure are not limited thereto.

The vibration layer 221*a* may be formed of a transparent, semitransparent, or opaque piezoelectric material, and may be transparent, semitransparent, or opaque. The vibration layer 221*a* may be substantially the same as the vibration portion 211 described above with reference to FIGS. 6A to 6F, and thus, their repetitive descriptions may be omitted.

The vibration layer 221*a* according to an aspect of the present disclosure may be configured in a circular shape, an ellipse shape, or a polygonal shape, but aspects of the present disclosure are not limited thereto.

The first electrode layer 221*b* may be disposed at a first surface (or an upper surface) of the vibration layer 221*a*. The second electrode layer 221*c* may be disposed at a second surface (or a rear surface) opposite to or different from the first surface the vibration layer 221*a*. The first electrode layer 221*b* and the second electrode layer 221*c* may be substantially the same as the first electrode layer E1 and the second electrode layer E2 described above with reference to FIGS. 4 and 5, and thus, their repetitive descriptions may be omitted or will be briefly given.

According to an aspect of the present disclosure, the first electrode layer 221*b* may substantially have the same shape as the vibration layer 221*a*, but aspects of the present disclosure are not limited thereto. For example, the second electrode layer 221*c* may substantially have the same shape as the vibration layer 221*a*, but aspects of the present disclosure are not limited thereto.

In each of the first and second vibration generators 210 and 230, the first electrode layer 221*b* may be disposed closer to the display panel 100 than the second electrode layer 221*c*, but aspects of the present disclosure are not limited thereto. For example, in the vibration apparatus 200 including the plurality of vibration generators 210 and 230 according to an aspect of the present disclosure, the first electrode layer 221*b* of each of the plurality of vibration generators 210 and 230 may be disposed closer to the display panel 100 than the second electrode layer 221*c*.

The vibration layer 221*a* may be polarized (or poling) by a certain voltage applied to the first electrode layer 221*b* and the second electrode layer 221*c* in a certain temperature atmosphere or a temperature atmosphere which is changed from a high temperature to a room temperature, but aspects of the present disclosure are not limited thereto. For example, the vibration layer 221*a* may alternately and repeatedly contract and expand based on an inverse piezoelectric effect according to a vibration driving signal (or a sound signal or a voice signal) applied to the first electrode layer 221*b* and the second electrode layer 221*c* from the outside, and thus, may be displaced or vibrated or driven.

The vibration portion 221 (or the vibration layer 221*a*) of the first vibration generator 210 may have the same size as the vibration portion 221 (or the vibration layer 221*a*) of the second vibration generator 230. To maximize or increase a displacement amount or an amplitude displacement of the vibration apparatus 200, the vibration portion 221 (or the vibration layer 221*a*) of the first vibration generator 210 may substantially overlap with or stack the vibration portion 221 (or the vibration layer 221*a*) of the second vibration generator 230 without being staggered. For example, the vibration portion 221 (or the vibration layer 221*a*) of the first vibration generator 210 may substantially overlap with or stack the vibration portion 221 (or the vibration layer 221*a*) of the second vibration generator 230 within an error range of a manufacturing process without being staggered. For example, the vibration portion 221 (or the vibration layer 221*a*) of the first vibration generator 210 and the vibration portion 221 (or the vibration layer 221*a*) of the second vibration generator 230 may be implemented in a stack structure which has the same size and overlap (or stacks) without being staggered, and thus, the displacement amount or the amplitude displacement of the vibration apparatus 200 may be maximized or increased. For example, the vibration portion 221 (or the vibration layer 221a) of the first vibration generator 210 and the vibration portion 221 (or the vibration layer 221a) of the second vibration generator 230 may be implemented in a stack structure which has the same size and accurately overlap (or stacks) without being staggered, and thus, the displacement amount or the amplitude displacement of the vibration apparatus 200 may be maximized or increased.

According to an aspect of the present disclosure, a first portion (or an end portion, or an outer surface, or each corner portion) 210a of each vibration portion 221 (or vibration layer 221a) of the first vibration generator 210 may be aligned on a virtual extension line VL, or may be disposed at the virtual extension line VL. For example, the first portion (or an end portion, or an outer surface, or each corner portion) 210a of each vibration portion 221 (or vibration layer 221a) of the first vibration generator 210 may be accurately aligned on a virtual extension line VL, or may be accurately disposed at the virtual extension line VL. A second portion (or an end portion, or an outer surface, or each corner portion) 230a of each vibration portion 221 (or vibration layer 221a) of the second vibration generator 230 may be aligned on the virtual extension line VL, or may be disposed at the virtual extension line VL. For example, the second portion (or an end portion, or an outer surface, or each corner portion) 230a of each vibration portion 221 (or vibration layer 221a) of the second vibration generator 230 may be accurately aligned on the virtual extension line VL, or may be accurately disposed at the virtual extension line VL. The first portion 210a of each vibration portion 221 (or vibration layer 221a) of the first vibration generator 210 may be aligned with or overlap with the second portion 230a of each vibration portion 221 (or vibration layer 221a) of the second vibration generator 230. For example, the first portion 210a of the vibration portion 221 (or the vibration layer 221a) of the first vibration generator 210 may be accurately aligned with or accurately overlap with the second portion 230a of each vibration portion 221 (or vibration layer 221a) of the second vibration generator 230. For example, the first portion 210a of the vibration portion 221 (or the vibration layer 221a) of the first vibration generator 210 may correspond to the second portion 230a of each vibration portion 221 (or vibration layer 221a) of the second vibration generator 230. Therefore, in the vibration apparatus 200 according to an aspect of the present disclosure, the vibration portion 221 (or a first vibration portion) of the first vibration generator 210 and the vibration portion 221 (or a second vibration portion) of the second vibration generator 230 may be displaced (or vibrated or driven) in the same direction, and thus, the displacement amount or the amplitude displacement of the vibration apparatus 200 may be maximized or increased. Accordingly, a displacement amount (or a bending force or a flexural force) or an amplitude displacement of the display panel 100 may increase (or maximized). In the first vibration generator 210, the first protection member 213 may be disposed over the first electrode layer 221b. The first protection member 213 may protect the first electrode layer 221b. The second protection member 215 may be disposed over the second electrode layer 221c. The second protection member 215 may protect the second electrode layer 221c. For example, the first protection member 213 and the second protection member 215 of the first vibration generator 210 may be formed of a plastic material, a fiber material, or wood material, but aspects of the present disclosure are not limited thereto. For example, in the first vibration generator 210, the first protection member 213 may be formed of the same or different material as the second protection member 215. One or more of the first protection member 213 and the second protection member 215 of the first vibration generator 210 may be connected or coupled to a rear surface of the display panel 100 by a connection member (or a first connection member) 150. For example, the first protection member 213 of the first vibration generator 210 may be connected or coupled to the rear surface of the display panel 100 by the connection member (or the first connection member) 150.

In the second vibration generator 230, the first protection member 213 may be disposed over the first electrode layer 221b. The first protection member 213 may protect the first electrode layer 221b. The second protection member 215 may be disposed over the second electrode layer 221c. The second protection member 215 may protect the second electrode layer 221c. For example, the first protection member 213 and the second protection member 215 of the second vibration generator 230 may be formed of a plastic material, a fiber material, or wood material, but aspects of the present disclosure are not limited thereto. For example, in the second vibration generator 230, the first protection member 213 may be formed of the same or different material as the second protection member 215. One or more of the first protection member 213 and the second protection member 215 of the second vibration generator 230 may be connected or coupled to a rear surface of the first vibration generator 210 by a connection member (or a third connection member) 250. For example, the first protection member 213 of the second vibration generator 230 may be connected or coupled to the second protection member 215 of the first vibration generator 210 by the connection member 250.

In each of the first vibration generator 210 and the second vibration generator 230, each of the first protection member 213 and the second protection member 215 may be formed of a plastic material. For example, each of the first protection member 213 and the second protection member 215 may be a polyimide (PI) film or a polyethylene terephthalate (PET) film, but aspects of the present disclosure are not limited thereto.

One or more of the first vibration generator 210 and the second vibration generator 230 according to an aspect of the present disclosure may further include a first adhesive layer 212 and a second adhesive layer 214.

In the first vibration generator 210, the first adhesive layer 212 may be disposed between the vibration portion 221 and the first protection member 213. For example, the first adhesive layer 212 may be disposed between the first electrode layer 221b of the vibration portion 221 and the first protection member 213. The first protection member 213 may be disposed over a first surface (or the first electrode layer 221b) of the vibration portion 221 by the first adhesive layer 212. For example, the first protection member 213 may be coupled or connected to the first surface (or the first electrode layer 221b) of the vibration portion 221 by a film laminating process using the first adhesive layer 212.

In the first vibration generator 210, the second adhesive layer 214 may be disposed between the vibration portion 221 and the second protection member 215. For example, the second adhesive layer 214 may be disposed between the second electrode layer 221c of the vibration portion 221 and the second protection member 215. The second protection member 215 may be disposed over a second surface (or the second electrode layer 221c) of the vibration portion 221 by the second adhesive layer 214. For example, the second protection member 215 may be coupled or connected to the second surface (or the second electrode layer 221c) of the vibration portion 221 by a film laminating process using the second adhesive layer 214.

In the first vibration generator 210, the first and the second adhesive layers 212 and 214 may be connected or coupled to each other between the first protection member 213 and the second protection member 215. For example, in the first vibration generator 210, the first and the second adhesive layers 212 and 214 may be connected or coupled to each other at a periphery portion between the first protection member 213 and the second protection member 215. Accordingly, in the first vibration generator 210, the vibration portion 221 may be surrounded by the first and second adhesive layers 212 and 214. For example, the first and second adhesive layers 212 and 214 may completely surround the whole vibration portion 221. For example, the first and second adhesive layers 212 and 214 may be referred to as a cover member, but aspects of the present disclosure are not limited thereto. When the first and second adhesive layers 212 and 214 are a cover member, the first protection member 213 may be disposed at a first surface of the cover member, and the second protection member 215 may be disposed at a second surface of the cover member. For example, for convenience of description, the first and second adhesive layers 212 and 214 are illustrated as first and second adhesive layers 212 and 214, but aspects of the present disclosure are not limited thereto and may be provided as one adhesive layer.

In the second vibration generator 230, the first adhesive layer 212 may be disposed between the vibration portion 221 and the first protection member 213. For example, the first adhesive layer 212 may be disposed between the first electrode layer 221b of the vibration portion 221 and the first protection member 213. The first protection member 213 may be disposed over a first surface (or the first electrode layer 221b) of the vibration portion 221 by the first adhesive layer 212. For example, the first protection member 213 may be coupled or connected to the first surface (or the first electrode layer 221b) of the vibration portion 221 by a film laminating process using the first adhesive layer 212.

In the second vibration generator 230, the second adhesive layer 214 may be disposed between the vibration portion 221 and the second protection member 215. For example, the second adhesive layer 214 may be disposed between the second electrode layer 221c of the vibration portion 221 and the second protection member 215. The second protection member 215 may be disposed over a second surface (or the second electrode layer 221c) of the vibration portion 221 by the second adhesive layer 214. For example, the second protection member 215 may be coupled or connected to the second surface (or the second electrode layer 221c) of the vibration portion 221 by a film laminating process using the second adhesive layer 214.

In the second vibration generator 230, the first and second adhesive layers 212 and 214 may be connected or coupled to each other between the first protection member 213 and the second protection member 215. For example, in the second vibration generator 230, the first and second adhesive layers 212 and 214 may be connected or coupled to each other at a periphery portion between the first protection member 213 and the second protection member 215. Accordingly, in the second vibration generator 230, the vibration portion 221 may be surrounded by the first and second adhesive layers 212 and 214. For example, the first and second adhesive layers 212 and 214 may completely surround the whole vibration portion 221. For example, the first and second adhesive layers 212 and 214 may be referred to as a cover member, but aspects of the present disclosure are not limited thereto. When the first and second adhesive layers 212 and 214 are a cover member, the first protection member 213 may be disposed at a first surface of the cover member, and the second protection member 215 may be disposed at a second surface of the cover member. For example, for convenience of description, the first and second adhesive layers 212 and 214 are illustrated as first and second adhesive layers 212 and 214, but aspects of the present disclosure are not limited thereto and may be provided as one adhesive layer.

In each of the first and the second vibration generators 210 and 230, each of the first and second adhesive layers 212 and 214 may include an electric insulating material. For example, the electric insulating material may have adhesiveness and may include a material capable of compression and decompression. For example, one or more of the first and second adhesive layers 212 and 214 may include an epoxy resin, an acrylic resin, a silicone resin, or a urethane resin, but aspects of the present disclosure are not limited thereto.

One or more of the first and second vibration generators 210 and 230 according to an aspect of the present disclosure may further include a first power supply line PL1, a second power supply line PL2, and a pad part 217.

The first power supply line PL1 of one or more of the first and second vibration generators 210 and 230 may extend long in a second direction Y. The first power supply line PL1 may be disposed in the first protection member 213 and may be electrically connected to the first electrode layer 221b. For example, the first power supply line PL1 may be disposed at a rear surface of the first protection member 213 facing the first electrode layer 221b and may be electrically connected to the first electrode layer 221b. For example, the first power supply line PL1 may be disposed at the rear surface of the first protection member 213 directly facing the first electrode layer 221b and may be directly and electrically connected to the first electrode layer 221b. For example, the first power supply line PL1 may be electrically connected to the first electrode layer 221b by an anisotropic conductive film. As another aspect of the present disclosure, the first power supply line PL1 may be electrically connected to the first electrode layer 221b through a conductive material (or particles) included in the first adhesive layer 212.

According to an aspect of the present disclosure, the first power supply line PL1 of one or more of the first and second vibration generators 210 and 230 may include at least one or more first power lines which protrude along a first direction X crossing the second direction Y. The at least one or more first power lines may extend long from at least one or more of one surface and the other surface of the first power supply line PL1 along the first direction X and may be electrically connected to the first electrode layer 221b. Accordingly, the at least one or more first power lines may enhance the uniformity of the vibration driving signal applied to the first electrode layer 221b.

The second power supply line PL2 of one or more of the first and second vibration generators 210 and 230 may be disposed in the second protection member 215 and may be electrically connected to the second electrode layer 221c. For example, the second power supply line PL2 may be disposed at a rear surface of the second protection member 215 facing the second electrode layer 221c and may be electrically connected to the second electrode layer 221c. For example, the second power supply line PL2 may be disposed at the rear surface of the second protection member 215 directly facing the second electrode layer 221c and may be directly and electrically connected to the second electrode layer 221c. For example, the second power supply line PL2 may be electrically connected to the second electrode layer 221c by an anisotropic conductive film. As another aspect of the present disclosure, the second power supply line PL2 may be electrically connected to the second electrode layer 221c through a conductive material (or particles) included in the second adhesive layer 214.

According to an aspect of the present disclosure, the second power supply line PL2 of one or more of the first and second vibration generators 210 and 230 may include at least one or more second power lines which protrude along the first direction X. The at least one or more second power lines may extend long from at least one or more of one surface and the other surface of the second power supply line PL2 along the first direction X and may be electrically connected to the second electrode layer 221c. The at least one or more second power lines may overlap with or stack the at least one or more first power lines. Accordingly, the at least one or more second power lines may enhance the uniformity of the vibration driving signal applied to the second electrode layer 221c.

The pad part 217 may be electrically connected to a first portion (or one side or one end) of one or more of the first power supply line PL1 and the second power supply line PL2. For example, the pad part 217 may be disposed at a first periphery portion of one or more of the first protection member 213 and the second protection member 215. The pad part 217 may be electrically connected to the first portion (or one side or one end) of one or more of the first power supply line PL1 and the second power supply line PL2.

The pad part 217 according to an aspect of the present disclosure may include a first pad electrode electrically connected to the first portion (or one side or one end) of the first power supply line PL1 and a second pad electrode electrically connected to the first portion (or one side or one end) of the second power supply line PL2. For example, one or more of the first pad electrode and the second pad electrode may be exposed at the first periphery portion of one or more of the first protection member 213 and the second protection member 215.

One or more of the first and second vibration generators 210 and 230 according to an aspect of the present disclosure may further include a flexible cable 219.

The flexible cable 219 may be electrically connected to the pad part 217 of one or more of the first and second vibration generators 210 and 230. Thus, the flexible cable 219 may supply a corresponding vibration portion 221 with vibration driving signals (or a sound signal) provided from a vibration driving circuit. The flexible cable 219 according to an aspect of the present disclosure may include a first terminal and a second terminal. The first terminal may be electrically connected to the first pad electrode of the pad part 217. The second terminal may be electrically connected to the second pad electrode of the pad part 217. For example, the flexible cable 219 may be a flexible printed circuit cable or a flexible flat cable, but aspects of the present disclosure are not limited thereto.

The vibration driving circuit (or a sound processing circuit) may be configured to generate an alternating current (AC) vibration driving signal including a first vibration driving signal and a second vibration driving signal based on a sound source. The first vibration driving signal may be any one of a positive (+) vibration driving signal and a negative (−) vibration driving signal, and the second vibration driving signal may be any one of a positive (+) vibration driving signal and a negative (−) vibration driving signal. As an aspect of the present disclosure, the first vibration driving signal may be supplied to the first electrode layer 221b of the vibration portion 221 through the first terminal of the flexible cable 219, the first pad electrode of the pad part 217, and the first power supply line PL1. The second vibration driving signal may be supplied to the second electrode layer 221c of the vibration portion 221 through the second terminal of the flexible cable 219, the second pad electrode of the pad part 217, and the second power supply line PL2. As another aspect of the present disclosure, the first vibration driving signal may be supplied to the second electrode layer 221c of the vibration portion 221 through the first terminal of the flexible cable 219, the second pad electrode of the pad part 217, and the second power supply line PL2. The second vibration driving signal may be supplied to the first electrode layer 221b of the vibration portion 211 through the second terminal of the flexible cable 219, the first pad electrode of the pad part 217, and the first power supply line PL1.

The connection member 250 according to an aspect of the present disclosure may be disposed between the first and second vibration generators 210 and 230. For example, the connection member 250 may be disposed between the second protection member 215 of the first vibration generator 210 and the first protection member 213 of the second vibration generator 230. For example, the connection member 250 may include a material including an adhesive layer which is good in adhesive force or attaching force with respect to the first and second vibration generators 210 and 230. For example, the connection member 250 may include a foam pad, a double-sided tape, or an adhesive, but aspects of the present disclosure are not limited thereto. For example, an adhesive layer of the connection member 250 may include epoxy, acrylic, silicone, or urethane, but aspects of the present disclosure are not limited thereto.

In FIGS. 8 and 9 and description relevant thereto, the vibration apparatus 200 according to an aspect of the present disclosure has been described as including the first and second vibration generators 210 and 230 and the connection member 250 disposed between the first and second vibration generators 210 and 230, but aspects of the present disclosure are not limited thereto. For example, the vibration apparatus 200 according to an aspect of the present disclosure may include a plurality of (for example, three or more) vibration generators 210 and 230 and a connection member 250 disposed between the plurality of vibration generators 210 and 230 based on a sound pressure level characteristic and an output characteristic of a sound generated based on a displacement of the display panel 100 based on a size and weight, or the like of the display panel 100. In this case, in order to maximize or increase the displacement amount or the amplitude displacement of the vibration apparatus 200, the plurality of vibration generators 210 and 230 may have the same size and may overlap with or stack with each other. For example, first and second portions (or end portions, or outer surfaces, or each corner portion) 210a and 230a of each vibration portion 221 (or vibration layer 221a) of one or more of the plurality of vibration generators 210 and 230 may substantially overlap with or stack without being staggered. For example, the first and second portions (or end portions, or outer surfaces, or each corner portion) 210a and 230a of each vibration portion 221 (or vibration layer 221a) of one or more of the plurality of vibration generators 210 and 230 may substantially overlap with or stack within an error range of a manufacturing process without being staggered. For example, the first and second portions (or end portions, ends, outer surfaces, or each corner portion) 210a and 230a of each vibration portion 221 (or vibration layer 221a) of each of the plurality of vibration generators 210 and 230 may be aligned on a virtual extension line VL, or may be disposed at the virtual extension line VL. For example, the first and second portions (or end portions, ends, outer surfaces, or each corner portion) 210a and 230a of each vibration portion 221 (or vibration layer 221a) of each of the plurality of vibration generators 210 and 230 may be accurately aligned on the virtual extension line VL, or may be accurately disposed at the virtual extension line VL.

Figure 10:
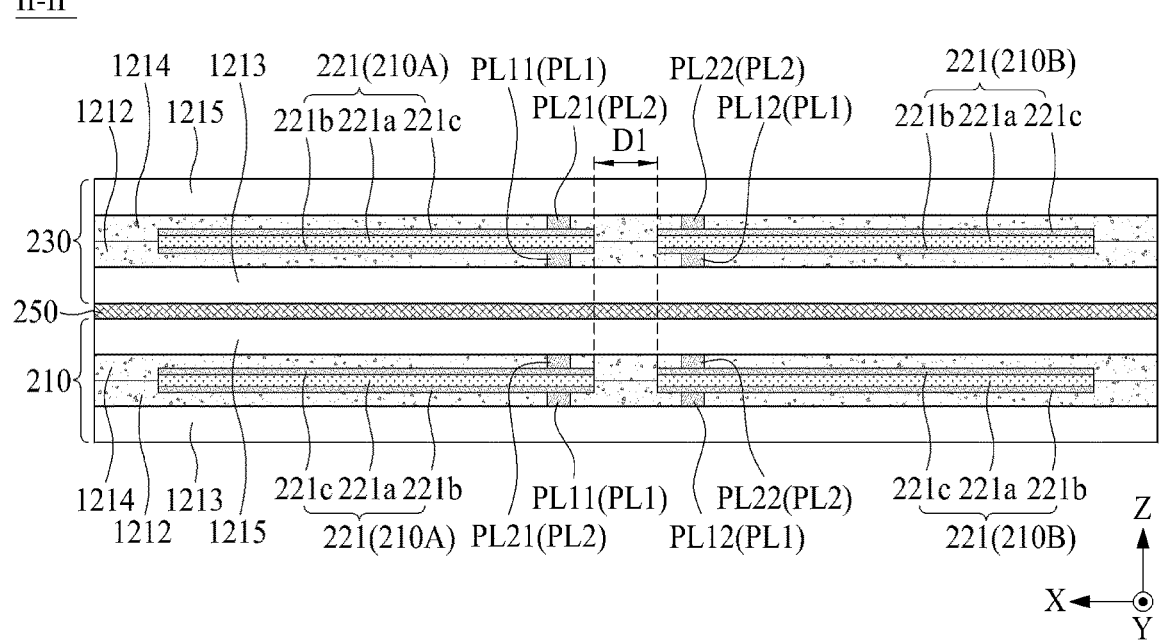
FIG. 10 is another cross-sectional view taken along line II-IF illustrated in FIG. 4.

FIG. 10 is another cross-sectional view taken along line II-IF illustrated in FIG. 4.

With reference to FIGS. 4 and 10, in the vibration apparatus according to another aspect of the present disclosure, each of the first vibration generator 210 and the second vibration generator 230 may include at least one or more vibration structures 210A to 210D or a plurality of vibration structures 210A to 210D. FIG. 10 illustrates an example including four vibration structures, each of the first vibration generator 210 and the second vibration generator 230 according to an aspect of the present disclosure may be configured to include two or more vibration structures (or two or more vibration modules).

The plurality of vibration structures 210A to 210D may be electrically separated and disposed while being spaced apart from each other along each of a first direction X and a second direction Y.

Each of the plurality of vibration structures 210A to 210D may alternately and/or repeatedly contract and expand based on a piezoelectric effect to vibrate. Each of the plurality of vibration structures 210A to 210D may be disposed or tiled at a certain interval. Therefore, each of the first vibration generator 210 and the second vibration generator 230 in which the plurality of vibration structures 210A to 210D are tiled may be referred to as a vibration array, a vibration array portion, a vibration module array portion, a vibration array structure, a tiling vibration array, a tiling vibration array module, or a tiling vibration film, but aspects of the present disclosure are not limited thereto. Descriptions of a plurality of vibration structures 210A to 210D may be substantially the same as descriptions given above with reference to FIG. 4, and thus, their repetitive descriptions may be omitted or will be briefly given.

Each of the first to fourth vibration structures 210A to 210D according to an aspect of the present disclosure may include a vibration portion 221. The vibration portion 221 may include a vibration layer 221a, a first electrode layer 221b, and a second electrode layer 221c. Descriptions of a vibration layer 221a, a first electrode layer 221b, and a second electrode layer 221c may be substantially the same as descriptions given above with reference to FIGS. 4, 5, 8, and 9, and thus, their repetitive descriptions may be omitted or will be briefly given.

The vibration layer 221a may include a ceramic-based material capable of realizing a relatively high vibration. For example, the vibration layer 221a may include a 1-3 composite structure having a piezoelectric characteristic of a 1-3 vibration mode or a 2-2 composite structure having a piezoelectric characteristic of a 2-2 vibration mode. For example, the vibration layer 221a may be the same as the vibration portion 211 described above with reference to FIG. 4, or may include the first portions 211a and the second portion 211b similar to the vibration portion 211 described above with reference to FIGS. 6A to 6F.

Each of the first vibration generator 210 and the second vibration generator 230 according to an aspect of the present disclosure may further include a first protection member 1213 and a second protection member 1215. The first protection member 1213 according to an aspect of the present disclosure may be commonly disposed over the first surface of each of the plurality of vibration structures 210A to 210D by a first adhesive layer 1212. The second protection member 1215 may be commonly disposed over the second surface of each of the plurality of vibration structures 210A to 210D by a second adhesive layer 1214. The first protection member 1213 and the second protection member 1215 may be substantially the same as the first protection member 213 and the second protection member 215 described above with reference to FIGS. 4, 5, 8, and 9, and thus, its description is omitted.

The first adhesive layer 1212 may be disposed at the first surface of each of the plurality of vibration structures 210A to 210D and between the plurality of vibration structures 210A to 210D. For example, the first adhesive layer 1212 may be formed at a rear surface (or an inner surface) of the first protection member 1213 facing the first surface of each of the first vibration generator 210 and the second vibration generator 230. For example, the first adhesive layer 1212 may be disposed at the first surface of each of the plurality of vibration structures 210A to 210D, and filled between the plurality of vibration structures 210A to 210D.

The second adhesive layer 1214 may be disposed at the second surface of each of the plurality of vibration structures 210A to 210D and between the plurality of vibration structures 210A to 210D. For example, the second adhesive layer 1214 may be formed at a front surface (or an inner surface) of the second protection member 1215 facing the second surface of each of the first vibration generator 210 and the second vibration generator 230. For example, the second adhesive layer 1214 may be disposed at the second surface of each of the plurality of vibration structures 210A to 210D, and filled between the plurality of vibration structures 210A to 210D. The first adhesive layer 1212 and the second adhesive layer 1214 may be substantially the same as the first adhesive layer 212 and the second adhesive layer 214 described above with reference to FIGS. 4, 5, 8, and 9, and thus, its description is omitted.

One or more of the first vibration generator 210 and the second vibration generator 230 according to another aspect of the present disclosure may further include a first power supply line PL1, a second power supply line PL2, and a pad part 217.

The first power supply line PL1 may be disposed at the first protection member 1213. For example, the first power supply line PL1 may be disposed at a rear surface of the first protection member 1213 facing the first surface of each of the first vibration generator 210 and the second vibration generator 230. The first power supply line PL1 may be electrically connected to the first electrode layer 221b of each of the plurality of vibration structures 210A to 210D. For example, the first power supply line PL1 may be directly and electrically connected to the first electrode layer 221b of each of the plurality of vibration structures 210A to 210D. For example, the first power supply line PL1 may be electrically connected to the first electrode layer 221b of each of the plurality of vibration structures 210A to 210D by an anisotropic conductive film. As another aspect of the present disclosure, the first power supply line PL1 may be electrically connected to the first electrode layer 221b of each of the plurality of vibration structures 210A to 210D by a conductive material (or particle) included in the first adhesive layer 1212.

The first power supply line PL1 according to an aspect of the present disclosure may include a 1-1st and a 1-2nd upper power lines PL11 and PL12 disposed along a second direction Y. For example, the 1-1st upper power line PL11 may be electrically connected to the first electrode layer 221b of each of the first and third vibration structures 210A and 210C (or a first group) parallel to the second direction Y of the plurality of vibration structures 210A to 210D. For example, the first and third vibration structures 210A and 210C may be disposed at a first column parallel to the second direction Y of the plurality of vibration structures 210A to 210D. The 1-2nd upper power line PL12 may be electrically connected to the first electrode layer 221b of each of the second and fourth vibration structures 210B and 210D (or a second group) parallel to the second direction Y of the plurality of vibration structures 210A to 210D. For example, the second and fourth vibration structures 210B and 210D may be disposed at a second column parallel to the second direction Y of the plurality of vibration structures 210A to 210D.

The second power supply line PL2 may be disposed at the second protection member 1215. For example, the second power supply line PL2 may be disposed at a first surface of the second protection member 1215 facing the second surface of each of the first vibration generator 210 and the second vibration generator 230. For example, the first surface of the second protection member 1215 may be a rear surface (or a lower surface) of the second protection member 1215. The second power supply line PL2 may be electrically connected to the second electrode layer 221c of each of the plurality of vibration structures 210A to 210D. For example, the second power supply line PL2 may be directly and electrically connected to the second electrode layer 221c of each of the plurality of vibration structures 210A to 210D. For example, the second power supply line PL2 may be electrically connected to the second electrode layer 221c of each of the plurality of vibration structures 210A to 210D by an anisotropic conductive film. As another aspect of the present disclosure, the second power supply line PL2 may be electrically connected to the second electrode layer 221c of each of the plurality of vibration structures 210A to 210D by a conductive material (or particle) included in the second adhesive layer 1214.

The second power supply line PL2 according to an aspect of the present disclosure may include a 2-1st and a 2-2nd lower power lines PL21 and PL22 disposed along a second direction Y. For example, the 2-1st lower power line PL21 may be electrically connected to the second electrode layer 221c of each of the first and third vibration structures 210A and 210C (or a first group) parallel to the second direction Y of the plurality of vibration structures 210A to 210D. For example, the first and third vibration structures 210A and 210C may be disposed at a first column parallel to the second direction Y of the plurality of vibration structures 210A to 210D. The 2-2nd lower power line PL22 may be electrically connected to the second electrode layer 221c of each of the second and fourth vibration structures 210B and 210D (or a second group) of the plurality of vibration structures 210A to 210D. For example, the second and fourth vibration structures 210B and 210D may be disposed at a second column parallel to the second direction Y of the plurality of vibration structures 210A to 210D.

The pad part 217 may be electrically connected to the first power supply line PL1 and the second power supply line PL2. For example, the pad part 217 may be disposed at each of the first vibration generator 210 and the second vibration generator 230 so as to be electrically connected to one portion (or one end) of at least one or more of the first power supply line PL1 and the second power supply line PL2.

The pad part 217 according to an aspect of the present disclosure may include a first pad electrode electrically connected to one portion of the first power supply line PL1 and a second pad electrode electrically connected to one portion of the second power supply line PL2.

The first pad electrode may be connected to one portion (or one end) of each of the 1-1st and 1-2nd upper power lines PL11 and PL12 of the first power supply line PL1 in common. For example, the one portion (or one end) of each of the 1-1st and 1-2nd upper power lines PL11 and PL12 may branch from the first pad electrode.

The second pad electrode may be connected to one portion (or one end) of each of the 2-1st and 2-2nd lower power lines PL21 and PL22 of the second power supply line PL2 in common. For example, the one portion (or one end) of each of the 2-1st and 2-2nd lower power lines PL21 and PL22 may branch from the second pad electrode.

According to an aspect of the present disclosure, one or more of the first power supply line PL1, the second power supply line PL2, and the pad part 217 may be configured to be a transparent conductive material, a semitransparent conductive material, or an opaque conductive material so as to be transparent, semitransparent, or opaque.

One or more of the first vibration generator 210 and the second vibration generator 230 according to another aspect of the present disclosure may further include a flexible cable 219.

The flexible cable 219 may be electrically connected to the pad part 217 disposed at the each of the first vibration generator 210 and the second vibration generator 230 and may supply the each of the first vibration generator 210 and the second vibration generator 230 with one or more vibration driving signals (or a sound signal) provided from a vibration driving circuit. The flexible cable 219 according to an aspect of the present disclosure may include a first terminal and a second terminal. The first terminal may be electrically connected to the first pad electrode of the pad part 217. The second terminal may be electrically connected to the second pad electrode of the pad part 217. For example, the flexible cable 219 may be as a flexible printed circuit cable or a flexible flat cable, but aspects of the present disclosure are not limited thereto.

Therefore, the vibration apparatus 200 according to another aspect of the present disclosure may include the plurality of vibration structures 210A to 210D which are arranged (or tiled) at a certain interval D1 and D2 so as to be implemented as a single vibrator without being independently driven, and thus, may be driven as a large-area vibrator based on a single-body vibration of the plurality of vibration structures 210A to 210D. For example, the plurality of vibration structures 210A to 210D may be a single vibrator which is arranged (or tiled) at a certain interval D1 and D2. Accordingly, the vibration apparatus 200 may be configured to vibrate a large area of display panel or vibrate by itself in a large-area, thereby increasing or enhancing a sound characteristic and a sound pressure level characteristic in the low-pitched sound band and a reproduction band of a sound output from the display panel.

Figure 11:
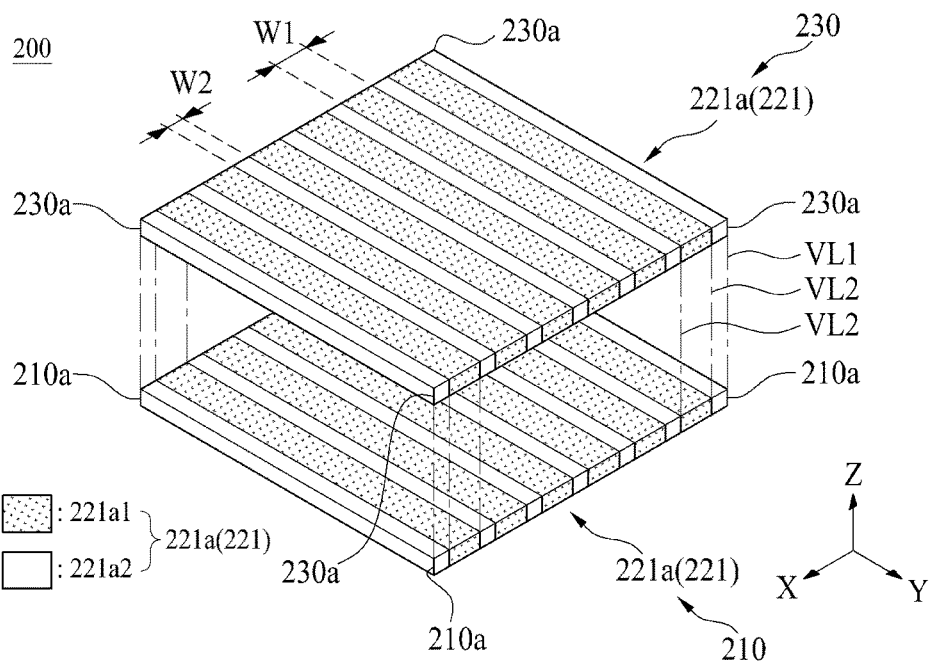
FIG. 11 illustrates a vibration portion illustrated in FIG. 8.

FIG. 11 illustrates a vibration layer of the vibration portion illustrated in FIG. 8.

With reference to FIG. 11, the vibration layer 221a of according to an aspect of the present disclosure may include a plurality of first portions 221a1 and a plurality of second portions 221a2. For example, the plurality of first portions 221a1 and the plurality of second portions 221a2 may be alternately and repeatedly arranged in a first direction X (or a second direction Y). For example, the first direction X may be a widthwise direction of the vibration layer 221*a*, the second direction Y may be a lengthwise direction of the vibration layer 221*a*, but aspects of the present disclosure are not limited thereto. For example, the first direction X may be the lengthwise direction of the vibration layer 221*a*, and the second direction Y may be the widthwise direction of the vibration layer 221*a*.

Each of the plurality of first portions 221*a*1 may be configured with an inorganic material portion. The inorganic material portion may include the piezoelectric material described above. For example, each of the plurality of first portions 221*a*1 may include a piezoelectric material which is be substantially the same as the vibration portion 211 described above with reference to FIGS. 6A to 6F, and thus, their repetitive descriptions may be omitted.

Each of the plurality of first portions 221*a*1 according to an aspect of the present disclosure may be disposed between the plurality of second portions 221*a*2. Each of the plurality of first portions 221*a*1 and the plurality of second portions 221*a*2 may include a piezoelectric material which is be substantially the same as the plurality of first portions 221*a* and the plurality of second portions 221*b* described above with reference to FIGS. 6A to 6F, and thus, their repetitive descriptions may be omitted.

In order to maximize or increase a displacement amount or an amplitude displacement of the vibration apparatus 200, the vibration portion 221 of the first vibration generator 210 and the vibration portion 221 of the second vibration generator 230 may have the same size and may overlap with (or stack) with each other. For example, a first portion (or an end portion, or an outer surface, or each corner portion) 210*a* of the vibration portion 221 (or vibration layer 221*a*) of the first vibration generator 210 may be substantially aligned with or overlap with a second portion (or an end portion, or an outer surface, or each corner portion) 230*a* of each vibration portion 221 (or vibration layer 221*a*) of the second vibration generator 230 without being staggered. For example, the first portion (or an end portion, or an outer surface, or each corner portion) 210*a* of the vibration portion 221 (or vibration layer 221*a*) of the first vibration generator 210 may be substantially aligned with or overlap with the second portion (or an end portion, or an outer surface, or each corner portion) 230*a* of each vibration portion 221 (or vibration layer 221*a*) of the second vibration generator 230 within an error range of a manufacturing process without being staggered. For example, the first portion (or an end portion, or an outer surface, or each corner portion) 210*a* of each vibration portion 221 (or vibration layer 221*a*) of the first vibration generator 210 may be aligned on a first virtual extension line VL1, or may be disposed at the first virtual extension line VL1. The second portion (or an end portion, or an outer surface, or each corner portion) 230*a* of each vibration portion 221 (or vibration layer 221*a*) of the second vibration generator 230 may be accurately aligned on the first virtual extension line VL1, or may be accurately disposed at the first virtual extension line VL1. The second portion (or an end portion, or an outer surface, or each corner portion) 230*a* of each vibration portion 221 (or vibration layer 221*a*) of the second vibration generator 230 may be aligned on the first virtual extension line VL1, or may be disposed at the first virtual extension line VL1. The second portion (or an end portion, or an outer surface, or each corner portion) 230*a* of each vibration portion 221 (or vibration layer 221*a*) of the second vibration generator 230 may be accurately aligned on the first virtual extension line VL1, or may be accurately disposed at the first virtual extension line VL1.

According to another aspect of the present disclosure, the plurality of first portions 221*a*1 of the first vibration generator 210 and the plurality of first portions 221*a*1 of the second vibration generator 230 may have the same size as each other, and may substantially overlap with or stack with each other. For example, the plurality of first portions 221*a*1 of the first vibration generator 210 and the plurality of first portions 221*a*1 of the second vibration generator 230 may have the same size as each other, and may substantially overlap with or stack without being staggered. According to an aspect of the present disclosure, the first portions (or end portions, or outer surfaces, or each corner portion) of each of the plurality of first portions 221*a*1 included in the first vibration generator 210 may substantially overlap with or stack the first portions (or end portions, or outer surfaces, or each corner portion) of each of the plurality of first portions 221*a*1 included in the second vibration generator 230. For example, the first portions (or end portions, or outer surfaces, or each corner portion) of each of the plurality of first portions 221*a*1 included in the first vibration generator 210 may substantially overlap with or stack the first portions (or end portions, or outer surfaces, or each corner portion) of each of the plurality of first portions 221*a*1 included in the second vibration generator 230 without being staggered. For example, the first portions (or end portions, or outer surfaces, or each corner portion) of each of the plurality of first portions 221*a*1 included in the first vibration generator 210 and the first portions (or end portions, or outer surfaces, or each corner portion) of each of the plurality of first portions 221*a*1 included in the second vibration generator 230 may be aligned on or disposed at a second virtual extension line VL2. For example, the first portions (or end portions, or outer surfaces, or each corner portion) of each of the plurality of first portions 221*a*1 included in the first vibration generator 210 and the first portions (or end portions, or outer surfaces, or each corner portion) of each of the plurality of first portions 221*a*1 included in the second vibration generator 230 may be accurately aligned on or accurately disposed at the second virtual extension line VL2 without being staggered.

According to another aspect of the present disclosure, the plurality of second portions 221*a*2 of the first vibration generator 210 and the plurality of second portions 221*a*2 of the second vibration generator 230 may have the same size as each other, and may substantially overlap with or stack with each other. For example, the plurality of second portions 221*a*2 of the first vibration generator 210 and the plurality of second portions 221*a*2 of the second vibration generator 230 may have the same size as each other, and may substantially overlap with or stack without being staggered. According to an aspect of the present disclosure, the first portions (or end portions, or outer surfaces, or each corner portion) 210*a* of each of the plurality of second portions 221*a*2 included in the first vibration generator 210 may substantially overlap with or stack the first portions (or end portions, or outer surfaces, or each corner portion) 230*a* of each of the plurality of second portions 221*a*2 included in the second vibration generator 230. For example, the first portions (or end portions, or outer surfaces, or each corner portion) 210*a* of each of the plurality of second portions 221*a*2 included in the first vibration generator 210 may substantially overlap with or stack the first portions (or end portions, or outer surfaces, or each corner portion) 230*a* of each of the plurality of second portions 221*a*2 included in the second vibration generator 230 without being staggered. For example, the first portions (or end portions, or outer surfaces, or each corner portion) 210*a* of each of the plurality of second portions 221a2 included in the first vibration generator 210 and the first portions (or end portions, or outer surfaces, or each corner portion) 230a of each of the plurality of second portions 221a2 included in the second vibration generator 230 may be aligned on or disposed at a second virtual extension line VL2. For example, the first portions (or end portions, or outer surfaces, or each corner portion) 210a of each of the plurality of second portions 221a2 included in the first vibration generator 210 and the first portions (or end portions, or outer surfaces, or each corner portion) 230a of each of the plurality of second portions 221a2 included in the second vibration generator 230 may be accurately aligned on or accurately disposed at the second virtual extension line VL2 without being staggered. Therefore, in the vibration apparatus 200 according to an aspect of the present disclosure, the vibration layer 221a of the first vibration generator 210 and the vibration layer 221a of the second vibration generator 230 may be displaced in the same direction, and thus, the displacement amount or the amplitude displacement of the vibration apparatus 200 may be maximized or increased, thereby increasing (or maximizing) a displacement amount (or a bending force or a flexural force) or an amplitude displacement of the display panel 100.

In FIG. 11 and description relevant thereto, the vibration apparatus 200 according to another aspect of the present disclosure has been described as including the first and second vibration generators 210 and 230, but aspects of the present disclosure are not limited thereto. For example, the vibration apparatus 200 according to another aspect of the present disclosure may include a plurality of (for example, three or more) vibration generators 210 and 230. In this case, in order to maximize or increase the displacement amount or the amplitude displacement of the vibration apparatus 200, the plurality of vibration generators 210 and 230 may have the same size and may overlap with or stack with each other. According to an aspect of the present disclosure, a first portion 221a1 of a vibration generator 210 disposed at an upper layer (or a top layer) of the three or more vibration generators 210 and 230 and a first portion 221a1 of a vibration generator 230 disposed at a lower layer (or a bottom layer) of the three or more vibration generators 210 and 230 may substantially overlap with or stack with each other. For example, the first portion 221a1 of the vibration generator 210 disposed at the upper layer of the three or more vibration generators 210 and 230 and the first portion 221a1 of the vibration generator 230 disposed at the lower layer of the three or more vibration generators 210 and 230 may substantially overlap with or stack without being staggered. For example, the first portion 221a1 of the vibration generator 210 disposed at the upper layer of the three or more vibration generators 210 and 230 and the first portion 221a1 of the vibration generator 230 disposed at the lower layer of the three or more vibration generators 210 and 230 may be aligned on or disposed at a virtual extension line VL. For example, the first portion 221a1 of the vibration generator 210 disposed at the upper layer of the three or more vibration generators 210 and 230 and the first portion 221a1 of the vibration generator 230 disposed at the lower layer of the three or more vibration generators 210 and 230 may be accurately aligned on or accurately disposed at the virtual extension line VL. Also, a second portion 221a2 of the vibration generator 210 disposed at the upper layer of the three or more vibration generators 210 and 230 and a second portion 221a2 of the vibration generator 230 disposed at the lower layer of the three or more vibration generators 210 and 230 may substantially overlap with or stack with each other.

For example, the second portion 221a2 of the vibration generator 210 disposed at the upper layer of the three or more vibration generators 210 and 230 and the second portion 221a2 of the vibration generator 230 disposed at the lower layer of the three or more vibration generators 210 and 230 may substantially overlap with or stack without being staggered. For example, the second portion 221a2 of the vibration generator 210 disposed at the upper layer of the three or more vibration generators 210 and 230 and the second portion 221a2 of the vibration generator 230 disposed at the lower layer of the three or more vibration generators 210 and 230 may be aligned on or disposed at the virtual extension line VL. For example, the second portion 221a2 of the vibration generator 210 disposed at the upper layer of the three or more vibration generators 210 and 230 and the second portion 221a2 of the vibration generator 230 disposed at the lower layer of the three or more vibration generators 210 and 230 may be accurately aligned on or accurately disposed at the virtual extension line VL.

Figure 12A:
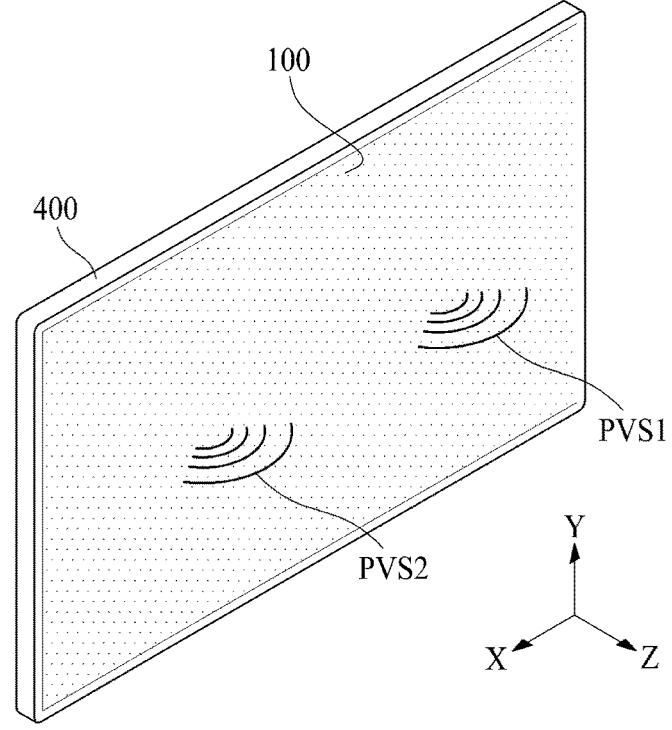
FIG. 12A illustrates an apparatus according to another aspect of the present disclosure.
Figure 12B:
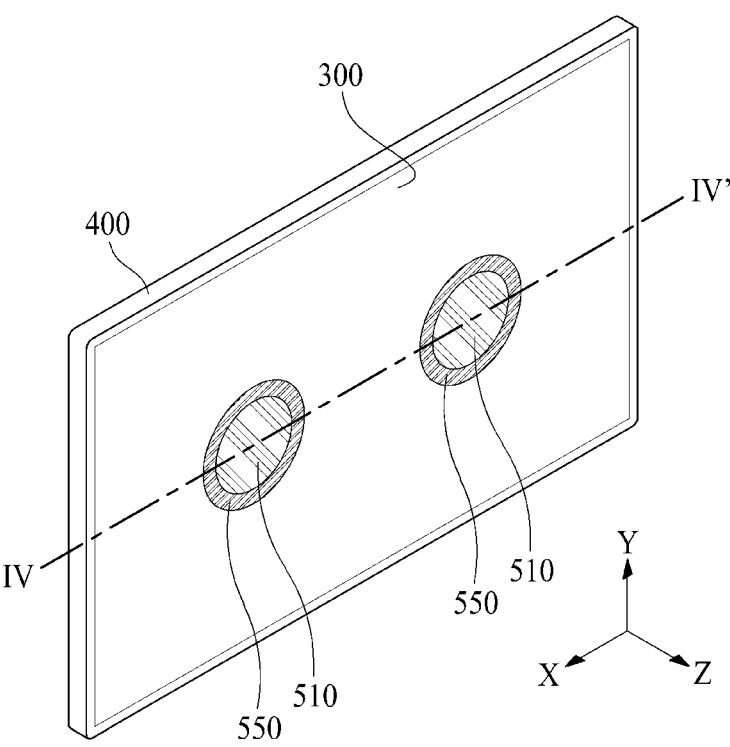
FIG. 12B illustrates a rear surface of the apparatus according to another aspect of the present disclosure.
Figure 13:
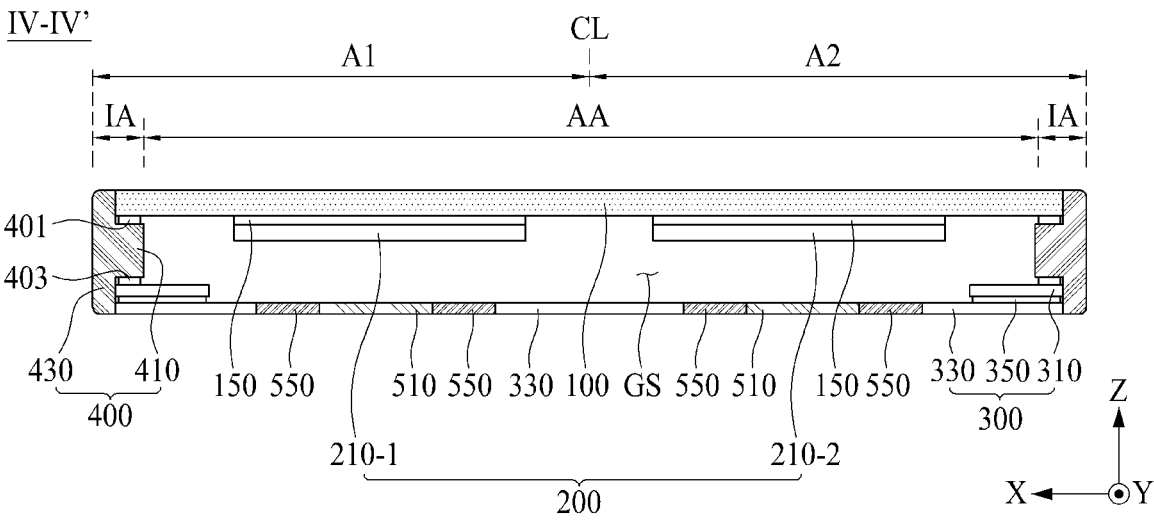
FIG. 13 is a cross-sectional view taken along line IV-IV' illustrated in FIG. 12B.

FIG. 12A illustrates an apparatus according to another aspect of the present disclosure. FIG. 12B illustrates a rear surface of the apparatus according to another aspect of the present disclosure. FIG. 13 is a cross-sectional view taken along line IV-IV' illustrated in FIG. 12B.

With reference to FIGS. 12A, 12B, and 13, in the apparatus according to another aspect of the present disclosure, a rear surface (or a back surface) of a display panel 100 may include a first region (or a first rear area) A1 and a second region (or a second rear area) A2. For example, in the rear surface of the display panel 100, the first region A1 may be a left rear region, and the second region A2 may be a right rear region. The first region A1 and the second region A2 may be a left-right symmetrical with respect to a center line CL of the display panel 100 in a first direction X, but aspects of the present disclosure are not limited thereto. For example, each of the first region A1 and the second region A2 may overlap with the display area of the display panel 100.

The vibration apparatus 200 according to another aspect of the present disclosure may include a first vibration apparatus 210-1 and a second vibration apparatus 210-2 disposed at the rear surface of the display panel 100.

The first vibration apparatus 210-1 may be disposed at the first region A1 of the display panel 100. For example, the first vibration apparatus 210-1 may be disposed close to a center or a periphery within the first region A1 of the display panel 100 with respect to the first direction X. The first vibration apparatus 210-1 according to an aspect of the present disclosure may be configured to vibrate the first region A1 of the display panel 100, and thus, may be configured to generate a second vibration sound PVS2 or a second haptic feedback in the first region A1 of the display panel 100. For example, the first vibration apparatus 210-1 according to an aspect of the present disclosure may directly vibrate the first region A1 of the display panel 100, and thus, may be configured to generate the second vibration sound PVS2 or the second haptic feedback in the first region A1 of the display panel 100. For example, the second vibration sound PVS2 may be a left sound. A size of the first vibration apparatus 210-1 according to an aspect of the present disclosure may have a size corresponding to half or less of the first region A1 or half or more of the first region A1 based on a characteristic of the second vibration sound PVS2 or a sound characteristic needed for an apparatus. As another aspect of the present disclosure, the size of the first vibration apparatus 210-1 may have a size corresponding to the first region A1 of the display panel 100. For example, the size of the first vibration apparatus 210-1 may have the same size as the first area A1 of the display panel 100 or may have a size smaller than the first area A1 of the display panel 100.

The second vibration apparatus 210-2 may be disposed at the second region A2 of the display panel 100. For example, the second vibration apparatus 210-2 may be disposed close to a center or a periphery within the second region A2 of the display panel 100 with respect to the first direction X. The second vibration apparatus 210-2 according to an aspect of the present disclosure may be configured to vibrate the second region A2 of the display panel 100, and thus, may be configured to generate a first vibration sound PVS1 or a first haptic feedback in the second region A2 of the display panel 100. For example, the second vibration apparatus 210-2 according to an aspect of the present disclosure may directly vibrate the second region A2 of the display panel 100, and thus, may be configured to generate the first vibration sound PVS1 or the first haptic feedback in the second region A2 of the display panel 100. For example, the first vibration sound PVS1 may be a right sound. A size of the second vibration apparatus 210-2 according to an aspect of the present disclosure may have a size corresponding to half or less of the second region A2 or half or more of the second region A2 based on a characteristic of the first vibration sound PVS1 or a sound characteristic needed for an apparatus. As another aspect of the present disclosure, the size of the second vibration apparatus 210-2 may have a size corresponding to the second region A2 of the display panel 100. For example, the size of the second vibration apparatus 210-2 may have the same size as the second area A2 of the display panel 100 or may have a size smaller than the second area A2 of the display panel 100. Therefore, the first vibration apparatus 210-1 and the second vibration apparatus 210-2 may have the same size or different sizes to each other based on a sound characteristic of left and right sounds and/or a sound characteristic of the apparatus. And, the first vibration apparatus 210-1 and the second vibration apparatus 210-2 may be disposed in a left-right symmetrical structure or a left-right asymmetrical structure with respect to the center line CL of the display panel 100.

Each of the first vibration apparatus 210-1 and the second vibration apparatus 210-2 may include one or more of the vibration apparatus 200 described above with reference to FIGS. 2 to 6F, and thus, their repetitive descriptions may be omitted.

The connection member 150 according to an aspect of the present disclosure may be disposed between each of the first vibration apparatus 210-1 and the second vibration apparatus 210-2 and the rear surface of the display panel 100. For example, each of the first vibration apparatus 210-1 and the second vibration apparatus 210-2 may be disposed at the rear surface of the display panel 100 by the connection member 150. The connection member 150 may be substantially the same as the connection member 150 described above with reference to FIG. 2, and thus, their repetitive descriptions may be omitted.

The apparatus according to an aspect of the present disclosure may include a first member 510 and a second member 550.

With reference to FIG. 12B, the second member 550 may surround the first member 510. For example, the first member 510 may have a circular shape, an oval shape, a polygonal shape, or a corner-rounded polygonal shape, but aspects of present disclosure are not limited thereto. For example, the first member 510 may include a metal plate and paper, or the like, but aspects of present disclosure are not limited thereto. For example, the first member 510 may be a low sound reinforcement member or a member generating a low sound, but aspects of present disclosure are not limited thereto. For example, the first member 510 may be a mass, a vibration plate, a drone cone, or a passive radiator, but aspects of present disclosure are not limited thereto.

The second member 550 may have a ductile characteristic. The second member 550 may be configured with a material having an elastic characteristic. For example, the second member 550 may be configured with rubber, silicon, coated cloth, metal, a polymer film, plastic, paper, or epoxy resin, but aspects of present disclosure are not limited thereto. For example, the second member 550 may include a material which differs from the supporting member 300. For example, the second member 550 may be configured with a material which differs from the second supporting member 330.

According to another aspect of the present disclosure, the first member 510 and the second member 550 may overlap with each of a first vibration apparatus 210-1 and a second vibration apparatus 210-2. For example, the first member 510 may overlap with a center of the first vibration apparatus 210-1 and a center of the second vibration apparatus 210-2. The supporting member 300 may be disposed between the first vibration apparatus 210-1 and the second vibration apparatus 210-2. For example, the second supporting member 330 may be disposed between the first vibration apparatus 210-1 and the second vibration apparatus 210-2. The first member 510 and the second member 550 may be disposed on the same surface as the supporting member 300. For example, the first member 510 and the second member 550 may be disposed on the same surface as the second supporting member 330. The second member 550 may be connected to the supporting member 300. For example, the second member 550 may be connected to the second supporting member 330. For example, the first member 510 may be connected to the second member 550. For example, the first member 510 may be disposed between adjacent second members 550. For example, the first member 510 and the second member 550 may not be disposed in a region where the vibration apparatus 200 is not disposed. The first member 510 may be configured to vibrate based on a vibration of the vibration apparatus 200. Accordingly, the first member 510 and/or the second member 550 may be configured to generate a sound or a vibration toward a rear surface of the supporting member 300. Descriptions of the first member 510 and the second member 550 may be the same as or similar to description given above with reference to FIG. 3, and thus, their descriptions are omitted.

Accordingly, the apparatus according to another aspect of the present disclosure may output, through the first vibration apparatus 210-1 and the second vibration apparatus 210-2, a first vibration sound (or a right sound) PVS1 and a second vibration sound (or a left sound) PVS2 to a forward region in front of the display panel 100 to provide a sound to a user. Moreover, according to aspects of the present disclosure, a first member 510 and a second member 550 may be provided at the supporting member 300, thereby providing an apparatus having an enhanced a sound characteristic and/or a sound pressure level characteristic of the low-pitched sound band.

Figure 14:
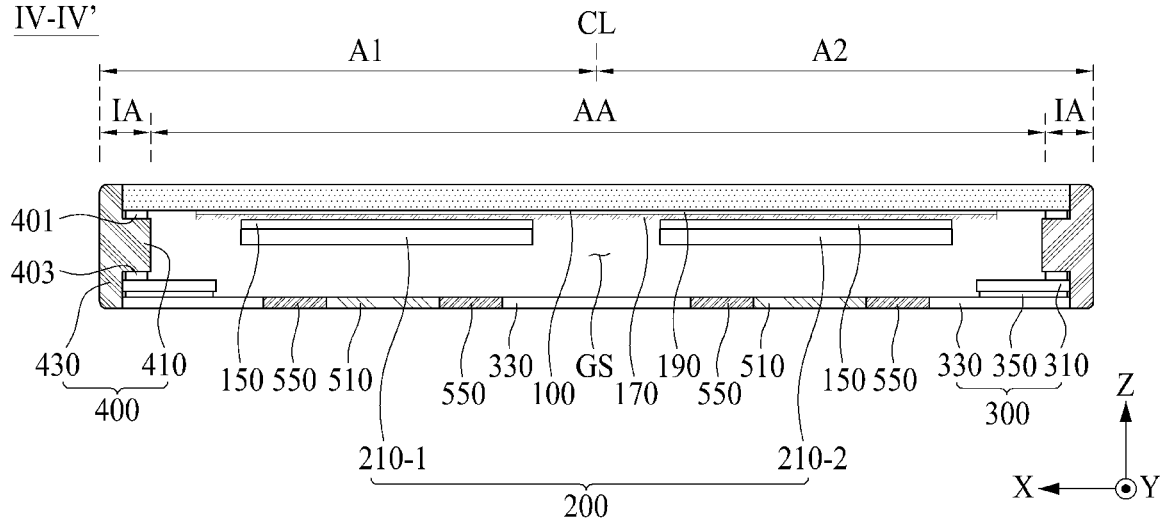
FIG. 14 is another cross-sectional view taken along line IV-IV' illustrated in FIG. 12B.

FIG. 14 is another cross-sectional view taken along line IV-IV' illustrated in FIG. 12B. FIG. 14 illustrates an aspect where a plate is further configured in the apparatus illustrated in FIG. 13. Hereinafter, therefore, repetitive descriptions of elements other than the plate and elements relevant thereto are omitted or will be briefly given.

With reference to FIG. 14, the apparatus according to another aspect of the present disclosure may include a display panel 100 and a vibration apparatus 200, and may further include a plate 170 which is disposed between the display panel 100 and the vibration apparatus 200.

Each of the display panel 100 and the vibration apparatus 200 may be substantially the same as each of the display panel 100 and the vibration apparatus 200 described above with reference to FIGS. 2 to 6F, and thus, their repetitive descriptions may be omitted or will be briefly given.

The plate 170 may be disposed between each of the first vibration apparatus 210-1 and the second vibration apparatus 210-2 of the vibration apparatus 200 and the rear surface of the display panel 100.

The plate 170 may dissipate heat generated from the display panel 100 or may reinforce or increase a mass of the vibration apparatus 200 which is disposed at or hung from the rear surface of the display panel 100. The plate 170 may have the same shape and size as the rear surface of the display panel 100, or may have the same shape and size as the vibration apparatus 200. As another aspect of the present disclosure, the plate 170 may have a size different from the display panel 100. For example, the plate 170 may be smaller than the size of the display panel 100. As another aspect of the present disclosure, the plate 170 may have a size different from the vibration apparatus 200. For example, the plate 170 may be greater or smaller than the size of the vibration apparatus 200. The vibration apparatus 200 may be the same as or smaller than the size of the display panel 100.

The plate 170 according to an aspect of the present disclosure may include a metal material. For example, the plate 170 may include one or more materials of stainless steel, aluminum (Al), a magnesium (Mg), a Mg alloy, a magnesium-lithium (Mg—Li) alloy, and an A1 alloy, but aspects of the present disclosure are not limited thereto.

The plate 170 according to an aspect of the present disclosure may include a plurality of opening portions. The plurality of opening portions may be configured to have a predetermined size and a predetermined interval. For example, the plurality of opening portions may be provided along a first direction X and a second direction Y so as to have a predetermined size and a predetermined interval. Due to the plurality of opening portions, a sound wave (or a sound pressure) based on a vibration of the vibration apparatus 200 may not be dispersed by the plate 170, and may concentrate on the display panel 100. Thus, the loss of a vibration caused by the plate 170 may be minimized, thereby increasing or improving a sound pressure level characteristic of a sound generated based on a vibration of the display panel 100. For example, the plate 170 including the plurality of openings may have a mesh shape. For example, the plate 170 including the plurality of openings may be a mesh plate.

According to some aspects of the present disclosure, the plate 170 may be connected or coupled to the rear surface of the display panel 100. The plate 170 may dissipate heat occurring in the display panel 100. For example, the plate 170 may be referred to as a heat dissipation member, a heat dissipation plate, or a heat sink, or the like, but aspects of the present disclosure are not limited thereto.

According to an aspect of the present disclosure, the plate 170 may reinforce or increase a mass of the vibration apparatus 200 which is disposed at or hung from the rear surface of the display panel 100. Thus, the plate 170 may decrease a resonance frequency of the vibration apparatus 200 based on an increase in mass of the vibration apparatus 200. Therefore, the plate 170 may increase or improve a sound characteristic and a sound pressure level characteristic of the low-pitched sound band generated based on a vibration of the vibration apparatus 200 and may enhance the flatness of a sound pressure level characteristic. For example, the flatness of a sound characteristic may be a magnitude of a deviation between a highest sound pressure level and a lowest sound pressure level. For example, the plate 170 may be referred to as a weight member, a mass member, a sound planarization member, or the like, but aspects of the present disclosure are not limited thereto.

According to an aspect of the present disclosure, a displacement amount (or a bending force or a flexural force) or an amplitude displacement (or a vibration width) of the display panel 100 with the plate 170 disposed therein may decrease as a thickness of the plate 170 increases, based on the stiffness of the plate 170. Accordingly, a sound pressure level characteristic and a low-pitched sound band characteristic of a sound generated based on a displacement (or a vibration) of the display panel 100 may be improved.

The plate 170 according to an aspect of the present disclosure may be coupled or connected to a rear surface of the display panel 100 by a connection member (or a fourth connection member) 190.

The connection member 190 according to an aspect of the present disclosure may include a material including an adhesive layer which is good in adhesive force or attaching force with respect to the rear surface of the display panel 100 and the vibration apparatus 200, respectively. For example, the connection member 190 may include a foam pad, a double-sided tape, or an adhesive, but aspects of the present disclosure are not limited thereto. For example, the adhesive layer of the connection member 190 may include epoxy, acrylic, silicone, or urethane, but aspects of the present disclosure are not limited thereto. For example, the adhesive layer of the connection member 190 may be the same as the adhesive layer of the connection member 150, but aspects of the present disclosure are not limited thereto. For example, the adhesive layer of the connection member 190 may include an acrylic-based material which is relatively better in adhesive force and hardness of acrylic and urethane so that the vibration of the vibration apparatus 200 may be transmitted to the display panel 100 well. As another aspect of the present disclosure, the adhesive layer of the connection member 190 may differ from the adhesive layer of the connection member 150.

The vibration apparatus 200 may be connected or coupled to a rear surface of the plate 170 by the connection member 150 described above, and thus, may be supported by or hung at the rear surface of the plate 170. Each of the first vibration apparatus 210-1 and the second vibration apparatus 210-2 of the vibration apparatus 200 may be connected or coupled to a rear surface of the plate 170 by the connection member 150 described above, and thus, may be supported by or hung at the rear surface of the plate 170.

The plate 170 according to an aspect of the present disclosure may be integrated into the vibration apparatus 200, or may be provided as an element of the vibration apparatus 200. For example, the plate 170 and the vibration apparatus 200 may be configured with one structure or one component (or module), which is provided as one body. Accordingly, when the plate 170 is disposed between the rear surface of the display panel 100 and the vibration apparatus 200, an assembly process between the display panel 100 and the vibration apparatus 200 may be easily performed based on component integration (or moduliza-tion) between the plate 170 and the vibration apparatus 200.

According to another aspect of the present disclosure, in a case where the plate 170 and the vibration apparatus 200 are configured with one structure or one component (or module) which is provided as one body, a non-display panel may be configured with a vibration plate. The plate 170 and the vibration apparatus 200 may be disposed at the non-display panel. The plate 170 and the vibration apparatus 200 may be connected or coupled to the non-display panel by a connection member 150. For example, the plate 170 may be wood, plastic, glass, cloth, a vehicle interior material, a building indoor ceiling, an aircraft interior material, or the like, but aspects of the present disclosure are not limited thereto. Therefore, a sound may be output by vibrating the non-display panel. As another aspect of the present disclosure, in a case where the plate 170 and the vibration apparatus 200 are configured with one structure or one component (or module) which is provided as one body, the plate 170 may be configured with a vibration plate. For example, the plate 170 may include one or more materials of stainless steel, aluminum (Al), a magnesium (Mg), a Mg alloy, a magnesium-lithium (Mg—Li) alloy, and an Al alloy, but aspects of the present disclosure are not limited thereto. For example, in a module (or structure) of the plate 170 and the vibration apparatus 200, the plate 170 may include a single nonmetal material or a composite nonmetal material of one or more of wood, plastic, glass, cloth, and leather, but aspects of the present disclosure are not limited thereto.

Accordingly, the apparatus according to another aspect of the present disclosure may output, through the first vibration apparatus 210-1 and the second vibration apparatus 210-2, a first vibration sound (or a right sound) PVS1 and a second vibration sound (or a left sound) PVS2 to a forward region in front of the display panel 100 to provide a sound to a user. Moreover, in the apparatus, a resonance frequency of the vibration apparatus 200 may decrease by the plate 170, and the heat generated from the display panel 100 may be dissipated through the plate 170.

Figure 15:
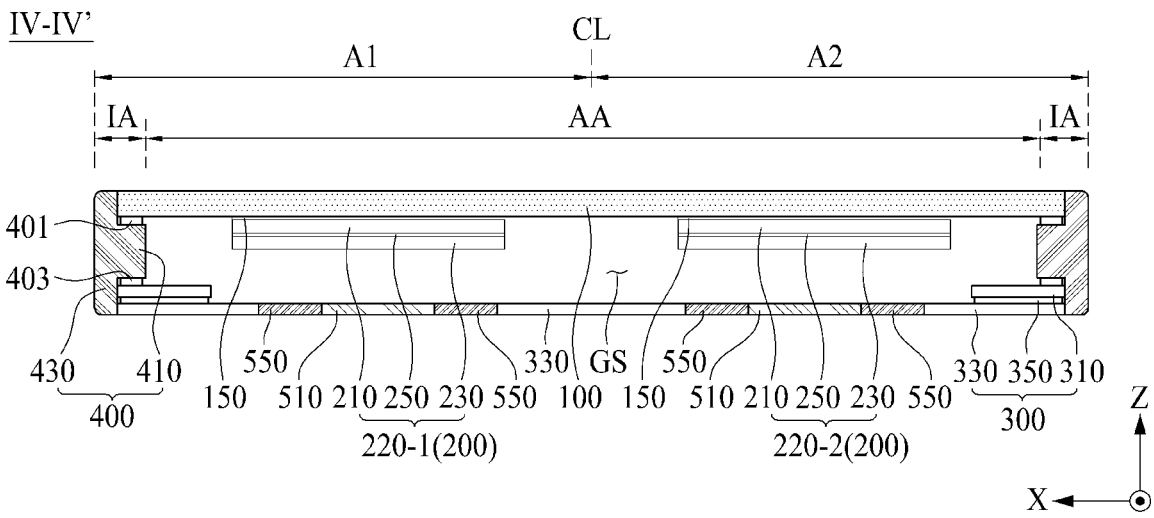
FIG. 15 is another cross-sectional view taken along line IV-IV' illustrated in FIG. 12B.
Figure 16:
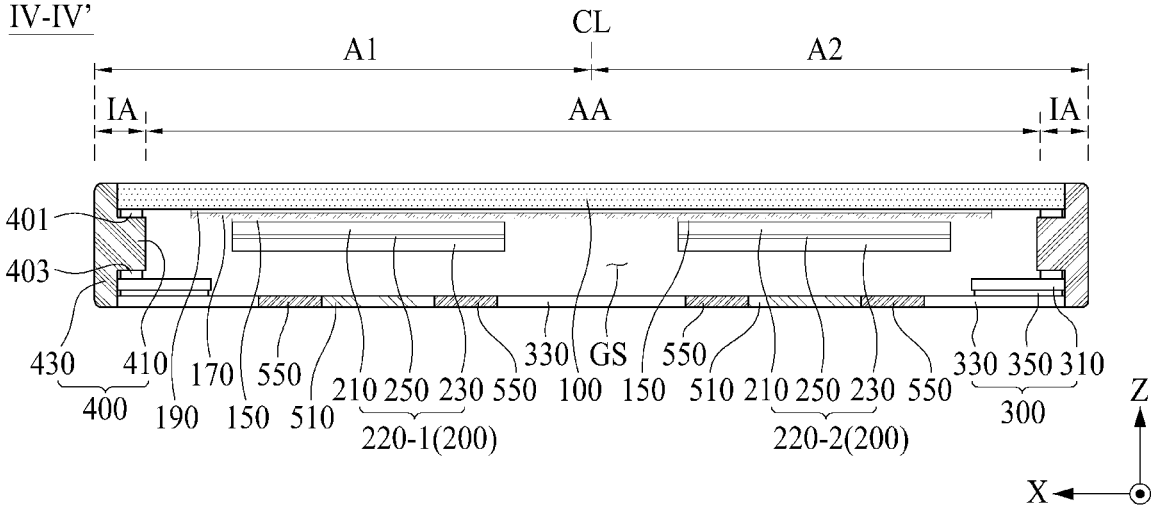
FIG. 16 is another cross-sectional view taken along line IV-IV' illustrated in FIG. 12B.

FIG. 15 is another cross-sectional view taken along line IV-IV' illustrated in FIG. 12B. FIG. 16 is another cross-sectional view taken along line IV-IV' illustrated in FIG. 12B. FIG. 16 illustrates an aspect where a plate is further configured in the apparatus illustrated in FIG. 15.

With reference to FIGS. 15 and 16, the vibration apparatus 200 according to another aspect of the present disclosure may include a first vibration apparatus 210-1 and a second vibration apparatus 210-2 disposed at the rear surface of the display panel 100. Each of the first vibration apparatus 210-1 and the second vibration apparatus 210-2 may include one or more of the vibration apparatus 200 described above with reference to FIGS. 7 to 11. Each of the display panel 100 and the vibration apparatus 200 may be substantially the same as each of the display panel 100 and the vibration apparatus 200 described above with reference to FIGS. 7 to 11, and thus, their repetitive descriptions may be omitted or will be briefly given. A description of a hole 301 may be substantially the same as descriptions given above with reference to FIGS. 1 and 2, and thus, its description is omitted or will be briefly given. A description of a plate 170 may be substantially the same as descriptions given above with reference to FIG. 14, and thus, its description is omitted or will be briefly given.

The vibration apparatus 200 according to an aspect of the present disclosure may include a plurality of vibration generators 210 and 230 which have the first size and overlap with or stack with each other, thereby minimizing a reduction in the displacement amount of the display panel 100 caused by the thickness of the plate 170. Also, the vibration apparatus 200 according to an aspect of the present disclosure may include the plurality of vibration generators 210 and 230 which have the first size and overlap with, and thus, the displacement amount of the display panel 100 may be increased or maximized, thereby increasing or enhancing a sound pressure level characteristic and a low-pitched sound band characteristic of a sound generated based on the displacement of the display panel 100. Accordingly, in the apparatus according to another aspect of the present disclosure, the vibration apparatus 200 may increase or maximize the displacement amount of the display panel 100 with the plate 170 disposed therein, based on a stack structure of the vibration generators 210 and 230 which overlap with or stack with each other. The plate 170 may have a thickness which enables heat of the display panel 100 to be smoothly dissipated.

The plate 170 according to an aspect of the present disclosure may be connected or coupled to a front surface of the vibration apparatus 200 by the connection member 150 described above. For example, the plate 170 may be connected or coupled to an uppermost vibration generator of the plurality of vibration generators 210 and 230 of the vibration apparatus 200 by the connection member 150. For example, when the vibration apparatus 200 include first and second vibration generators 210 and 230, the plate 170 may be connected or coupled to a first surface of the second vibration generator 230 or a second surface of the first vibration generator 210 by the connection member 150.

Accordingly, in the apparatus according to another aspect of the present disclosure, as described above with reference to FIGS. 7 to 11, a sound pressure level characteristic and a low-pitched sound band characteristic of a sound generated based on the displacement of the display panel 100 may be increased or enhanced based on a stack structure of the vibration generators 210 and 230. Also, in the apparatus according to another aspect of the present disclosure, a resonance frequency of the vibration apparatus 200 may be reduced by the plate 170, and heat of the display panel 100 may be dissipated through the plate 170. Moreover, according to aspects of the present disclosure, a hole 301 may be provided at the supporting member 300, thereby providing an apparatus having an enhanced a sound characteristic and/or a sound pressure level characteristic of the low-pitched sound band.

Figure 17:
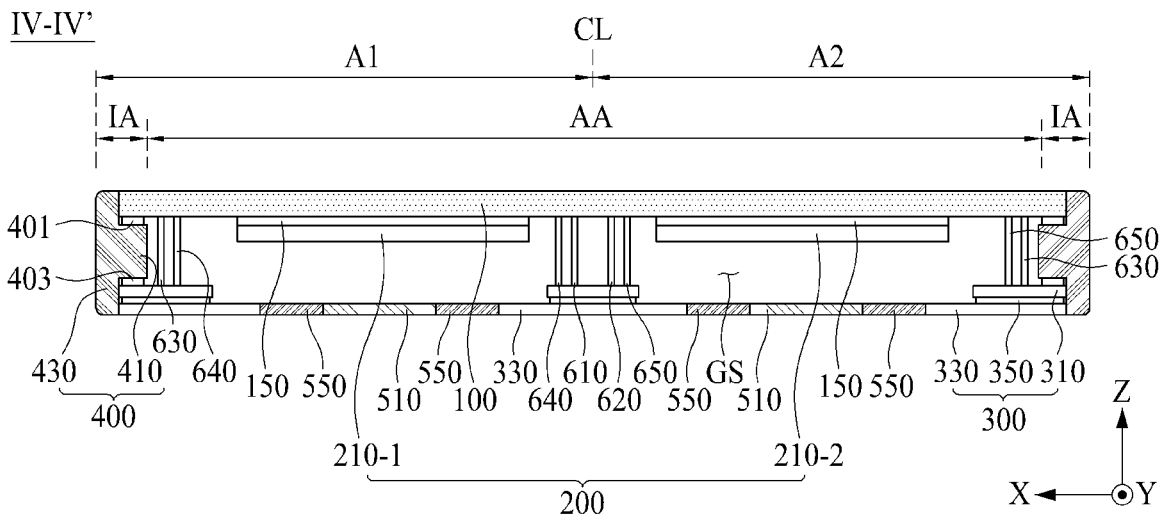
FIG. 17 illustrates an apparatus according to another aspect of the present disclosure.

FIG. 17 illustrates an apparatus according to another aspect of the present disclosure. FIG. 17 illustrates an aspect where a partition is further configured in the apparatus illustrated in FIGS. 13 and 14. Hereinafter, therefore, repetitive descriptions of elements other than the partition and elements relevant thereto are omitted or will be briefly given. A description of a partition may be identically applied to the apparatus of FIGS. 15 and 16.

With reference to FIG. 17, the apparatus according to another aspect of the present disclosure may further include a partition disposed between the rear surface of the display panel 100 and the supporting member 300.

The partition according to an aspect of the present disclosure may include a first partition member 610 and a second partition member 620 disposed between the first vibration apparatus 210-1 and the second vibration apparatus 210-2.

According to an aspect of the present disclosure, the third partition member 630 may be disposed to surround all of the first and second vibration apparatuses 210-1 and 210-2. The fourth partition member (or a first enclosure) 640 may surround the first vibration apparatus 210-1. The fifth partition member (or a second enclosure) 650 may surround the second vibration apparatus 210-2. The partition will be described below with reference to FIG. 19.

According to an aspect of the present disclosure, the first member 510 and the second member 550 may overlap with each of the first vibration apparatus 210-1 and the second vibration apparatus 210-2. For example, the first member 510 and the second member 550 may be disposed inside one or more of the third partition member 630 and the fourth partition member 640. For example, the first member 510 and the second member 550 may be disposed inside one or more of the third partition member 630 and the fifth partition member 650. For example, the first member 510 and the second member 550 may not be disposed in an area where the vibrating apparatus 200 is not disposed.

According to an aspect of the present disclosure, the fourth partition member 640 and the fifth partition member 650 may be disposed between the rear surface of the display panel 100 and the first supporting member 310. The first supporting member 310 may facilitate adhesion of the fourth partition member 640 and the fifth partition member 650 disposed at the display panel 100. As another aspect of the present disclosure, the first supporting member 310 may be omitted.

According to an aspect of the present disclosure, the first partition member 610 may be disposed between the first vibration apparatus 210-1 and the second vibration apparatus 210-2. For example, the second partition member 620 may be disposed between the first vibration apparatus 210-1 and the second vibration apparatus 210-2. The first partition member 610 and the second partition member 620 may be disposed between the rear surface of the display panel 100 and the first supporting member 310. The first supporting member 310 may facilitate adhesion of the first partition member 610 and the second partition member 620 disposed at the display panel 100. As another aspect of the present disclosure, the first supporting member 310 may be omitted.

Figure 18A:
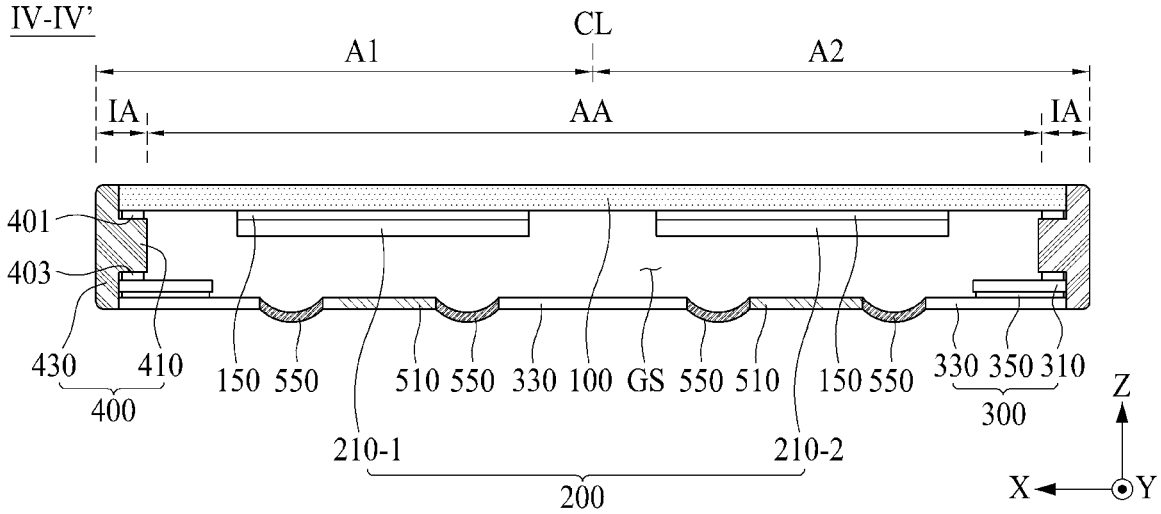
FIG. 18A to 18C illustrate an apparatus according to another aspect of the present disclosure.
Figure 18B:
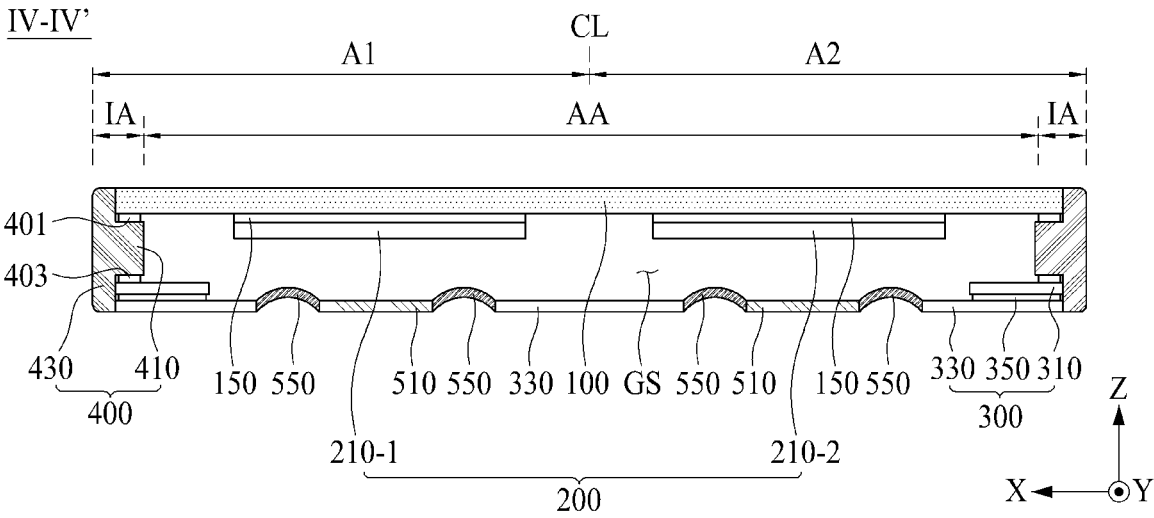
Figure 18C:
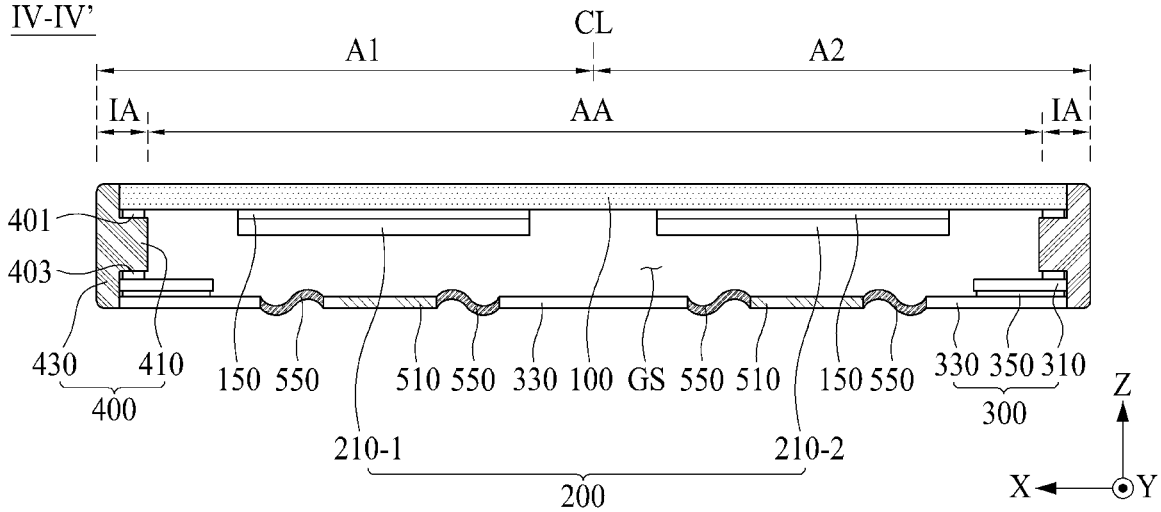

FIGS. 18A to 18C illustrate an apparatus according to another aspect of the present disclosure. FIGS. 18A to 18C are cross-sectional views taken along line Iv-IV illustrated in FIG. 12B. Descriptions of FIGS. 18A to 18C may be applied to the apparatuses of FIGS. 15 and 16.

With reference to FIG. 18A, the second member 550 may have a concave shape. For example, the second member 550 may have a downward-concave roll shape. For example, the second member 550 may have a concave shape which is concave toward a rear surface of a supporting member 300. For example, the second member 550 may have a normal roll shape, or may have a downward-concave roll shape. In this case, the second member 550 may have an inverse roll shape.

With reference to FIG. 18B, the second member 550 may have a convex shape. For example, the second member 550 may have an upward-convex roll shape. For example, the second member 550 may have a convex shape which is convex toward a front surface of the display panel 100. For example, the second member 550 may have an inverse roll shape, or may have an upward-convex roll shape. In this case, the second member 550 may have a normal roll shape.

With reference to FIG. 18C, the second member 550 may have an S-shape. For example, the second member 550 may have an S-shaped roll shape. For example, the second member 550 may have an S-shaped roll shape where a plurality of concave shapes and convex shapes are connected to one another. For example, the second member 550 may have a wrinkle shape (or a wave shape) where a plurality of concave shapes and convex shapes are connected to one another.

According to an aspect of the present disclosure, because the second member 550 is provided, a restoring force may be provided when the first member 510 is vibrating, and a sound of the low-pitched sound band may be stably reproduced based on a weight of the first member 510 and a restoring force of the second member 550.

Figure 19:
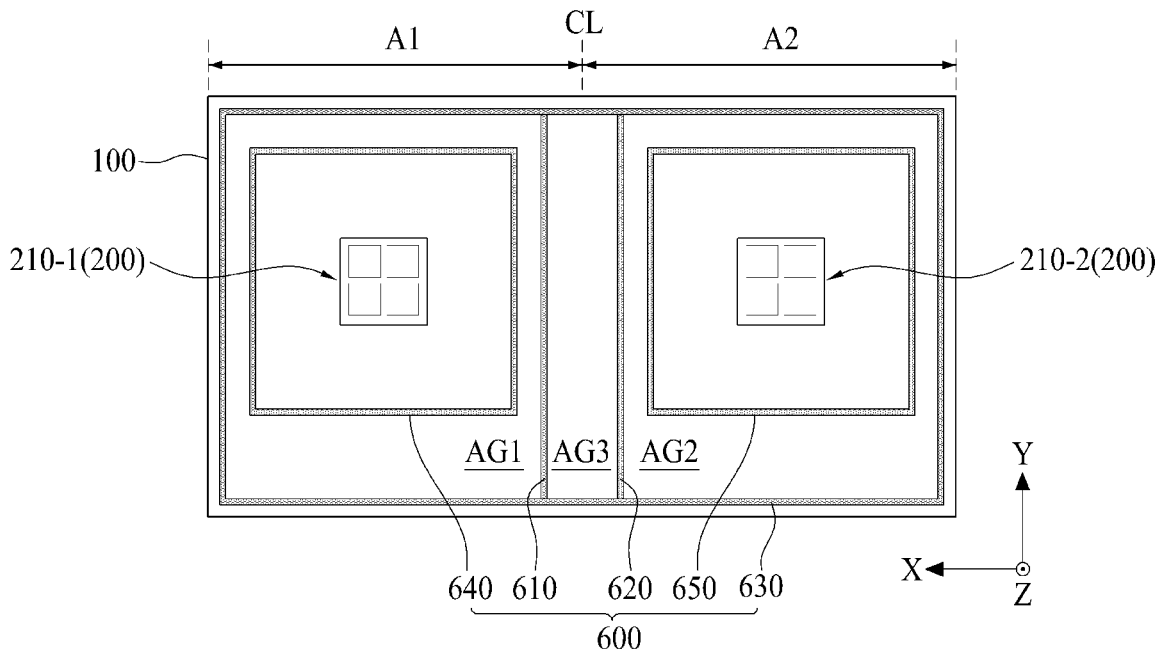
FIG. 19 illustrates an apparatus according to another aspect of the present disclosure.

FIG. 19 illustrates an apparatus according to another aspect of the present disclosure. FIG. 19 illustrates an aspect where a partition is further configured in the apparatus illustrated in FIGS. 2 to 5, 6, 13 and 14. Hereinafter, therefore, repetitive descriptions of elements other than the partition and elements relevant thereto are omitted or will be briefly given. A description of a partition may be identically applied to the apparatus of FIGS. 8 to 11, 15 and 16.

With reference to FIGS. 13, 14, and 19, the apparatus according to another aspect of the present disclosure may further include a partition 600 for dividing the first and second regions A1 and A2 of the display panel 100.

The partition 600 may be an air gap or a space, where first and second vibration sounds PVS1 and PVS2 are generated when the display panel 100 is vibrated by the first and second vibration apparatuses 210-1 and 210-2. For example, a partition 600 may separate the first and second vibration sounds PVS1 and PVS2 or a channel and may prevent or decrease the reduction of a sound characteristic caused by interference of the first and second vibration sounds PVS1 and PVS2. The partition 600 may be referred to as a sound blocking member, a sound separation member, a space separation member, an enclosure, or a baffle, or the like, but aspects of the present disclosure are not limited thereto.

The partition 600 according to an aspect of the present disclosure may include a first partition member 610 and a second partition member 620 disposed between the first vibration apparatus 210-1 and the second vibration apparatus 210-2.

The first partition member 610 and the second partition member 620 may be disposed between the display panel 100 and a supporting member 300. The first partition member 610 and the second partition member 620 may be disposed between the display panel 100 and a second supporting member 330. For example, the first partition member 610 and the second partition member 620 may be disposed between the display panel 100 and a supporting member 300 corresponding to a center region of the display panel 100. The first partition member 610 and the second partition member 620 may separate a second vibration sound PVS2 generated by the first vibration apparatus 210-1 and a first vibration sound PVS1 generated by the second vibration apparatus 210-2. For example, the first partition member 610 and the second partition member 620 may block the transfer of a vibration, generated by the first vibration apparatus 210-1 in the first region A1 of the display panel 100, to the second region A2 of the display panel 100, or may block the transfer of a vibration, generated by the second vibration apparatus 210-2 in the second region A2 of the display panel 100, to the first region A1 of the display panel 100. Therefore, the first partition member 610 and the second partition member 620 may attenuate or absorb a vibration of the display panel 100 at a center of the display panel 100, and thus, the first and second partition members 610 and 620 may block the transfer of a sound of the first region A1 to the second region A2, or may block the transfer of a sound of the second region A2 to the first region A1. Accordingly, the first partition member 610 and the second partition member 620 may separate a left sound and a right sound to further enhance a sound output characteristic of the apparatus. Thus, the apparatus according to an aspect of the present disclosure may output a sound including a sound of a two-channel type to a forward region in front of the display panel 100 by separating the left and right sounds according to the first partition member 610 and the second partition member 620.

For example, the partition 600 may include a material having elasticity which enables a certain degree of compression. For example, the partition 600 may be configured with polyurethane or polyolefin, but aspects of the present disclosure are not limited thereto. As another aspect of the present disclosure, the partition 600 may be configured with a single-sided tape, a single-sided foam pad, a double-sided tape, a double-sided foam tape, or the like, but aspects of the present disclosure are not limited thereto.

For example, any one of the first partition member 610 and the second partition member 620 may be omitted. For example, even when any one of the first partition member 610 and the second partition member 620 is between the first vibration apparatus 210-1 and the second vibration apparatus 210-2, a left sound and a right sound may be separated from each other. For example, when the second partition member 620 of the first partition member 610 and the second partition member 620 is omitted, the first partition member 610 may be disposed between the display panel 100 and the supporting member 300 to correspond to a rear center line CL of the display panel 100.

Therefore, the first partition member 610 and the second partition member 620 may separate a left sound and a right sound to further enhance a sound output characteristic of the apparatus. An apparatus including the first partition member 610 or the second partition member 620 may separate the left and right sounds by the first partition member 610 or the second partition member 620 to output a sound including a sound of a two-channel type to the forward region in front of the display panel 100.

The partition 600 according to an aspect of the present aspect may further include a third partition member 630 between the display panel 100 and the supporting member 300.

The third partition member 630 may be disposed to surround all of the first and second vibration apparatuses 210-1 and 210-2. The third partition member 630 may be disposed between a rear periphery of the display panel 100 and a front periphery of the supporting member 300. The third partition member 630 may be referred to as an edge partition, a sound blocking member, an edge enclosure, an edge baffle, or the like, but aspects of the present disclosure are not limited thereto. For example, the third partition member 630 may be adjacent to or in contact with the first connection member 401 illustrated in FIGS. 13 to 17, and may be surrounded by the first connection member 401. As another aspect of the present disclosure, the third partition member 630 may be integrated as one body with the first connection member 401.

The third partition member 630 may provide first to third air gaps AG1 to AG3 between the display panel 100 and the supporting member 300 together with the first and second partition members 610 and 620. For example, each of the first to third air gaps AG1 to AG3 may be referred to as a vibration space, a sound pressure space, a sound box, a sound part, a resonance box, or a resonance part, but aspects of the present disclosure are not limited thereto.

The first air gap AG1 may be provided in the first region A1 of the display panel 100. For example, the first air gap AG1 may be provided in the first region A1 of the display panel 100 which is surrounded by the first partition member 610 and the third partition member 630 disposed at the first region A1 of the display panel 100.

The second air gap AG2 may be provided in the second region A2 of the display panel 100. For example, the second air gap AG2 may be provided in the second region A2 of the display panel 100 which is surrounded by the second partition member 620 and the third partition member 630 disposed at the second region A2 of the display panel 100.

The third air gap AG3 may be provided in a rear center region of the display panel 100. For example, the third air gap AG3 may be provided in a rear center region of the display panel 100 surrounded by the first and second partition members 610 and 620 and the third partition member 630. For example, the third air gap AG3 may be provided between the second air gap AG2 and the first air gap AG1, including the rear center line CL of the display panel 100. The third air gap AG3 may be referred to as a sound separation space, a sound blocking space, a sound interference prevention space, or the like, but aspects of the present disclosure are not limited thereto. The third air gap AG3 may separate the first air gap AG1 from the second air gap AG2, and thus, the third air gap AG3 may reduce or prevent a resonance phenomenon or an interference phenomenon in a certain frequency band generated in each of the first air gap AG1 and the second air gap AG2.

The first vibration apparatus 210-1 may be surrounded by the third partition member 630 and the first partition member 610 providing the first air gap AG1. The second vibration apparatus 210-2 may be surrounded by the third partition member 630 and the second partition member 620 providing the second air gap AG2.

When one of the first and second partition members 610 and 620 is omitted, the third air gap AG3 may be omitted.

Therefore, the third partition member 630 may surround an area between the display panel 100 and the supporting member 300, and may individually surround each of the first and second vibration apparatuses 210-1 and 210-2, together with the first and second partition members 610 and 620, to secure a vibration space of each of the first and second vibration apparatuses 210-1 and 210-2. Thus, the third partition member 630 may enhance a sound pressure lever characteristic of left and right sounds. Further, the third partition member 630 may prevent sound or a sound pressure lever from being leaked to the outside through the side surface between the display panel 100 and the supporting member 300, thereby further enhancing a sound output characteristic of the apparatus.

The partition 600 according to an aspect of the present aspect may further include a fourth partition member 640 and a fifth partition member 650. The fourth partition member (or a first enclosure) 640 may surround the first vibration apparatus 210-1. The fifth partition member (or a second enclosure) 650 may surround the second vibration apparatus 210-2.

The fourth partition member 640 may be disposed between the display panel 100 and the supporting member 300 to correspond to the first air gap AG1. For example, the fourth partition member 640 may individually (or independently) surround the first vibration apparatus 210-1. The fourth partition member 640 according to an aspect of the present disclosure may have a rectangular shape surrounding the first vibration apparatus 210-1, but aspects of the present disclosure are not limited thereto. For example, the fourth partition member 640 may have a shape that is the same as or different from a whole shape of the first vibration apparatus 210-1. For example, when the first vibration apparatus 210-1 has a square shape, the fourth partition member 640 may have a square shape, a circular shape or an oval shape having a size relatively larger than the first vibration apparatus 210-1.

The fourth partition member 640 may limit (or define) a vibration region (or a vibration area) of the display panel 100 based on the first vibration apparatus 210-1. For example, in the first region A1 of the display panel 100, as a size of the fourth partition member 640 increases, a vibration region of the first region A1 may increase. Thus, a low-pitched sound band characteristic of a left sound may be enhanced. As another aspect of the present disclosure, in the first region A1 of the display panel 100, as a size of the fourth partition member 640 decreases, the vibration region of the first region A1 may decrease. Thus, a high-pitched sound band characteristic of the left sound may be enhanced. Accordingly, a size of the fourth partition member 640 may be adjusted based on a desired characteristic of a sound band, based on a vibration of the display panel 100 due to the vibration of the first vibration apparatus 210-1.

The fifth partition member 650 may be disposed between the display panel 100 and the supporting member 300 to correspond to the second air gap AG2. The fifth partition member 650 may individually (or independently) surround the second vibration apparatus 210-2. For a left sound to be symmetrical with a right sound, the fifth partition member 650 according to an aspect of the present disclosure may have the same shape as the fourth partition member 640 and may have a symmetrical structure with the fourth partition member 640 with respect to the rear center line CL of the display panel 100.

The fifth partition member 650 may limit (or define) a vibration region (or a vibration area) of the display panel 100 based on the second vibration apparatus 210-2. For example, in the second region A2 of the display panel 100, as a size of the fifth partition member 650 increases, a vibration region of the second region A2 may increase. Thus, the low-pitched sound band characteristic of the right sound may be enhanced. As another aspect of the present disclosure, in the second region A2 of the display panel 100, as a size of the fifth partition member 650 decreases, the vibration region of the second region A2 may decrease. Thus, the high-pitched sound band characteristic of the right sound may be enhanced. Accordingly, a size of the fifth partition member 650 may be adjusted based on a desired characteristic of a sound band, based on a vibration of the display panel 100 due to the vibration of the second vibration apparatus 210-2.

The fourth and fifth partition members 640 and 650 may limit a vibration region (or a vibration area) of each of the first and second vibration apparatuses 210-1 and 210-2. Thus, the fourth and fifth partition members 640 and 650 may enhance a left-right symmetricity of a left sound and a right sound each generated based on a vibration of the display panel 100, and may optimize a sound pressure level characteristic and a sound reproduction band of each of the left and right sounds. For example, when the fourth and fifth partition members 640 and 650 are provided, the third partition member 630 may be omitted. As another aspect of the present disclosure, when the fourth and fifth partition members 640 and 650 are provided, one or more of the first to third partition members 610 to 630 may be omitted.

Therefore, the apparatus according to another aspect of the present disclosure includes the partition 600, and thus, the sound pressure level characteristic and the sound reproduction band of each of the left and right sounds may be optimized. For example, the apparatus according to another aspect of the present disclosure may include at least one or more of the first and second partition members 610 and 620. For example, the apparatus according to another aspect of the present disclosure may include the third partition member 630 and at least one or more of the first and second partition members 610 and 620. For example, the apparatus according to another aspect of the present disclosure may include the third partition member 630, the fourth partition member 640 and the fifth partition member 650. For example, the apparatus according to another aspect of the present disclosure may include all of the first to fifth partition members 610 to 650.

Accordingly, the apparatus according to another aspect of the present disclosure may output, through the first vibration apparatus 210-1 and the second vibration apparatus 210-2, a first vibration sound (or a right sound) PVS1 and a second vibration sound (or a left sound) PVS2 to a forward region in front of the display panel 100 to provide a sound to a user. The apparatus according to another aspect of the present disclosure may output a sound including a sound of a two-channel type to the forward region in front of the display panel 100 by separating the first and second vibration sounds PVS1 and PVS2 according to the partition 600. Moreover, in the apparatus according to another aspect of the present disclosure, the flatness of a sound characteristic may be improved due to decrease of a resonance frequency caused by a plate implemented in each of the first and second vibration apparatuses 210-1 and 210-2.

Figure 20:
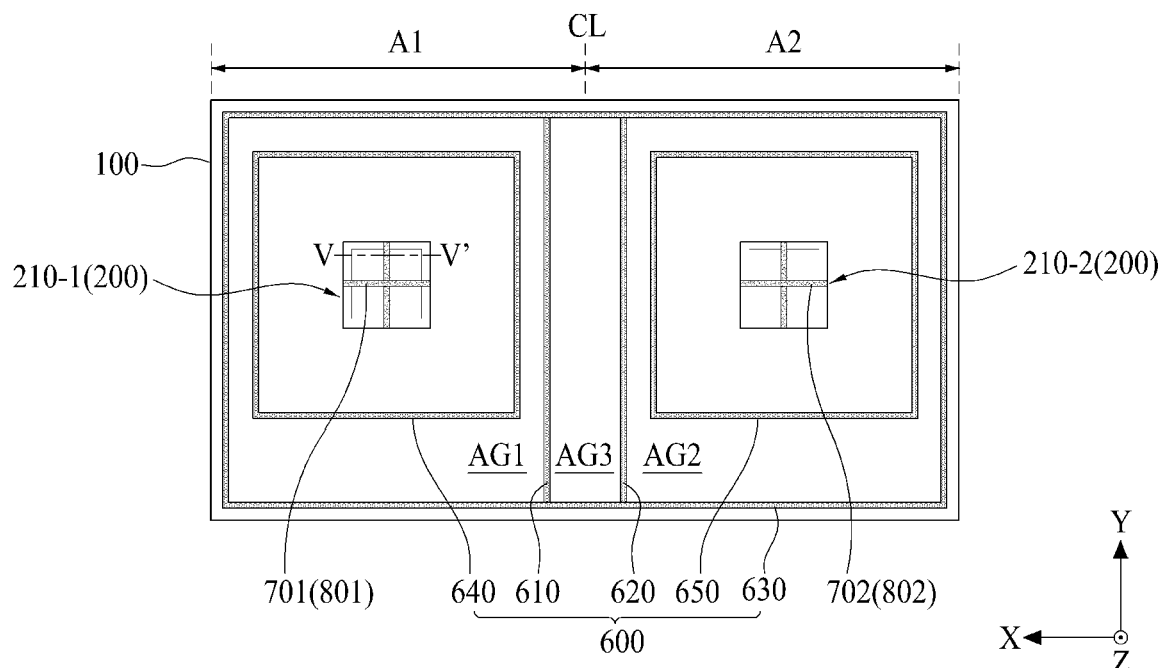
FIG. 20 illustrates an apparatus according to another aspect of the present disclosure.
Figure 21A:
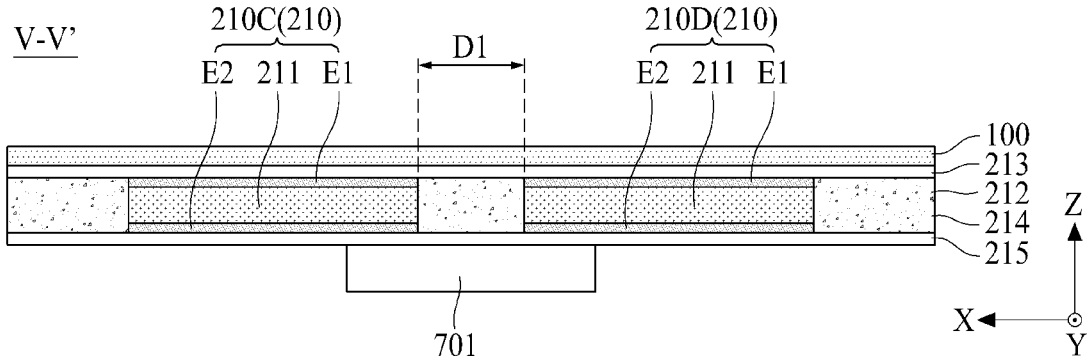
FIG. 21A is a cross-sectional view taken along line V-V' illustrated in FIG. 20.
Figure 21B:
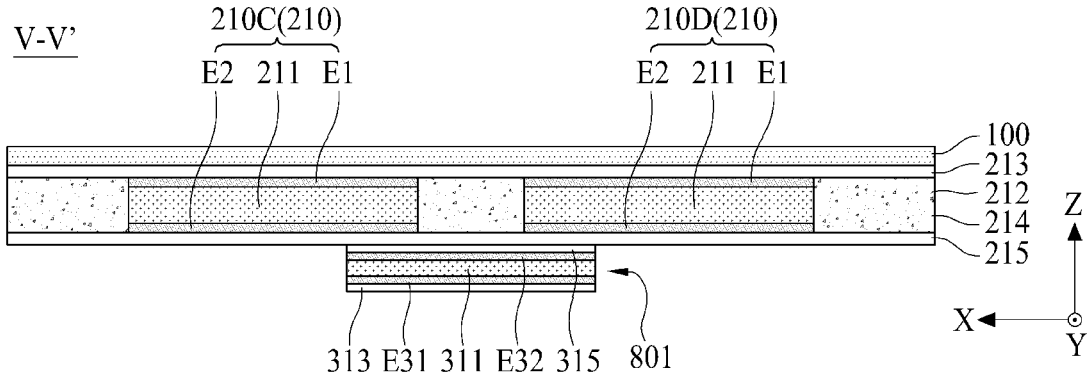
FIG. 21B is another cross-sectional view taken along line V-V' illustrated in FIG. 20.

FIG. 20 illustrates an apparatus according to another aspect of the present disclosure. FIG. 21A is a cross-sectional view taken along line V-V' illustrated in FIG. 20. FIG. 21B is another cross-sectional view taken along line V-V' illustrated in FIG. 20. FIG. 20 illustrates an aspect implemented by modifying a pad member in the apparatus illustrated in FIG. 19. For example, FIG. 20 illustrates an aspect implemented by modifying a pad member in the apparatus illustrated in FIGS. 3-5, 7, 13, and 14. Therefore, in the following description, repeated descriptions of elements other than a pad member and elements relevant thereto are omitted or will be briefly given.

With reference to FIGS. 20, 21A and 21B, a vibration apparatus according to an aspect of the present disclosure may include a first vibration apparatus 210-1 and a second vibration apparatus 210-2. In a case where the first vibration apparatus 210-1 and the second vibration apparatus 210-2 include a plurality of vibration structures, a sound pressure level may be reduced in a specific frequency. For example, a sound pressure level may be reduced in a middle-pitched sound band. Resonance or inverse resonance may occur in a boundary between a plurality of vibration structures, and thus, a sound pressure level may be reduced. For example, resonance or inverse resonance may occur in a center portion between a plurality of vibration structures, and thus, a sound pressure level may be reduced. Therefore, in order to decrease a reduction in a sound pressure level caused by resonance or inverse resonance, an interval between the plurality of vibration structures may decrease. However, due to difficulty in a process of placing the plurality of vibration structures, it may be difficult to reduce an interval between the plurality of vibration structures. In order to decrease a reduction in a sound pressure level, a pad member may be disposed at the boundary between the plurality of vibration structures.

The vibration apparatus 200 according to another aspect of the present disclosure may include a pad member disposed at the boundary between the plurality of vibration structures in order to improve the deterioration or dip phenomenon of sound quality occurring in a boundary region between the plurality of vibration structures. For example, the pad member may prevent or reduce a resonance frequency in a boundary portion between the plurality of vibration structures. The pad member may be configured to decrease a reduction in a sound pressure level occurring in between the plurality of vibration structures.

With reference to FIGS. 20 and 21A, the pad member may be disposed between two or more vibration structures. For example, a first pad member 701 may be disposed between a plurality of vibration structures of the first vibration apparatus 210-1. For example, a region between the plurality of vibration structures in the first vibration apparatus 210-1 may overlap with the first pad member 701. A second pad member 702 may be disposed between a plurality of vibration structures in the second vibration apparatus 210-2. For example, a region between the plurality of vibration structures in the second vibration apparatus 210-2 may overlap with the second pad member 702. The first pad member 701 and the second pad member 702 may be a resonance control pad, an external resonance pad, a gap pad, or a resonance controller, but aspects of the present disclosure are not limited thereto.

The first pad member 701 may be disposed between the first vibration apparatus 210-1 and the supporting member 300. For example, the first pad member 701 may have a "+"-shape which overlap with a region between the plurality of vibration structures of the first vibration apparatus 210-1. The second pad member 702 may be disposed between the second vibration apparatus 210-2 and the supporting member 300. For example, the second pad member 702 may have a "+"-shape which overlap with a region between the plurality of vibration structures of the second vibration apparatus 210-2.

With reference to FIG. 21A, the first pad member 701 may be disposed between a third vibration structure 210C and a fourth vibration structure 210D of the first vibration apparatus 210-1. For example, the first pad member 701 may be disposed between the first vibration apparatus 210-1 and the supporting member 300. For example, the first pad member 701 may be disposed between a rear surface of the first vibration apparatus 210-1 and an upper surface of the supporting member 300. A size of each of the first pad member 701 and the second pad member 702 may be configured to be equal to or different from a region between a plurality of vibration structures. For example, a width of each of the first pad member 701 and the second pad member 702 may be the same as or different from each of the third vibration structure 210C and the fourth vibration structure 210D with respect to a first direction X.

According to an aspect of the present disclosure, each of the plurality of vibration structures may include a vibration portion 211, a first electrode layer E1 disposed at a first surface of the vibration portion 211, and a second electrode layer E2 disposed at a second surface different from the first surface of the vibration portion 211. Each of the plurality of vibration structures may further include a first protection member 213 over a first surface of the first electrode layer E1 and a second protection member 215 over a second surface different from the first surface of the first electrode layer E1.

According to an aspect of the present disclosure, each of the plurality of vibration structures may include the vibration portion 211, the first protection member 213 over the first surface of the vibration portion 211, and the second protection member 215 over the second surface different from the first surface of the vibration portion 211. Each of the plurality of vibration structures may further include the first electrode layer E1 between the vibration portion 211 and the first protection member 213 and the second electrode layer E2 between the vibration portion 211 and the second protection member 215. For example, the first protection member 213 and the second protection member 215 of the vibration apparatus may cover the plurality of vibration structures in common. For example, the first protection member 213 and the second protection member 215 of the vibration apparatus may be disposed to surround the plurality of vibration structures.

In each of the third vibration structure 210C and the fourth vibration structure 210D of the first vibration apparatus 210-1, the first electrode layer E1 may be disposed closer to the display panel 100 than the second electrode layer E2. For example, the first electrode layer E1 may be a negative (−) electrode, and the second electrode layer E2 may be a positive (+) electrode. However, aspects of the present disclosure are not limited thereto, and the first electrode layer E1 may be a positive (+) electrode and the second electrode layer E2 may be a negative (−) electrode.

The first pad member 701 and the second pad member 702 may be configured with a material which absorbs or adjusts a vibration. For example, the first pad member 701 and the second pad member 702 may be configured with one of a silicone-based polymer, paraffin wax, and an acrylic polymer, but aspects of the present disclosure are not limited thereto. For example, each of the first pad member 701 and the second pad member 702 may be configured with a material which differs from a partition 600, but aspects of the present disclosure are not limited thereto.

The first pad member 701 may decrease heat caused by a vibration of the first vibration apparatus 210-1. The second pad member 702 may decrease heat caused by a vibration of the second vibration apparatus 210-2. Therefore, because a pad member is provided between a plurality of vibration structures, a reduction in a sound pressure level in a specific frequency occurring between the plurality of vibration structures may decrease, and a heat dissipation effect of reducing heat caused by vibrations of the plurality of vibration structures may be enhanced. As another aspect of the present disclosure, a heat dissipation member may be further provided between the display panel 100 and the vibration apparatus 200. For example, the heat dissipation member may be disposed at the rear surface of the display panel 100.

With reference to FIG. 21B, the pad member may be disposed between two or more vibration structures. For example, a first pad member 801 may be disposed between a third vibration structure 210C and a fourth vibration structure 210D of the first vibration apparatus 210-1. For example, the first pad member 801 may be disposed between the vibration generator 210 and the supporting member 300. For example, the first pad member 801 may be disposed between a rear surface of the first vibration apparatus 210-1 and an upper surface of the supporting member 300.

A size of each of the first pad member 801 and the second pad member may be configured to be equal to or different from a region between a plurality of vibration structures. For example, a width of each of the first pad member 801 and the second pad member may be the same as or different from each of the third vibration structure 210C and the fourth vibration structure 210D with respect to the first direction X.

According to an aspect of the present disclosure, two or more or the plurality of vibration structures may each include a vibration portion 211, a first electrode layer E1 disposed at the first surface of the vibration portion 211, and a second electrode layer E2 disposed at the second surface different from the first surface of the vibration portion 211. For example, like the vibration portion 211 described above with reference to FIG. 4 or the vibration portion 211a described above with reference to FIGS. 6A to 6F, the vibration portion 211 may include a first portion 211*a* and a second portion 211*b*. For example, as illustrated in FIG. 11, the second portion 211*b* or 221*a*2 may be disposed more outward than the first portion 211*a* or 221*a*1, but aspects of the present disclosure are not limited thereto. Each of the plurality of vibration structures may further include a first protection member 213 on the first surface of the first electrode layer E1 and a second protection member 215 on the second surface different from the first surface of the first electrode layer E1.

According to an aspect of the present disclosure, each of the plurality of vibration structures may include the vibration portion 211, the first protection member 213 over the first surface of the vibration portion 211, and the second protection member 215 over the second surface different from the first surface of the vibration portion 211. Each of the plurality of vibration structures may further include the first electrode layer E1 between the vibration portion 211 and the first protection member 213 and the second electrode layer E2 between the vibration portion 211 and the second protection member 215. For example, the first protection member 213 and the second protection member 215 of the vibration apparatus may cover the plurality of vibration structures in common. For example, the first protection member 213 and the second protection member 215 of the vibration apparatus may be disposed to surround the plurality of vibration structures.

One or more of the first pad member 801 and the second pad member may be configured to be equal to the first vibration apparatus 210-1. For example, in a case where one or more of the first pad member 801 and the second pad member are configured to be equal to the first vibration apparatus 210-1, a level of a signal applied to the first pad member 801 and the second pad member may be adjusted, and thus, a resonance of the vibration apparatus may be easily adjusted.

According to an aspect of the present disclosure, the first pad member 801 may include a vibration layer 311, a first electrode layer E31, and a second electrode layer E32. For example, the first pad member 801 may further include the vibration layer 311, the first electrode layer E31 disposed at a first surface of the vibration layer 311, and the second electrode layer E32 disposed at a second surface different from the first surface of the vibration layer 311. For example, the first pad member 801 may further include a vibration layer 311, a first protection member 313, and a second protection member 315. For example, the first pad member 801 may further include the vibration layer 311, the first protection member 313 disposed at a first surface of the vibration layer 311, and the second protection member 315 disposed at a second surface different from the first surface of the vibration layer 311. For example, like the vibration portion 211 described above with reference to FIG. 5 or the vibration portion 211 described above with reference to FIGS. 6A to 6F, the vibration layer 311 may include a first portion 211*a* and a second portion 211*b*. The first protection member 313 may be disposed between the vibration layer 311 and the first electrode layer E31. For example, the first protection member 313 may be disposed under the first electrode layer E31. For example, the first protection member 313 may protect the first electrode layer E31. The second protection member 315 may be disposed between the vibration layer 311 and the second electrode layer E32. For example, the second protection member 315 may be disposed over the second electrode layer E32. For example, the second protection member 315 may protect the second electrode layer E32. The first protection member 313 and the second protection member 315 may be substantially the same as the first protection member 213 or 1213 and the second protection member 215 or 1215 described above with reference to FIGS. 4, 5, and 8 to 10, and thus, their descriptions are omitted.

According to an aspect of the present disclosure, the first electrode layer E1 of each of the third vibration structure 210C and the fourth vibration structure 210D of the first vibration apparatus 210-1 may be disposed closer to the display panel 100 than the second electrode layer E2. For example, the first electrode layer E1 may be a negative (−) electrode, and the second electrode layer E2 may be a positive (+) electrode. However, aspects of the present disclosure are not limited thereto, and the first electrode layer E1 may be a positive (+) electrode and the second electrode layer E2 may be a negative (−) electrode. The second electrode layer E32 of the first pad member 801 may be disposed closer to the display panel 100 than the first electrode layer E31. For example, the first electrode layer E31 may be a negative (−) electrode, and the second electrode layer E32 may be a positive (+) electrode. However, aspects of the present disclosure are not limited thereto, and the first electrode layer E31 may be a positive (+) electrode and the second electrode layer E32 may be a negative (−) electrode. Polarities of the first electrode layer E1 and the second electrode layer E2 of the first vibration apparatus 210-1 may be configured to be opposite to those of the first electrode layer E31 and the second electrode layer E32 of the first pad member 801. For example, with respect to the display panel 100, a polarity of the first electrode layer E1 of each of the plurality of vibration structures may differ from the second electrode layer E32 of the pad member. For example, with respect to the display panel 100, the first electrode layer E1 and the second electrode layer E2 of the first vibration apparatus 210-1 may be configured with a negative (−) electrode and a positive (+) electrode, and the second electrode layer E32 and the first electrode layer E31 of the first pad member 801 may be configured with a positive (+) electrode and a negative (−) electrode. As another aspect of the present disclosure, with respect to the display panel 100, the first electrode layer E1 and the second electrode layer E2 of the first vibration apparatus 210-1 may be configured with a positive (+) electrode and a negative (−) electrode, and the second electrode layer E32 and the first electrode layer E31 of the first pad member 801 may be configured with a negative (−) electrode and a positive (+) electrode. Therefore, because the electrode layer of the first pad member 801 is disposed as an electrode layer having a polarity opposite to a polarity of the first vibration apparatus 210-1, a dip phenomenon caused by resonance between a plurality of vibration structures may be offset based on inverse resonance caused by the first pad member 801. Accordingly, because a pad member is provided between a plurality of vibration structures, a reduction in a sound pressure level occurring in the boundary between the plurality of vibration structures may decrease.

Figure 22A:
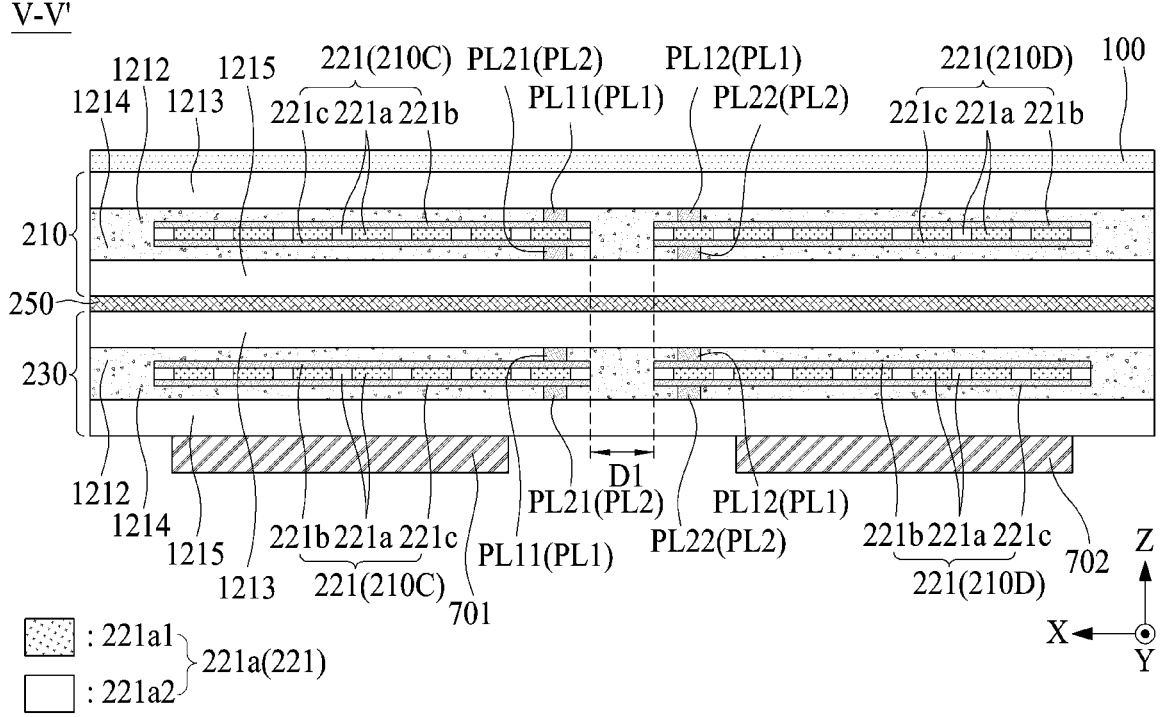
FIG. 22A is another cross-sectional view taken along line V-V' illustrated in FIG. 20.
Figure 22B:
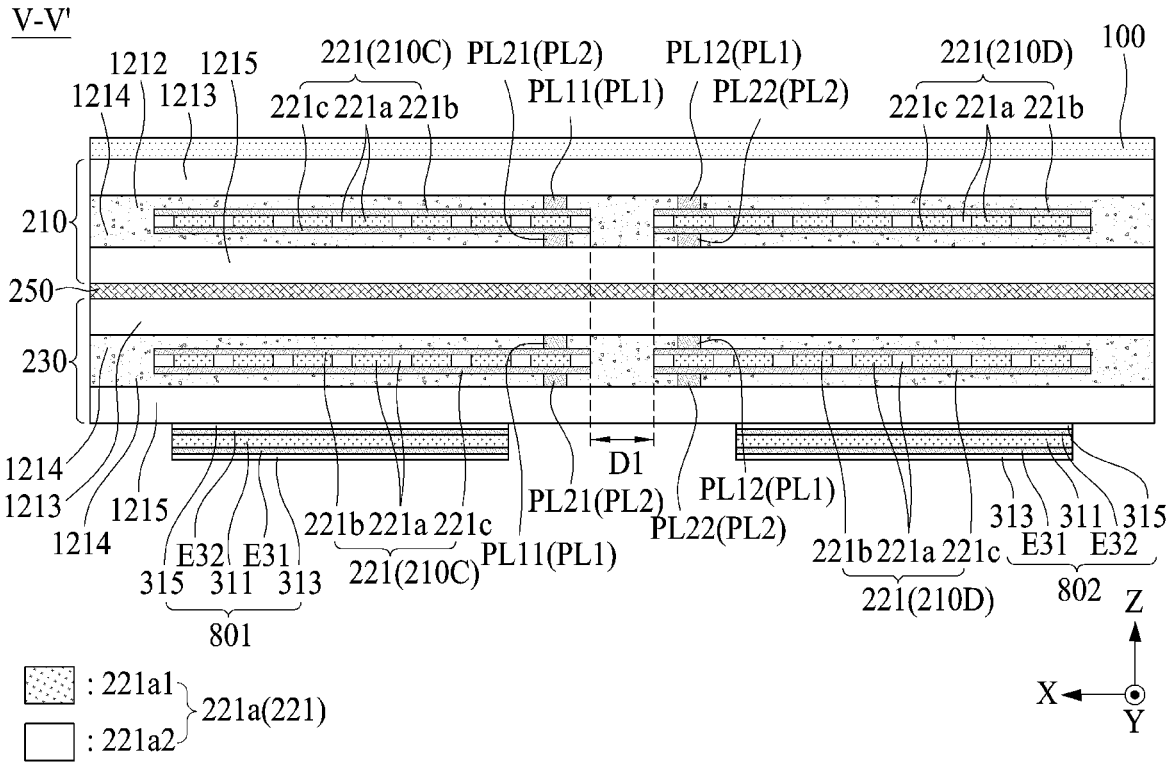
FIG. 22B is another cross-sectional view taken along line V-V' illustrated in FIG. 20.

FIG. 22A is another cross-sectional view taken along line V-V' illustrated in FIG. 20. FIG. 22B is another cross-sectional view taken along line V-V' illustrated in FIG. 20.

With reference to FIGS. 22A and 22B, a pad member may be provided in each of the plurality of vibration generators 210 and 230 of the vibration apparatus 200 of FIGS. 8 to 11, 15 and 16. Therefore, a description of a vibration apparatus is omitted or will be briefly given below.

With reference to FIGS. 20, 22A and 22B, a vibration apparatus 200 according to another aspect of the present disclosure may include a plurality of vibration generators 210 and 230. The plurality of vibration generators 210 and 230 may include a plurality of vibration structures.

According to an aspect of the present disclosure, each of the plurality of vibration structures may include a vibration portion 221. The vibration portion 221 may include a vibration layer 221a, a first electrode layer 221b disposed at a first surface of the vibration layer 221a, and a second electrode layer 221c disposed at a second surface different from the first surface of the vibration layer 221a. Each of the plurality of vibration structures may further include a first protection member 1213 on a first surface of the first electrode layer 221b and a second protection member 1215 on a second surface different from the first surface of the first electrode layer 221b.

According to an aspect of the present disclosure, each of the plurality of vibration structures may further include the vibration layer 221a, the first protection member 1213 over the first surface of the vibration layer 221a, and the second protection member 1215 over the second surface different from the first surface of the vibration layer 221a. Each of the plurality of vibration structures may further include the first electrode layer 221b between the vibration layer 221a and the first protection member 1213 and the second electrode layer 221c between the vibration layer 221a and the second protection member 1215. For example, the first protection member 1213 and the second protection member 1215 of the vibration apparatus may cover the plurality of vibration structures in common. For example, the first protection member 1213 and the second protection member 1215 of the vibration apparatus may be disposed to surround the plurality of vibration structures.

A first pad member 701 may be disposed at the plurality of vibration generators 210 and 230 of the vibration apparatus 200. For example, the first pad member 701 may be disposed at a rear surface of each of the plurality of vibration generators 210 and 230 of the vibration apparatus 200. For example, the first pad member 701 may be disposed under a second vibration generator 230 of the plurality of vibration generators 210 and 230. For example, the first pad member 701 may be disposed between the vibration apparatus 200 and a supporting member. For example, the first pad member 701 may be disposed between the plurality of vibration generators 210 and 230 and the supporting member. For example, the first pad member 701 may be disposed between the rear surface of each of the plurality of vibration generators 210 and 230 and an upper surface of the supporting member. For example, the first pad member 701 may be disposed between a rear surface of the second vibration generator 230 of the plurality of vibration generators 210 and 230 and the upper surface of the supporting member. For example, an end (or one side or one portion) of the first pad member 701 may be disposed to correspond to a first portion 221a1. The end (or one side or one portion) of the first pad member 701 may not overlap with a second portion 221a2 and may overlap with the first portion 221a1. For example, the end (or one side or one portion) of the first pad member 701 may be disposed or aligned at a boundary between the first portion 221a1 and the second portion 221a2. For example, the first pad member 701 may be configured to correspond to both sides of a plurality of first portions 221a1 of a first vibration generator 210 and/or the second vibration generator 230.

A second pad member 702 may be disposed at the plurality of vibration generators 210 and 230 of the vibration apparatus 200. For example, the second pad member 702 may be disposed under the second vibration generator 230 of the plurality of vibration generators 210 and 230. For example, the second pad member 702 may be disposed between the vibration apparatus 200 and the supporting member. For example, the second pad member 702 may be disposed between the plurality of vibration generators 210 and 230 and the supporting member. For example, the second pad member 702 may be disposed between the rear surface of each of the plurality of vibration generators 210 and 230 and the upper surface of the supporting member. For example, the second pad member 702 may be disposed between the rear surface of the second vibration generator 230 of the plurality of vibration generators 210 and 230 and the upper surface of the supporting member. For example, an end (or one side or one portion) of the second pad member 702 may be disposed to correspond to the first portion 221a1. The end (or one side or one portion) of the second pad member 702 may not overlap with the second portion 221a2 and may overlap with the first portion 221a1. For example, the end (or one side or one portion) of the second pad member 702 may be disposed or aligned at the boundary between the first portion 221a1 and the second portion 221a2. For example, the end (or one side or one portion) of the second pad member 702 may be configured to correspond to both sides of the plurality of first portions 221a1 of the first vibration generator 210 and/or the second vibration generator 230. The first pad member 701 and the second pad member 702 may be a resonance control pad, an external resonance pad, a gap pad, or a resonance controller, but aspects of the present disclosure are not limited thereto.

According to another aspect of the present disclosure, the first pad member 701 and the second pad member 702 may be configured with one pad member. For example, the pad member may be configured with one at the rear surface of the second vibration generator 230. For example, the pad member may be disposed at the rear surface of the third vibration structure 210C and the fourth vibration structure 210D of the second vibration generator 230. For example, the pad member may be disposed to include the rear surfaces of the third vibration structure 210C and the fourth vibration structure 210D of the second vibration generator 230 (for example, a region between the third vibration structure 210C and the fourth vibration structure 210D). For example, the pad member may be disposed at the whole rear surface of the third vibration structure 210C and the fourth vibration structure 210D of the second vibration generator 230.

A size of each of the first pad member 701 and the second pad member 702 may be configured to be equal to or different from each of the plurality of vibration structures of the plurality of vibration generators 210 and 230.

A first electrode layer 221b of each of a third vibration structure 210C and a fourth vibration structure 210D in the first vibration generator 210 may be disposed closer to the display panel 100 than a second electrode layer 221c. For example, the first electrode layer 221b may be a negative (−) electrode. For example, the second electrode layer 221c may be a positive (+) electrode. A first electrode layer 221b of each of the third vibration structure 210C and the fourth vibration structure 210D in the second vibration generator 230 may be disposed closer to the display panel 100 than a second electrode layer 221c. For example, the first electrode layer 221b may be a negative (−) electrode. For example, the second electrode layer 221c may be a positive (+) electrode. For example, one or more of the first electrode layer 221b of each of the third vibration structure 210C and the fourth vibration structure 210D in the first vibration generator 210 and the first electrode layer 221b of each of the third vibration structure 210C and the fourth vibration structure 210D in the second vibration generator 230 may be disposed closer to the display panel 100 than the second electrode layer 221c.

According to an aspect of the present disclosure, the first pad member 701 and the second pad member 702 may be configured with one of a silicone-based polymer, paraffin wax, and an acrylic polymer, but aspects of the present disclosure are not limited thereto. For example, the first pad member 701 and the second pad member 702 may be configured with a material which differs from a partition 600, but aspects of the present disclosure are not limited thereto.

The first pad member 701 may decrease heat caused by vibrations of the third vibration structure 210C of the first vibration generator 210 and the third vibration structure 210C of the second vibration generator 230. The second pad member 702 may decrease heat caused by vibrations of the fourth vibration structure 210D of the first vibration generator 210 and the fourth vibration structure 210D of the second vibration generator 230. Therefore, because a pad member is provided in a vibration apparatus, a reduction in a sound pressure level in a specific frequency occurring between a plurality of vibration structures may decrease, and a heat dissipation effect of reducing heat caused by vibrations of the plurality of vibration structures may be enhanced. As another aspect of the present disclosure, a heat dissipation member may be further provided between the display panel 100 and the vibration apparatus. For example, the heat dissipation member may be disposed at the rear surface of the display panel 100.

With reference to FIGS. 20 and 22B, a vibration apparatus 200 according to an aspect of the present disclosure may include a plurality of vibration generators 210 and 230. The plurality of vibration generators 210 and 230 may include a plurality of vibration structures.

For example, each of the plurality of vibration structures may include a vibration portion 221. The vibration portion 221 may include a vibration layer 221a, a first electrode layer 221b disposed at a first surface of the vibration layer 221a, and a second electrode layer 221c disposed at a second surface different from the first surface of the vibration layer 221a. Each of the plurality of vibration structures may further include a first protection member 1213 over a first surface of the first electrode layer 221b and a second protection member 1215 over a second surface different from the first surface of the first electrode layer 221b.

According to an aspect of the present disclosure, each of the plurality of vibration structures may further include the vibration layer 221a, the first protection member 1213 over the first surface of the vibration layer 221a, and the second protection member 1215 over the second surface different from the first surface of the vibration layer 221a. Each of the plurality of vibration structures may further include the first electrode layer 221b between the vibration layer 221a and the first protection member 1213 and the second electrode layer 221c between the vibration layer 221a and the second protection member 1215. For example, the first protection member 1213 and the second protection member 1215 of the vibration apparatus may cover the plurality of vibration structures in common. For example, the first protection member 1213 and the second protection member 1215 of the vibration apparatus may be disposed to surround the plurality of vibration structures.

One or more of the first pad member 801 and the second pad member 802 may be configured to be equal to the vibration apparatus. For example, the first pad member 801 and the second pad member 802 may include a vibration layer 311, a first electrode layer E31, and a second electrode layer E32. For example, the first pad member 801 and the second pad member 802 may include the vibration layer 311, the first electrode layer E31 disposed at a first surface of the vibration layer 311, and the second electrode layer E32 disposed at a second surface different from the first surface of the vibration layer 311. For example, the first pad member 801 and the second pad member 802 may include a vibration layer 311, a first protection member 313, and a second protection member 315. For example, the first pad member 801 and the second pad member 802 may further include the vibration layer 311, the first protection member 313 disposed at a first surface of the vibration layer 311, and the second protection member 315 disposed at a second surface different from the first surface of the vibration layer 311. For example, like the vibration portion 211 described above with reference to FIG. 5 or the vibration portion 211 described above with reference to FIGS. 6A to 6F, the vibration layer 311 may include a first portion 211a and a second portion 211b. For example, the vibration layer 311 of each of the first pad member 801 and the second pad member 802 may be arranged to be identical to the vibration layer 211a of each of the plurality of vibration structures. For example, the arrangement of the first portion and the second portion of the vibration layer 311 of each of the first pad member 801 and the second pad member 802 may be the same as the arrangement of the first portion and the second portion of the vibration layer 211a of each of the plurality of vibration structures. However, aspects of the present disclosure are not limited thereto, and the arrangement of the first portion and the second portion of the vibration layer 311 of each of the first pad member 801 and the second pad member 802 may be configured to be different from the arrangement of the first portion and the second portion of the vibration layer 211a of each of the plurality of vibration structures.

The first protection member 313 may be disposed between the vibration layer 311 and the first electrode layer E31. For example, the first protection member 313 may be disposed under the first electrode layer E31. For example, the first protection member 313 may protect the first electrode layer E31. The second protection member 315 may be disposed between the vibration layer 311 and the second electrode layer E32. For example, the second protection member 315 may be disposed over the second electrode layer E32. For example, the second protection member 315 may protect the second electrode layer E32. The first protection member 313 and the second protection member 315 may be substantially the same as the first protection member 213 or 1213 and the second protection member 215 or 1215 described above with reference to FIGS. 5, 6, and 8 to 10, and thus, their descriptions are omitted.

A first pad member 801 may be disposed at the plurality of vibration generators 210 and 230 of the vibration apparatus 200. For example, the first pad member 801 may be disposed under a second vibration generator 230 of the plurality of vibration generators 210 and 230. For example, the first pad member 801 may be disposed between the vibration apparatus 200 and a supporting member. For example, the first pad member 801 may be disposed between the plurality of vibration generators 210 and 230 and the supporting member. For example, the first pad member 801 may be disposed between the rear surface of each of the plurality of vibration generators 210 and 230 and an upper surface of the supporting member. For example, the first pad member 801 may be disposed between a rear surface of the second vibration generator 230 of the plurality of vibration generators 210 and 230 and the upper surface of the supporting member. For example, an end (or one side or one portion) of the first pad member 801 may be disposed to correspond to a first portion 221a1. The end (or one side or one portion) of the first pad member 801 may not overlap with a second portion 221a2 and may overlap with the first portion 221a1. For example, the end (or one side or one portion) of the first pad member 801 may be disposed or aligned at a boundary between the first portion 221a1 and the second portion 221a2. For example, the first pad member 801 may be configured to correspond to both sides of a plurality of first portions 221a1 of a first vibration generator 210 and/or the second vibration generator 230.

A second pad member 802 may be disposed at the plurality of vibration generators 210 and 230 of the vibration apparatus 200. For example, the second pad member 802 may be disposed under the second vibration generator 230 of the plurality of vibration generators 210 and 230. For example, the second pad member 802 may be disposed between the vibration apparatus 200 and the supporting member. For example, the second pad member 802 may be disposed between the rear surface of each of the plurality of vibration generators 210 and 230 and the upper surface of the supporting member. For example, the second pad member 802 may be disposed between the rear surface of the second vibration generator 230 of the plurality of vibration generators 210 and 230 and the upper surface of the supporting member. For example, an end (or one side or one portion) of the second pad member 802 may be disposed to correspond to the first portion 221a1. The end (or one side or one portion) of the second pad member 802 may not overlap with the second portion 221a2 and may overlap with the first portion 221a1. For example, the end (or one side or one portion) of the second pad member 802 may be disposed or aligned at the boundary between the first portion 221a1 and the second portion 221a2. For example, the second pad member 802 may be configured to correspond to both sides of the plurality of first portions 221a1 of the first vibration generator 210 and/or the second vibration generator 230. The first pad member 801 and the second pad member 802 may be a resonance control pad, an external resonance pad, a gap pad, or a resonance controller, but aspects of the present disclosure are not limited thereto.

According to another aspect of the present disclosure, the first pad member 801 and the second pad member 802 may be configured with one pad member. For example, the pad member may be configured with one at the rear surface of the second vibration generator 230. For example, the pad member may be disposed at the rear surface of the third vibration structure 210C and the fourth vibration structure 210D of the second vibration generator 230. For example, the pad member may be disposed to include the rear surfaces of the third vibration structure 210C and the fourth vibration structure 210D of the second vibration generator 230 (for example, a region between the third vibration structure 210C and the fourth vibration structure 210D). For example, the pad member may be disposed at the whole rear surface of the third vibration structure 210C and the fourth vibration structure 210D of the second vibration generator 230.

A size of one or more of the first pad member 801 and the second pad member 802 may be configured to be equal to or different from each of the plurality of vibration structures.

One or more of the first pad member 801 and the second pad member 802 may be configured to be identical to the vibration generators 210 and 230. For example, one or more of the first pad member 801 and the second pad member 802 may be configured to be identical to the plurality of vibration structures 210A to 210D of the plurality of vibration generators 210 and 230. For example, in a case where one or more of the first pad member 801 and the second pad member 802 are configured to be identical to the vibration generators 210 and 230, a level of a signal applied to the first pad member 801 and the second pad member 802 may be adjusted, and thus, a resonance of the vibration apparatus may be easily adjusted.

According to an aspect of the present disclosure, the first pad member 801 may include the vibration layer 311, the first electrode layer E31, and the second electrode layer E32. For example, like the vibration portion 211 described above with reference to FIG. 5 or the vibration portion 211 described above with reference to FIGS. 6A to 6F, the vibration layer 311 may include a first portion 211a and a second portion 211b. As another aspect of the present disclosure, like the vibration layer 221a described above with reference to FIGS. 8 to 11, the vibration layer 311 may include a first portion 221a1 and a second portion 221a2.

The first protection member 313 may be disposed under the first electrode layer E31. For example, the first protection member 313 may protect the first electrode layer E31. The second protection member 315 may be disposed over the second electrode layer E32. For example, the second protection member 315 may protect the second electrode layer E35. The first protection member 313 and the second protection member 315 may be substantially the same as the first protection member 213 or 1213 and the second protection member 215 or 1215 described above with reference to FIGS. 5, 6A to 6F, and 8 to 10, and thus, their descriptions are omitted.

A first electrode layer 221b of each of a third vibration structure 210C and a fourth vibration structure 210D in the first vibration generator 210 may be disposed closer to the display panel 100 than a second electrode layer 221c. For example, the first electrode layer 221b may be a negative (−) electrode. For example, the second electrode layer 221c may be a positive (+) electrode. A first electrode layer 221b of each of the third vibration structure 210C and the fourth vibration structure 210D in the second vibration generator 230 may be disposed closer to the display panel 100 than a second electrode layer 221c. For example, the first electrode layer 221b may be a negative (−) electrode. For example, the second electrode layer 221c may be a positive (+) electrode. One or more of the first electrode layer 221b of each of the third vibration structure 210C and the fourth vibration structure 210D in the first vibration generator 210 and the first electrode layer 221b of each of the third vibration structure 210C and the fourth vibration structure 210D in the second vibration generator 230 may be disposed closer to the display panel 100 than the second electrode layer 221c.

The second electrode layer E32 of the first pad member 801 may be disposed closer to the display panel 100 than the first electrode layer E31. For example, the first electrode layer E31 may be a negative (−) electrode. For example, the second electrode layer E32 may be a positive (+) electrode. Polarities of the first electrode layer E31 and the second electrode layer E32 of the first vibration generator 210 may be configured to be opposite to those of the first electrode layer E31 and the second electrode layer E32 of the first pad member 801. For example, with respect to the display panel 100, a polarity of the first electrode layer E1 of each of the plurality of vibration structures may differ from the second electrode layer E32 of the first pad member 801. For example, with respect to the display panel 100, the first electrode layer 221b and the second electrode layer 221c of the first vibration generator 210 may be configured with a negative (−) electrode and a positive (+) electrode, and the second electrode layer E32 and the first electrode layer E31 of the first pad member 801 may be configured with a positive (+) electrode and a negative (−) electrode. The second electrode layer E32 of the second pad member 802 may be disposed closer to the display panel 100 than the first electrode layer E31. For example, the first electrode layer E31 may be a negative (−) electrode. For example, the second electrode layer E32 may be a positive (+) electrode. Polarities of the first electrode layer 221b and the second electrode layer 221c of the second vibration generator 230 may be configured to be opposite to those of the first electrode layer E31 and the second electrode layer E32 of the second pad member 802. For example, with respect to the display panel 100, the first electrode layer 221b and the second electrode layer 221c of the second vibration generator 230 may be configured with a negative (−) electrode and a positive (+) electrode, and the second electrode layer E32 and the first electrode layer E31 of the second pad member 802 may be configured with a positive (+) electrode and a negative (−) electrode. Therefore, because the electrode layer of the first pad member 801 and/or the electrode layer of the second pad member 802 is disposed as an electrode layer having a polarity opposite to a polarity of the first vibration generator 210 and/or the second vibration generator 230, a dip phenomenon caused by resonance between a plurality of vibration structures may be offset based on inverse resonance caused by the first pad member 801 and/or the second pad member 802. Accordingly, because a pad member is provided in a vibration apparatus, a reduction in a sound pressure level in a specific frequency occurring in the plurality of vibration structures may decrease.

According to another aspect of the present disclosure, the pad members 701 and 801 may be applied to the apparatus illustrated in FIGS. 3 and 7. With reference to FIGS. 3 and 7, the pad member may be disposed between the vibration apparatus 200 and the first member 510. For example, a size of the first member 510 may be greater than or equal to each of the pad members 701 and 801. In a case where a size of the first member 510 is adjusted to be greater than each of the pad members 701 and 801, the pad members 701 and 801 may output a sound to a forward region with respect to the apparatus, and thus, a sound characteristic and/or a sound pressure level characteristic may be more enhanced. For example, the pad members 701 and 801 may transfer a vibration of the first member 510, which is a vibration plate, to the forward region with respect to the apparatus. For example, the pad members 701 and 801 may each be a sound transfer element, a sound transfer member, or a vibration transfer member, but aspects of present disclosure are not limited thereto. For example, the pad member may be disposed between a rear surface of the vibration apparatus 200 and the first member 510. For example, the pad member may be disposed between the rear surface of the vibration apparatus 200 and each of the first and second members 510 and 550. The pad member may overlap with the supporting member 300. For example, the pad member may overlap with the second supporting member 330. For example, the pad member may overlap with the first member 510. For example, the pad member may overlap with the first member 510 and the second supporting member 330. For example, the pad member may overlap with one or more of the first member 510 and the second member 550. For example, the pad member may overlap with the first member 510, the second member 550, and the second supporting member 330. In a case where interference does not occur between the pad member and the second member 550, the pad member may overlap with the second member 550. For example, the second member 550 may be disposed to be equal to one side (or an end or one portion) of the vibration apparatus 200, or may be configured to be less than the one side (or the end or one portion) of the vibration apparatus 200. The pad member may be a transfer member or a vibration transfer member which transfers a sound or a vibration to the forward region with respect to the apparatus. A pad member may be provided between the vibration apparatus 200 and the first member 510, and thus, a sound or a vibration of the vibration apparatus 200 may be transferred to the forward region with respect to the apparatus, thereby providing an apparatus having an enhanced sound characteristic and/or sound pressure level characteristic.

Figure 23A:
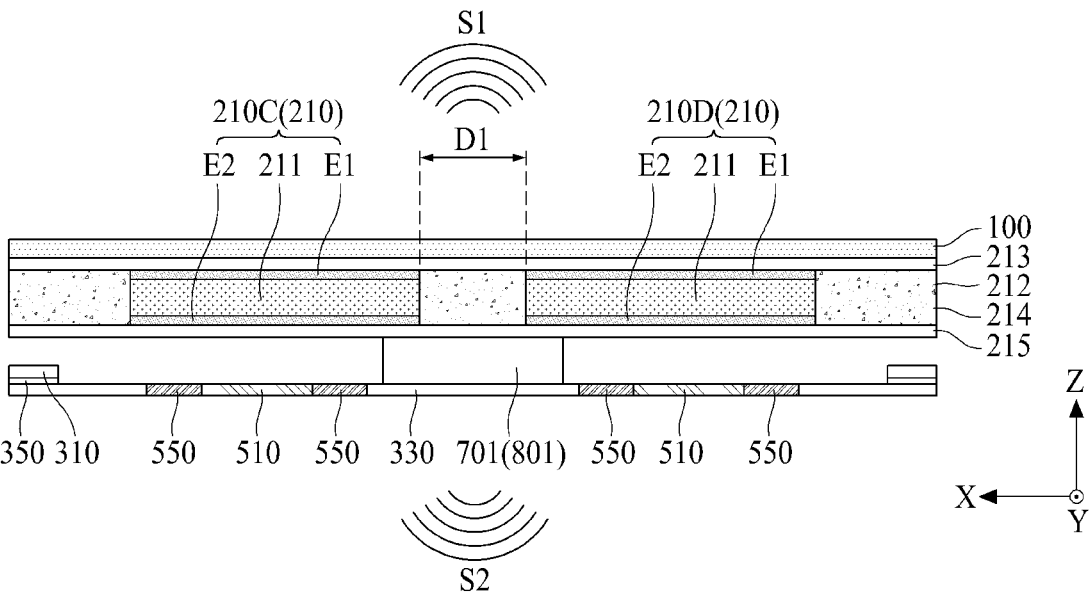
FIGS. 23A to 23C illustrate an apparatus according to another aspect of the present disclosure.
Figure 23B:
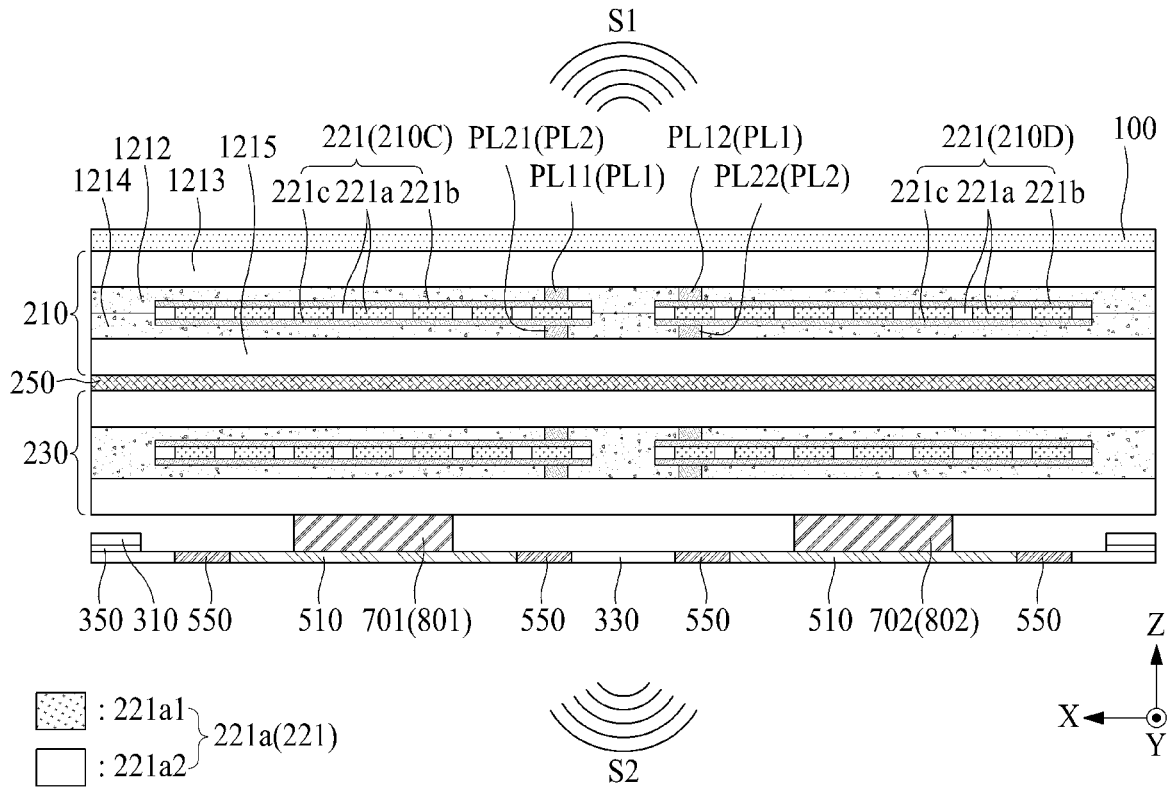
Figure 23C:
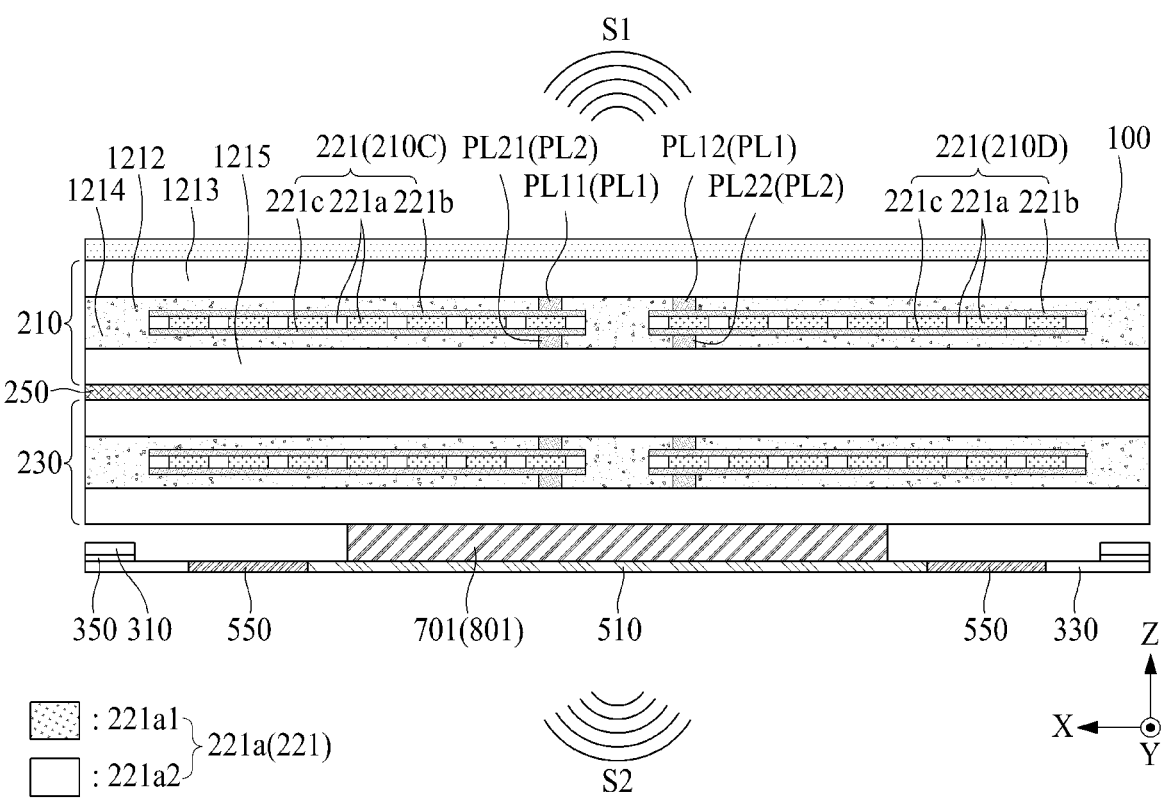

FIGS. 23A to 23C illustrate an apparatus according to another aspect of the present disclosure.

With reference to FIGS. 23A to 23C, the apparatus according to another aspect of the present disclosure may include a vibration apparatus 200, a supporting member 300, and a plurality of pad members 701, 702, 801, and 802.

With reference to FIG. 23A, as described above with reference to FIGS. 20, 21A, and 21B, a vibration apparatus may include a first vibration apparatus 210-1 and a second vibration apparatus 210-2. The pad member 801 of FIG. 21B may also be identically applied. For example, descriptions of FIGS. 23A and 23B may be identically applied to the vibration apparatuses of FIGS. 22A and 22B. For example, a pad member may be applied to the apparatuses of FIGS. 3, 5, 6A to 6F, 13, 14, and 17. For example, the pad member may be implemented together with a first member 510 and a second member 550.

A first pad member 701 may be disposed between a third vibration structure 210C and a fourth vibration structure 210D of the first vibration apparatus 210-1. For example, the first pad member 701 may be disposed between the vibration apparatus and the supporting member 300. For example, the first pad member 701 may be disposed between the vibration apparatus and a second supporting member 330. The first pad member 701 may overlap with the supporting member 300. For example, the first pad member 701 may overlap with the second supporting member 330.

The supporting member 300 may include a first member 510 and a second member 550. For example, the first member 510 and the second member 550 may not be disposed in a region where the vibration apparatus 200 is not disposed. For example, the first member 510 and the second member 550 may overlap with each of a first vibration apparatus 210-1 and a second vibration apparatus 210-2. For example, the first member 510 may overlap with a center of the first vibration apparatus 210-1 and a center of the second vibration apparatus 210-2. The supporting member 300 may be disposed between the first vibration apparatus 210-1 and the second vibration apparatus 210-2. For example, the second supporting member 330 may be disposed between the first vibration apparatus 210-1 and the second vibration apparatus 210-2. The first member 510 and the second member 550 may be disposed on the same surface as the supporting member 300. For example, the first member 510 and the second member 550 may be disposed on the same surface as the second supporting member 330. The second member 550 may be connected to the supporting member 300. For example, the second member 550 may be connected to the second supporting member 330. For example, the first member 510 may be connected to the second member 550. For example, the first member 510 may be disposed between adjacent second members 550. The first member 510 may be configured to vibrate based on a vibration of the vibration apparatus 200. Accordingly, the vibration apparatus 200 may be configured to generate a sound or a vibration (or a first sound or a first vibration S1 toward a front surface of the apparatus, and the first member 510 and/or the second member 550 may be configured to generate a sound or a vibration (or a second sound or a second vibration) S2 toward a rear surface of the supporting member 300.

With reference to FIG. 23B, as described above with reference to FIGS. 20, 22A, and 22B, a vibration apparatus 200 may include a plurality of vibration generators 210 and 230. The plurality of vibration generators 210 and 230 may include a plurality of vibration structures. The pad members 801 and 802 of FIG. 21B may also be identically applied. For example, a pad member may be applied to the apparatuses of FIGS. 7 to 11, 15, and 16. For example, the pad member may be implemented together with a first member 510 and a second member 550.

The first pad member 701 may be disposed at the plurality of vibration generators 210 and 230 of the vibration apparatus 200. For example, the first pad member 701 may be disposed between the vibration apparatus and the supporting member 300. For example, the first pad member 701 may be disposed between a rear surface of a second vibration generator 230 of the plurality of vibration generators 210 and 230 and an upper surface of the supporting member 300.

The second pad member 702 may be disposed at the plurality of vibration generators 210 and 230 of the vibration apparatus 200. For example, the second pad member 702 may be disposed between the vibration apparatus and the supporting member 300. For example, the second pad member 702 may be disposed between the rear surface of the second vibration generator 230 of the plurality of vibration generators 210 and 230 and the upper surface of the supporting member 300.

The supporting member 300 may include a first member 510 and a second member 550. For example, the first member 510 and the second member 550 may not be disposed in a region where the vibration apparatus 200 is not disposed. For example, a size of the first member 510 may be greater than or equal to each of the pad members 701 and 702. In a case where a size of the first member 510 is adjusted to be greater than each of the pad members 701 and 702, the pad members 701 and 702 may output a sound to a forward region with respect to the apparatus, and thus, a sound characteristic and/or a sound pressure level characteristic may be more enhanced. For example, the pad members 701 and 702 may transfer a vibration of the first member 510, which is a vibration plate, to the forward region with respect to the apparatus. For example, the pad members 701 and 702 may each be a sound transfer element, a sound transfer member, or a vibration transfer member, but aspects of present disclosure are not limited thereto. For example, the pad members 701 and 702 may be disposed between a rear surface of the vibration apparatus 200 and the first member 510. For example, the pad members 701 and 702 may be disposed between the rear surface of the vibration apparatus 200 and each of the first and second members 510 and 550. For example, the pad members 701 and 702 may overlap with the first member 510. For example, the pad members 701 and 702 may overlap with one or more of the first member 510 and the second member 550. In a case where interference does not occur between the pad members 701 and 702 and the second member 550, the pad members 701 and 702 may overlap with the second member 550. For example, the second member 550 may be disposed to be equal to one side (or an end or one portion) of the vibration apparatus 200, or may be configured to be less than the one side (or the end or one portion) of the vibration apparatus 200. For example, the second member 550 may be disposed to be equal to one side (or an end or one portion) of the second vibration apparatus 210-2, or may be configured to be less than the one side (or the end or one portion) of the second vibration apparatus 210-2.

According to an aspect of the present disclosure, the first member 510 and the second member 550 may overlap with the second vibration generator 230. For example, the first member 510 may overlap with a center of each of a plurality of vibration structures 210C and 210D included in the second vibration generator 230. The supporting member 300 may be disposed between the plurality of vibration structures 210C and 210D. For example, the second supporting member 330 may be disposed between the plurality of vibration structures 210C and 210D. The first member 510 and the second member 550 may be disposed on the same surface as the supporting member 300. For example, the first member 510 and the second member 550 may be disposed on the same surface as the second supporting member 330. The second member 550 may be connected to the supporting member 300. For example, the second member 550 may be connected to the second supporting member 330. For example, the first member 510 may be connected to the second member 550. For example, the first member 510 may be disposed between adjacent second members 550. The first member 510 may be configured to vibrate based on a vibration of each of the plurality of vibration generators 210 and 230. Accordingly, the plurality of vibration generators 210 and 230 may be configured to generate a sound or a vibration (or a first sound or a first vibration) S1 toward a front surface of the apparatus, and the first member 510 and/or the second member 550 may be configured to generate a sound or a vibration (or a second sound or a second vibration) S2 toward a rear surface of the supporting member 300.

With reference to FIG. 23C, pad members 701 and 801 may be disposed between a vibration apparatus 200 and a supporting member 300. For example, the pad members 701 and 801 may be disposed between the vibration apparatus 200 and a second supporting member 330. For example, the pad members 701 and 801 may be disposed between a rear surface of the vibration apparatus 200 and the second supporting member 330. For example, the pad members 701 and 801 may be disposed between a rear surface of a second vibration generator 230 and the second supporting member 330. For example, the pad members 701 and 801 may overlap with the supporting member 300. For example, the pad members 701 and 801 may overlap with the second supporting member 330. The pad members 701 and 801 may each be a transfer member or a vibration transfer member, which transfers a sound or a vibration of the vibration apparatus 200 to a forward region with respect to the apparatus. A size of the first member 510 may be greater than or equal to each of the pad members 701 and 801. In a case where a size of the first member 510 is adjusted to be greater than each of the pad members 701 and 801, the pad members 701 and 801 may output a sound to a forward region with respect to the apparatus, and thus, a sound characteristic and/or a sound pressure level characteristic may be more enhanced. For example, the pad members 701 and 801 may transfer a vibration of the first member 510, which is a vibration plate, to the forward region with respect to the apparatus. For example, the pad members 701 and 801 may each be a sound transfer element, a sound transfer member, or a vibration transfer member, but aspects of present disclosure are not limited thereto. A pad member may be provided between the vibration apparatus 200 and the supporting member 300, and thus, a sound or a vibration of the vibration apparatus 200 may be transferred to the forward region with respect to the apparatus, thereby providing an apparatus having an enhanced sound characteristic and/or sound pressure level characteristic. The description of FIG. 23C may be applied to FIGS. 3 to 5, 7 to 11, 13 to 17, and 22B.

Figure 24A:
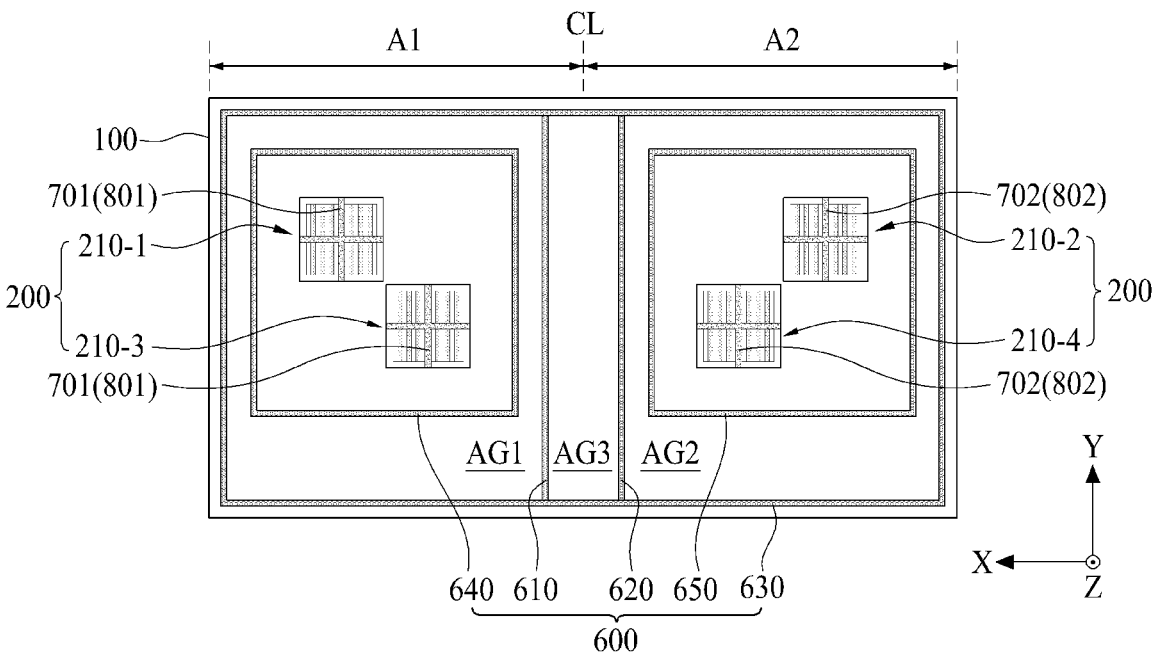
FIGS. 24A and 24B illustrate an apparatus according to another aspect of the present disclosure.
Figure 24B:
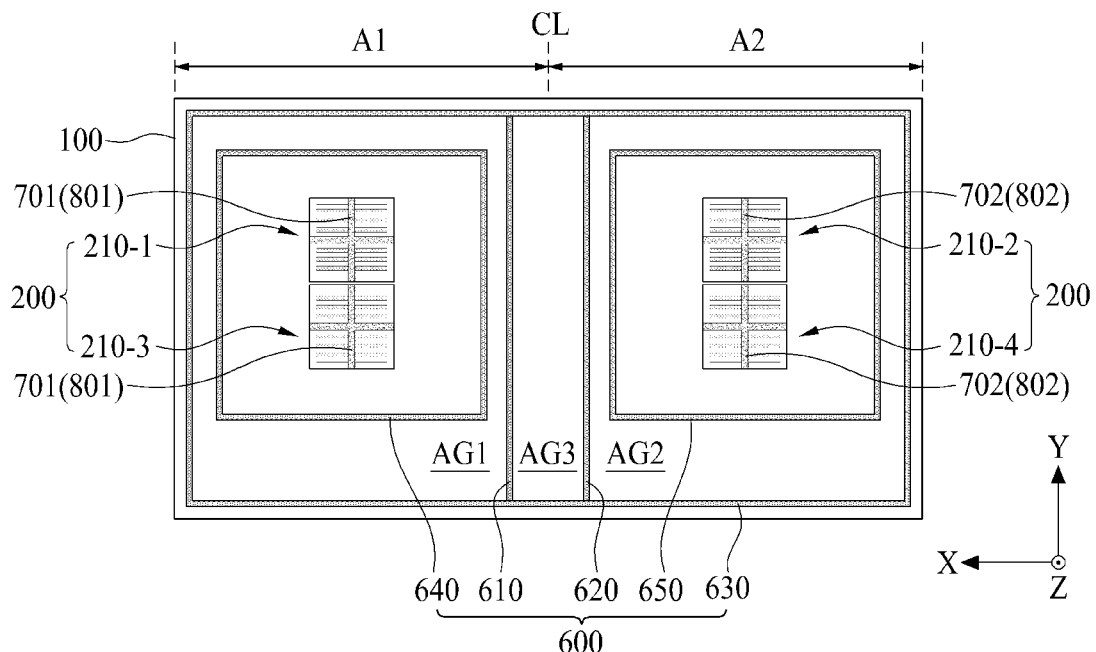

FIGS. 24A and 24B illustrate an apparatus according to another aspect of the present disclosure.

With reference to FIGS. 24A and 24B, a vibration apparatus according to another aspect of the present disclosure may include a first vibration apparatus 210-1, a second vibration apparatus 210-2, a third vibration apparatus 210-3, and a fourth vibration apparatus 210-4, which are disposed at a rear surface of a display panel 100. FIGS. 24A and 24B may be described using the apparatus of FIGS. 14 and 15 as an example, but aspects of the present disclosure are not limited thereto. For example, descriptions of FIGS. 24A and 24B may be applied to FIGS. 3 to 5, 8 to 13, and 16 to 18. Descriptions of FIGS. 24A and 24B may be applied to FIGS. 21A to 22B.

With reference to FIG. 24A, each of the first vibration apparatus 210-1 and the third vibration apparatus 210-3 may be disposed at a first region A1 of the display panel 100. For example, each of the first vibration apparatus 210-1 and the third vibration apparatus 210-3 may be disposed to be staggered or in a diagonal direction in the first region A1 of the display panel 100. Accordingly, a vibration area of the first region A1 of the display panel 100 may be increased. For example, the diagonal direction may be a direction between a first direction X and a second direction Y.

The first vibration apparatus 210-1 and the third vibration apparatus 210-3 may be surrounded by a partition 600. For example, the first vibration apparatus 210-1 and the third vibration apparatus 210-3 may be surrounded by a fourth partition member 640 (or a first enclosure).

Each of the first vibration apparatus 210-1 and the third vibration apparatus 210-3 may be configured to vibrate the first region A1 of the display panel 100, and thus, may be configured to generate a second vibration sound (or a left sound) in the first region A1 of the display panel 100 or may be configured to generate a second haptic feedback. For example, a vibration area of the first region A1 of the display panel 100 may enlarge based on a parallel arrangement structure of the first vibration apparatus 210-1 and the third vibration apparatus 210-3, thereby enhancing a sound characteristic including a low-pitched sound band of the left sound. For example, in addition to the first vibration apparatus 210-1, the third vibration apparatus 210-3 may be further disposed at the first region A1 of the display panel 100, and thus, the second vibration sound or the second haptic feedback according to another aspect of the present disclosure may be more enhanced than the second vibration sound or the second haptic feedback described above with reference to FIG. 19.

According to an aspect of the present disclosure, the first vibration apparatus 210-1 may be disposed to be close to a periphery in the first region A1 of the display panel 100. For example, the first vibration apparatus 210-1 may be disposed at a left upper region adjacent to a periphery of the display panel 100 in the first region A1 of the display panel 100. The third vibration apparatus 210-3 may be disposed to be close to a center line CL of the display panel 100 in the first region A1 of the display panel 100. For example, the third vibration apparatus 210-3 may be disposed at a right lower region adjacent to the center line CL of the display panel 100 in the first region A1 of the display panel 100. The third vibration apparatus 210-3 may be disposed to be staggered with respect to the first vibration apparatus 210-1 in the first region A1 of the display panel 100, and thus, may not overlap with the first vibration apparatus 210-1 in the first direction X and the second direction Y. According to an aspect of the present disclosure, a diagonal arrangement structure of the first vibration apparatus 210-1 and the third vibration apparatus 210-3 may have an effect where two vibration apparatuses 210-1 and 210-3 are arranged in a 2×2 structure in the first region A1 of the display panel 100, and thus, the number of vibration apparatuses vibrating the first region A1 of the display panel 100 may decrease by half.

Each of the second vibration apparatus 210-2 and the fourth vibration apparatus 210-4 may be disposed at a second region A2 of the display panel 100. For example, each of the second vibration apparatus 210-2 and the fourth vibration apparatus 210-4 may be disposed to be staggered or in a diagonal direction in the second region A2 of the display panel 100. Accordingly, a vibration area of the second region A2 of the display panel 100 may be increased. For example, the diagonal may be a direction between the first direction X and the second direction Y.

The second vibration apparatus 210-2 and the fourth vibration apparatus 210-4 may be surrounded by the partition 600. For example, the second vibration apparatus 210-2 and the fourth vibration apparatus 210-4 may be surrounded by a fifth partition member 650 (or a second enclosure).

Each of the second vibration apparatus 210-2 and the fourth vibration apparatus 210-4 may be configured to vibrate the second region A2 of the display panel 100, and thus, may be configured to generate a first vibration sound (or a right sound) in the second region A2 of the display panel 100 or may be configured to generate a first haptic feedback. For example, a vibration area of the second region A2 of the display panel 100 may enlarge based on a diagonal arrangement structure of the second vibration apparatus 210-2 and the fourth vibration apparatus 210-4, thereby enhancing a sound characteristic including a low-pitched sound band of the right sound. For example, in addition to the second vibration apparatus 210-2, the fourth vibration apparatus 210-4 may be further disposed at the second region A2 of the display panel 100, and thus, the first vibration sound or the first haptic feedback according to another aspect of the present disclosure may be more enhanced than the first vibration sound or the first haptic feedback described above with reference to FIG. 19.

According to an aspect of the present disclosure, the second vibration apparatus 210-2 may be disposed to be close to a periphery in the second region A2 of the display panel 100. For example, the second vibration apparatus 210-2 may be disposed at a right upper region adjacent to a periphery of the display panel 100 in the second region A2 of the display panel 100. Also, the first vibration apparatus 210-1 and the second vibration apparatus 210-2 may be a left-right symmetrical with respect to the center line CL of the display panel 100. The fourth vibration apparatus 210-4 may be disposed to be close to the center line CL of the display panel 100 in the second region A2 of the display panel 100. For example, the fourth vibration apparatus 210-4 may be disposed at a left lower region adjacent to the center line CL of the display panel 100 in the second region A2 of the display panel 100. The fourth vibration apparatus 210-4 may be disposed to be staggered with respect to the second vibration apparatus 210-2 in the second region A2 of the display panel 100, and thus, may not overlap with the second vibration apparatus 210-2 in the first direction X and the second direction Y. According to an aspect of the present disclosure, a diagonal arrangement structure of the second vibration apparatus 210-2 and the fourth vibration apparatus 210-4 may have an effect where two vibration apparatuses 210-2 and 210-4 are arranged in a 2×2 structure in the second region A2 of the display panel 100, and thus, the number of vibration apparatuses vibrating the second region A2 of the display panel 100 may decrease by half.

Vibration layers of a plurality of vibration structures included in each of the first to fourth vibration apparatuses 210-1 to 210-4 may be the same or differ. For example, based on a sound characteristic needed for the apparatus, the vibration layer of each of the plurality of vibration structures included in each of the first to fourth vibration apparatuses 210-1 to 210-4 may include a vibration portion 211 and 221 which are the same as or different from one or more of the vibration portion 211 and 221 described above with reference to FIGS. 4 to 6F and 8 to 11. When the vibration layer of the vibration portion 211 and 221 of each of the plurality of vibration structures included in each of the first to fourth vibration apparatuses 210-1 to 210-4 includes different vibration portion 211 and 221 of the vibration portion 211 described above with reference to FIGS. 4 to 6F and 8 to 11, the vibration apparatus 200 may have various resonance frequencies, and thus, a sound pressure level characteristic of a sound and a reproduction band of a sound generated based on a vibration of the vibration apparatus 200 may be considerably increased.

An arrangement structure of the first to fourth vibration apparatuses 210-1 to 210-4 is not limited to an arrangement structure illustrated in FIG. 24A. For example, in each of the first region A1 and the second region A2 of the display panel 100, when a direction between a left upper portion and a right lower portion is referred to as a first diagonal direction and a direction between a right upper portion and a left lower portion is referred to as a second diagonal direction, the first vibration apparatus 210-1 and the third vibration apparatus 210-3 may be disposed in a first diagonal direction or a second diagonal direction, and the second vibration apparatus 210-2 and the fourth vibration apparatus 210-4 may be disposed in a diagonal direction, which is the same as or different from a diagonal arrangement direction of the first vibration apparatus 210-1 and the third vibration apparatus 210-3, of the first diagonal direction or the second diagonal direction. For example, the first vibration apparatus 210-1 and the second vibration apparatus 210-2 may be disposed in a left-right symmetrical structure or a left-right asymmetrical structure with respect to the center line CL of the display panel 100. Also, the third vibration apparatus 210-3 and the fourth vibration apparatus 210-4 may be disposed in a left-right symmetrical structure or a left-right asymmetrical structure with respect to the center line CL of the display panel 100.

Therefore, the apparatus according to another aspect of the present disclosure may provide a sound to a user, output a sound having a two or more-channel type to a forward region in front of the display panel 100, decrease a resonance frequency of the vibration apparatus 200, and dissipate heat of the display panel 100. Moreover, in the apparatus according to another aspect of the present disclosure, a vibration area of each of the first region A1 and the second region A2 may increase based on a diagonal arrangement structure of the first vibration apparatus 210-1 and the third vibration apparatus 210-3 and a diagonal arrangement structure of the second vibration apparatus 210-2 and the fourth vibration apparatus 210-4, and thus, a sound pressure level characteristic of a low-pitched sound band may be more enhanced.

With reference to FIG. 24B, each of a first vibration apparatus 210-1 and a third vibration apparatus 210-3 may be disposed at a first region A1 of a display panel 100. For example, the first vibration apparatus 210-1 and the third vibration apparatus 210-3 may be disposed in parallel in a first direction X (or a widthwise direction) in the first region A1 of the display panel 100. For example, the first vibration apparatus 210-1 and the third vibration apparatus 210-3 may be disposed in one row in a second direction Y (or a lengthwise direction) in the first region A1 of the display panel 100.

The first vibration apparatus 210-1 and the third vibration apparatus 210-3 may be surrounded by a partition 600. For example, the first vibration apparatus 210-1 and the third vibration apparatus 210-3 may be surrounded by a fourth partition member 640 (or a first enclosure).

Each of the first vibration apparatus 210-1 and the third vibration apparatus 210-3 may be configured to vibrate the first region A1 of the display panel 100, and thus, may be configured to generate a second vibration sound (or a left sound) in the first region A1 of the display panel 100 or may be configured to generate a second haptic feedback. For example, a vibration area of the first region A1 of the display panel 100 may enlarge based on a parallel arrangement structure of the first vibration apparatus 210-1 and the third vibration apparatus 210-3, thereby enhancing a sound characteristic including a low-pitched sound band of the left sound. For example, in addition to the first vibration apparatus 210-1, the third vibration apparatus 210-3 may be further disposed at the first region A1 of the display panel 100, and thus, the second vibration sound or the second haptic feedback according to another aspect of the present disclosure may be more enhanced than the second vibration sound or the second haptic feedback described above with reference to FIG. 19.

According to an aspect of the present disclosure, with respect to a center line of the first region A1 of the display panel 100 parallel to the first direction X, the first vibration apparatus 210-1 may be disposed over a center line, and the third vibration apparatus 210-3 may be disposed under the center line. The first vibration apparatus 210-1 and the third vibration apparatus 210-3 may be symmetrical (or vertically symmetrical) with respect to the center line. A vibration area of the first region A1 of the display panel 100 may increase based on a parallel arrangement structure of the first vibration apparatus 210-1 and the third vibration apparatus 210-3, and thus, a sound characteristic including a low-pitched sound band characteristic of a left sound may be enhanced.

According to an aspect of the present disclosure, with respect to the second direction Y, an interval (or a separation distance) between the first vibration apparatus 210-1 and the third vibration apparatus 210-3 may be 0.1 mm or more and smaller than 3 cm, but aspects of the present disclosure are not limited thereto. Accordingly, the occurrence of a crack or damage caused by a physical contact between the first vibration apparatus 210-1 and the third vibration apparatus 210-3 may be prevented.

Each of a second vibration apparatus 210-2 and a fourth vibration apparatus 210-4 may be disposed at a second region A2 of the display panel 100. For example, each of the second vibration apparatus 210-2 and the fourth vibration apparatus 210-4 may be disposed in parallel in the first direction X (or the widthwise direction) in the second region A2 of the display panel 100. For example, each of the second vibration apparatus 210-2 and the fourth vibration apparatus 210-4 may be disposed in one row in the second direction Y (or the lengthwise direction) in the second region A2 of the display panel 100.

The second vibration apparatus 210-2 and the fourth vibration apparatus 210-4 may be surrounded by the partition 600. For example, the second vibration apparatus 210-2 and the fourth vibration apparatus 210-4 may be surrounded by a fifth partition member 650 (or a second enclosure).

Each of the second vibration apparatus 210-2 and the fourth vibration apparatus 210-4 may be configured to vibrate the second region A2 of the display panel 100, and thus, may be configured to generate a first vibration sound (or a right sound) in the second region A2 of the display panel 100 or may be configured to generate a first haptic feedback. For example, a vibration area of the second region A2 of the display panel 100 may enlarge based on a diagonal arrangement structure of the second vibration apparatus 210-2 and the fourth vibration apparatus 210-4, thereby enhancing a sound characteristic including a low-pitched sound band of the right sound. For example, in addition to the second vibration apparatus 210-2, the fourth vibration apparatus 210-4 may be further disposed at the second region A2 of the display panel 100, and thus, the first vibration sound or the first haptic feedback according to another aspect of the present disclosure may be more enhanced than the first vibration sound or the first haptic feedback described above with reference to FIG. 19.

According to an aspect of the present disclosure, with respect to a center line of the second region A2 of the display panel 100 parallel to the first direction X, the second vibration apparatus 210-2 may be disposed over the center line, and the fourth vibration apparatus 210-4 may be disposed under the center line. The second vibration apparatus 210-2 and the fourth vibration apparatus 210-4 may be symmetrical (or vertically symmetrical) with respect to the center line. A vibration area of the second region A2 of the display panel 100 may increase based on a parallel arrangement structure of the second vibration apparatus 210-2 and the fourth vibration apparatus 210-4, and thus, a sound characteristic including a low-pitched sound band characteristic of a right sound may be enhanced.

According to an aspect of the present disclosure, with respect to the second direction Y, an interval (or a separation distance) between the second vibration apparatus 210-2 and the fourth vibration apparatus 210-4 may be 0.1 mm or more and smaller than 3 cm, but aspects of the present disclosure are not limited thereto. Accordingly, the occurrence of a crack or damage caused by a physical contact between the second vibration apparatus 210-2 and the fourth vibration apparatus 210-4 may be prevented.

Vibration layers of a plurality of vibration structures included in each of the first to fourth vibration apparatuses 210-1 to 210-4 may be the same or differ. For example, based on a sound characteristic needed for the apparatus, the vibration layer of each of the plurality of vibration structures included in each of the first to fourth vibration apparatuses 210-1 to 210-4 may include a vibration portion 211 and 221 which are the same as or different from one or more of the vibration portion 211 and 221 described above with reference to FIGS. 2 to 11. When the vibration layer of the vibration portion 211 and 221 of each of the plurality of vibration structures included in each of the first to fourth vibration apparatuses 210-1 to 210-4 includes different vibration portion 211 and 221 of the vibration portion 211 described above with reference to FIGS. 2 to 11, the vibration apparatus 200 may have various resonance frequencies, and thus, a sound pressure level characteristic of a sound and a reproduction band of a sound generated based on a vibration of the vibration apparatus 200 may be considerably increased.

According to an aspect of the present disclosure, in FIG. 24B, it has been described that the first vibration apparatus 210-1 and the third vibration apparatus 210-3 are disposed in a parallel along the first direction X (or the widthwise direction) or in one row along the second direction Y (or the lengthwise direction), but aspects of the present disclosure are not limited thereto. For example, the first vibration apparatus 210-1 and the third vibration apparatus 210-3 may be disposed in a parallel arrangement structure which is disposed in a parallel along the second direction Y (or the lengthwise direction) or in one row in the first direction X (or the widthwise direction), and even in this case, the same effect as FIG. 23A may be realized. Also, the second vibration apparatus 210-2 and the fourth vibration apparatus 210-4 may be disposed in a parallel arrangement structure which is disposed in a parallel along the second direction Y (or the lengthwise direction) or in one row in the first direction X (or the widthwise direction), and even in this case, the same effect as FIG. 24A may be realized.

With reference to FIGS. 24A and 24B, a plurality of first pad members 701 and 801 may be disposed at a plurality of vibration structures of the first vibration apparatus 210-1. A plurality of first pad members 701 and 801 may be disposed at a plurality of vibration structures of the third vibration apparatus 210-3. A plurality of second pad members 702 and 802 may be disposed at a plurality of vibration structures of the second vibration apparatus 210-2. A plurality of second pad members 702 and 802 may be disposed at a plurality of vibration structures of the fourth vibration apparatus 210-4. A description of a pad member may be substantially the same as descriptions given above with reference to FIGS. 20A to 21B, and thus, its description is omitted.

The first pad member 701 and 801 and the second pad member 702 and 802 may be configured with a material which absorbs or adjusts a vibration. For example, the first pad member 701 and 801 and the second pad member 702 and 802 may be configured with one of a silicone-based polymer, paraffin wax, and an acrylic polymer, but aspects of the present disclosure are not limited thereto. For example, each of the first pad member 701 and 801 and the second pad member 702 and 802 may be configured with a material which differs from a partition 600, but aspects of the present disclosure are not limited thereto.

As another aspect of the present disclosure, one or more of the first pad member 701 and 801 and the second pad member 702 and 802 may be configured to be equal to the vibration apparatus 200. For example, one or more of the first pad member 701 and 801 and the second pad member 702 and 802 may be configured to be equal to the vibration portion 211 and 221.

As another aspect of the present disclosure, the pad member may be applied to the apparatus illustrated in FIGS. 3 and 7. With reference to FIGS. 3 and 7, the pad member may be disposed between the vibration apparatus 200 and the supporting member 300. For example, the pad member may be disposed between the vibration apparatus 200 and the second supporting member 330. For example, the pad member may be disposed between the rear surface of the vibration apparatus 200 and the second supporting member 330. For example, the pad member may overlap with the supporting member 300. For example, the pad member may overlap with the second supporting member 330. The pad member may be a transmission member or a vibration transmission member configured to transmit a sound or a vibration of the vibration apparatus 200 to a forward region in front of the apparatus. Because a pad member is provided between the vibration apparatus 200 and the supporting member 300, a sound or a vibration of the vibration apparatus 200 may be transmitted to a forward region in front of the apparatus, thereby providing an apparatus having an enhanced a sound characteristic and/or a sound pressure level characteristic.

Each of the plurality of vibration structures included in each of the first vibration apparatus 210-1, the second vibration apparatus 210-2, the third vibration apparatus 210-3, and the fourth vibration apparatus 210-4 may include a first portion and a second portion of the vibration portion 211 or 221. With reference to FIG. 23A, an arrangement direction of the first portion of the vibration portion 211 or 221 may be the same as an arrangement direction of the second portion of the vibration portion 211 or 221, but aspects of the present disclosure are not limited thereto. For example, the arrangement direction of the first portion and the arrangement direction of the second portion in the vibration portion 211 or 221 may be the same as a length-wise direction of the display panel 100. For example, the arrangement direction of the first portion and the arrange-ment direction of the second portion in the vibration portion 211 or 221 may be the same as the second direction Y of the display panel 100. For example, an arrangement direction of a first portion and an arrangement direction of a second portion in the vibration portion of the first vibration appa-ratus 210-1 may be configured to be identical to the length-wise direction of the display panel 100, and an arrangement direction of a first portion and an arrangement direction of a second portion in the vibration portion of the third vibra-tion apparatus 210-3 may be configured to be identical to the widthwise direction of the display panel 100, but the present disclosure may be implemented to be opposite thereto. For example, an arrangement direction of a first portion and an arrangement direction of a second portion in the vibration portion of the second vibration apparatus 210-2 may be configured to be identical to the lengthwise direction of the display panel 100, and an arrangement direction of a first portion and an arrangement direction of a second portion in the vibration portion of the fourth vibration apparatus 210-4 may be configured to be identical to the widthwise direction of the display panel 100, but the present disclosure may be implemented to be opposite thereto.

As another aspect of the present disclosure, an arrange-ment direction of a first portion and an arrangement direc-tion of a second portion in the vibration portion of the first vibration apparatus 210-1 may be configured to be identical to the lengthwise direction of the display panel 100, and an arrangement direction of a first portion and an arrangement direction of a second portion in the vibration portion of the second vibration apparatus 210-2 may be configured to be identical to the widthwise direction of the display panel 100, but the present disclosure may be implemented to be oppo-site thereto. For example, an arrangement direction of a first portion and an arrangement direction of a second portion in the vibration portion of the third vibration apparatus 210-3 may be configured to be identical to the lengthwise direction of the display panel 100, and an arrangement direction of a first portion and an arrangement direction of a second portion in the vibration portion of the fourth vibration apparatus 210-4 may be configured to be identical to the widthwise direction of the display panel 100, but the present disclosure may be implemented to be opposite thereto.

According to an aspect of the present disclosure, an arrangement direction of a first portion and an arrangement direction of a second portion in the vibration portion included in each of the first vibration apparatus 210-1 and the second vibration apparatus 210-2 may be symmetrical with an arrangement direction of a first portion and an arrangement direction of a second portion in the vibration portion included in each of the third vibration apparatus 210-3 and the fourth vibration apparatus 210-4. As another aspect of the present disclosure, an arrangement direction of a first portion and an arrangement direction of a second portion in the vibration portion included in each of the first vibration apparatus 210-1 and the second vibration appara-tus 210-2 may be asymmetrical with an arrangement direc-tion of a first portion and an arrangement direction of a second portion in the vibration portion included in each of the third vibration apparatus 210-3 and the fourth vibration apparatus 210-4. For example, an arrangement direction of a first portion and an arrangement direction of a second portion in the vibration portion of the first vibration appa-ratus 210-1 may differ from an arrangement direction of a first portion and an arrangement direction of a second portion in the vibration portion of the third vibration appa-ratus 210-3. For example, an arrangement direction of a first portion and an arrangement direction of a second portion in the vibration portion of the second vibration apparatus 210-2 may differ from an arrangement direction of a first portion and an arrangement direction of a second portion in the vibration portion of the fourth vibration apparatus 210-4.

According to an aspect of the present disclosure, the arrangement direction of the first portion and the arrange-ment direction of the second portion of the vibration struc-tures included in the vibration apparatus may be the same the widthwise direction of the display panel 100, may be the same the lengthwise direction of the display panel 100, or may be configured with a combination of the widthwise direction and the lengthwise direction of the display panel 100. For example, the arrangement direction of the first portion and the arrangement direction of the second portion of the vibration structures included in one or more of the first to fourth vibration apparatuses may be the same the width-wise direction of the display panel 100, may be the same the lengthwise direction of the display panel 100, or may be configured with a combination of the widthwise direction and the lengthwise direction of the display panel 100.

With reference to FIGS. 24A and 24B, the apparatus according to an aspect of the present disclosure may further include a partition 600. For example, the partition 600 may include a first partition member 610, a second partition member 620, a third partition member 630, a fourth partition member 640, and a fifth partition member 650. However, aspects of the present disclosure are not limited thereto, and the partition 600 may include the first partition member 610, the third partition member 630, the fourth partition member 640, and the fifth partition member 650. Descriptions thereof may be the same as descriptions given above with reference to FIGS. 19 and 20, and thus, their repetitive descriptions are omitted.

Figure 25:
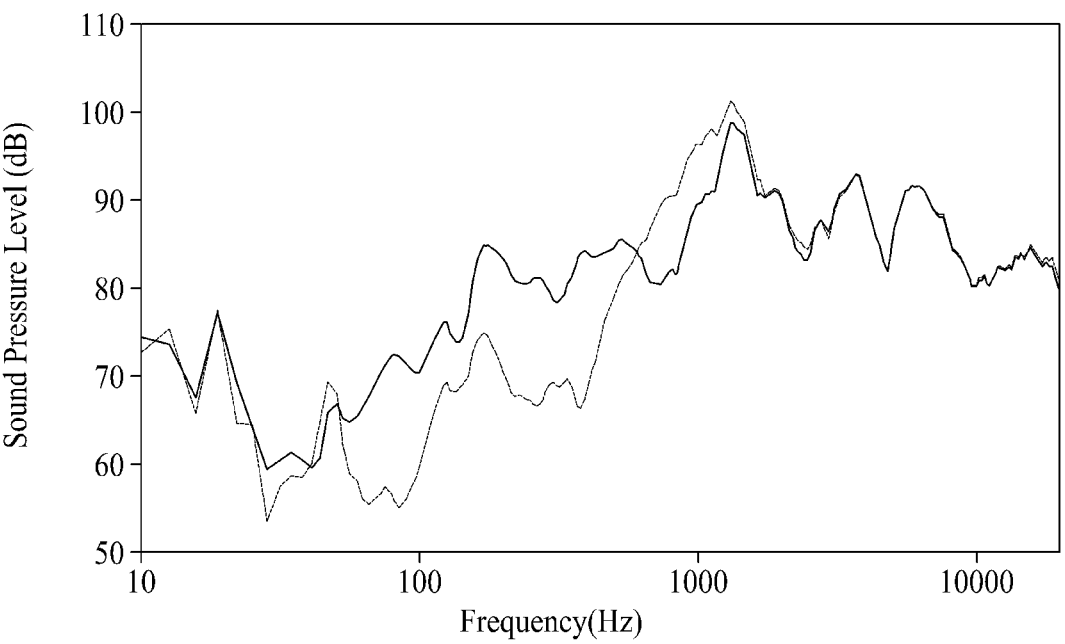
FIG. 25 illustrates a sound output characteristic of an apparatus according to an aspect of the present disclosure.

FIG. 25 illustrates a sound output characteristic of an apparatus according to an aspect of the present disclosure.

A sound output characteristic may be measured by a sound analysis apparatus. The sound output characteristic has been measured by a B&K audio measurement apparatus. The sound analysis apparatus may include a sound card which transmits or receives a sound to or from a control personal computer (PC), an amplifier which amplifies a signal generated from the sound card and transfers the amplified signal to a vibration apparatus, and a microphone which collects a sound generated by the vibration apparatus in a display panel. For example, the microphone may be disposed at a center of the vibration apparatus, and a distance between the display panel and the microphone may be 50 cm. A sound may be measured under a condition where the microphone is vertical to the vibration apparatus. The sound collected through the microphone may be input to the control PC through the sound card, and a control program may check the input sound to analyze a sound of the vibration apparatus. For example, a frequency response characteristic corresponding to a frequency range of 20 Hz to 20 kHz may be measured by a pulse program.

In FIG. 25, the abscissa axis represents a frequency (Hz), and the ordinate axis represents a sound pressure level (SPL) (dB). A dotted line of FIG. 25 represents a sound output characteristic when the hole is provided at the supporting member of FIG. 2 in the apparatus of FIG. 22A and is covered by the cover, and a solid line of FIG. 25 represents a sound output characteristic when the hole is provided at the supporting member of FIG. 2 in the apparatus of FIG. 22A and is not covered by the cover.

With reference to FIG. 25, in a dotted line, it may be seen that, because a hole is covered by a cover although the hole is provided in a supporting member, an internal pressure of an apparatus reduces an amplitude when a display panel is vibrating, and thus, a sound pressure level decreases in a frequency of 100 Hz to 500 Hz.

In a solid line, it may be seen that a peak and/or a dip occur(s) in a frequency of 400 Hz to 800 Hz because a vibration apparatus is exposed to the outside and does not control a division vibration. The peak may be a phenomenon where a sound pressure level bounces in a specific frequency, and the dip may be a phenomenon where a low sound pressure level occurs because the occurrence of a sound having a specific frequency is restricted.

In a dotted line representing a case where a plurality of holes are provided and covered by a cover or an adhesive, the inventors have recognized that a sound pressure level characteristic decreases by about 16 dB in a frequency of about 400 Hz compared to a solid line representing a case where a plurality of holes are provided and are not covered by a cover or an adhesive. Accordingly, when a plurality of holes 301 are covered, it may be seen that a sound of the low-pitched sound band is considerably reduced.

Figure 26:
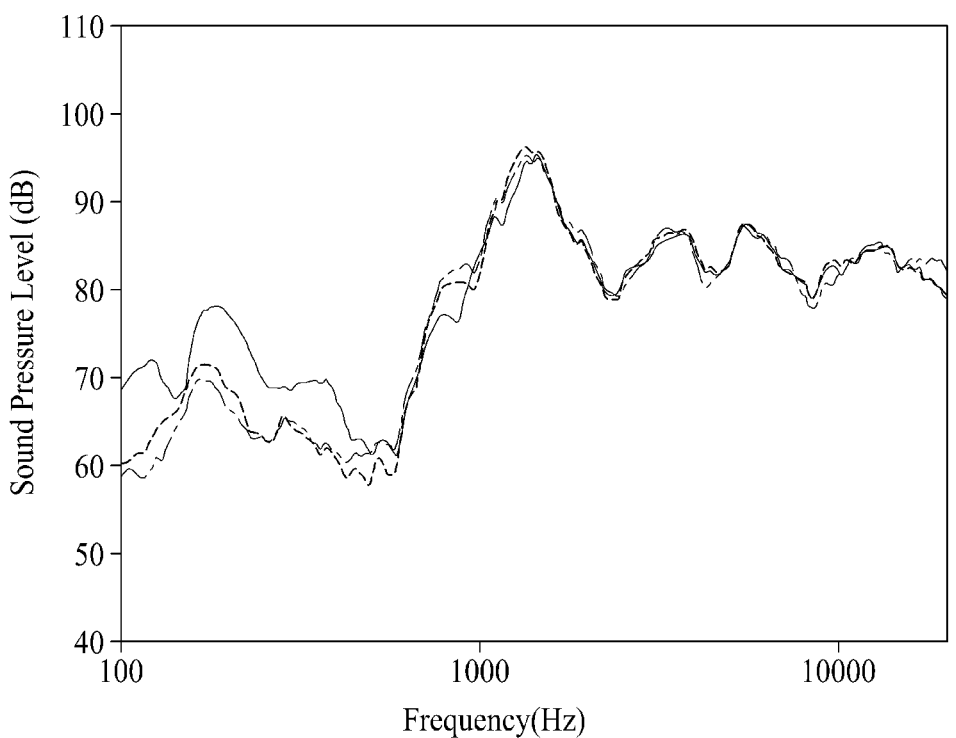
FIG. 26 illustrates a sound output characteristic of an apparatus according to another aspect of the present disclosure.

FIG. 26 illustrates a sound output characteristic of an apparatus according to another aspect of the present disclosure.

A sound output characteristic may be the same as description given above with reference to FIG. 25, and thus, its description is omitted.

With reference to FIG. 26, a solid line represents a sound output characteristic of the apparatus of FIG. 23C, and a dotted line and a one-dot-dashed line represents a sound output characteristic when a first member and a second member are not provided in a supporting member and a pad member is provided in the apparatus of FIG. 23C. The dotted line represents a sound output characteristic in a right portion of the apparatus, and the one-dot-dashed line represents a sound output characteristic in a left portion of the apparatus.

In the solid line, it may be seen that a sound pressure level in a frequency of 1 kHz or less is enhanced by about 10 dB to about 12 dB or more compared to the dotted line and the one-dot-dashed line. For example, in the solid line, it may be seen that a sound pressure level in a frequency of 100 Hz is enhanced by about 12 dB or more compared to the dotted line and the one-dot-dashed line. For example, in the solid line, it may be seen that a sound pressure level in a frequency of 400 Hz to 800 Hz is enhanced by about 8 dB or more compared to the dotted line and the one-dot-dashed line. It may be seen that the dotted line represents a sound output characteristic similar to the one-dot-dashed line. A sound output characteristic corresponding to the solid line may represent a sound output characteristic which is the same as or similar to the apparatus of FIG. 23B.

Therefore, according to an aspect of the present disclosure, because a first member and a second member are provided in a supporting member, particles and water may be prevented from penetrating into the supporting member through a hole, and a clean back design of an apparatus may be implemented, thereby providing an apparatus for enhancing a sound pressure level and/or a sound of the low-pitched sound band.

A vibration apparatus according to an aspect of the present disclosure may be applied to a vibration apparatus disposed in an apparatus. The apparatus according to an aspect of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc. Also, the vibration apparatus according to an aspect of the present disclosure may be applied to organic light emitting lighting apparatuses or inorganic light emitting lighting apparatuses. When the vibration apparatus of an aspect of the present disclosure is applied to lighting apparatuses, the vibration apparatus may act as lighting and a speaker. Also, when the vibration apparatus of an aspect of the present disclosure is applied to a mobile device, the vibration apparatus may act as one or more of a speaker, a receiver, and a haptic, but aspects of the present disclosure are not limited thereto.

An apparatus according to an aspect of the present disclosure will be described below.

An apparatus according to an aspect of the present disclosure may comprise a display panel configured to display an image, a vibration apparatus disposed at a rear surface of the display panel and configured to vibrate the display panel, and a supporting member disposed at the rear surface of the display panel and including a first member and a second member, the first member and the second member are disposed on a same surface or a plane as the supporting member.

According to some aspects of the present disclosure, one or more of the first member and the second member may overlap with the vibration apparatus.

According to some aspects of the present disclosure, the first member may be disposed between the second member.

According to some aspects of the present disclosure, the first member may be connected to the second member, and the second member may be connected to the supporting member.

According to some aspects of the present disclosure, the second member may be configured with a material having elasticity.

According to some aspects of the present disclosure, the second member is configured to have a smaller thickness than the first member.

According to some aspects of the present disclosure, the vibration apparatus may comprise two or more vibration structures.

According to some aspects of the present disclosure, each of the two or more vibration structures may comprise a plurality of first portions including an inorganic material and a plurality of second portions including an organic material disposed between adjacent first portions.

According to some aspects of the present disclosure, the plurality of first portions and the plurality of second portions may be arranged in one or more of a widthwise direction and a lengthwise direction of the display panel.

According to some aspects of the present disclosure, the plurality of first portions may have a piezoelectric characteristic, and the plurality of second portions may have a ductile characteristic.

According to some aspects of the present disclosure, each of the two or more vibration structures may comprise a vibration layer, a first protection member disposed at a first surface of the vibration layer, and a second protection member disposed at a second surface different from the first surface of the vibration layer.

According to some aspects of the present disclosure, each of the two or more vibration structures may further comprise a first electrode layer between the vibration layer and the first protection member, and a second electrode layer between the vibration layer and the second protection member.

According to some aspects of the present disclosure, the apparatus may further comprise a pad member disposed between the two or more vibration structures.

According to some aspects of the present disclosure, the pad member may comprise a vibration layer, a first electrode layer disposed at a first surface of the vibration layer, and a second electrode layer disposed at a second surface different from the first surface of the vibration layer.

According to some aspects of the present disclosure, the pad member may overlap with the supporting member.

According to some aspects of the present disclosure, the apparatus may further comprise a pad member disposed at a rear surface of the vibration apparatus, the pad member may overlap with one or more of the first member and the second member.

According to some aspects of the present disclosure, the display panel may comprise a first region and a second region, the vibration apparatus may comprise a first vibration apparatus configured to vibrate the first region and a second vibration apparatus configured to vibrate the second region, and the first member and the second member may respectively overlap with the first and second vibration apparatuses.

According to some aspects of the present disclosure, the first member may be connected to the second member.

An apparatus according to some aspects of the present disclosure may comprise a vibration member, a vibration apparatus disposed at the vibration member, and a supporting member disposed at a rear surface of the vibration member, the supporting member may comprise a first member overlapping with the vibration apparatus.

According to some aspects of the present disclosure, the vibration member may comprise a plate, and the plate may comprise one of a metal and single nonmetal or composite nonmetal of one or more of wood, plastic, glass, cloth, and leather.

According to some aspects of the present disclosure, the vibration member may comprise one of a display panel including a plurality of pixels configured to display an image, one or more non-display panels of a light emitting diode lighting panel, an organic light emitting lighting panel, and an inorganic light emitting lighting panel.

According to some aspects of the present disclosure, the vibration member may comprises one of a display panel including a pixel configured to display an image, one or more of a vehicular interior material, a vehicular glass window, a vehicular exterior material, a building ceiling material, a building interior material, a building glass window, an aircraft interior material, and an aircraft glass window.

According to some aspects of the present disclosure, the apparatus may further comprise a second member around the first member.

According to some aspects of the present disclosure, the vibration apparatus may comprise a plurality of vibration generators.

According to some aspects of the present disclosure, each of the plurality of vibration generators may comprise a plurality of vibration structures.

According to some aspects of the present disclosure, each of the plurality of vibration generators may be stacked to be displaced in the same direction.

According to some aspects of the present disclosure, the apparatus may further comprise a pad member disposed at a rear surface each of the plurality of vibration generators.

According to some aspects of the present disclosure, the apparatus may further comprise a pad member between the vibration apparatus and the supporting member.

According to some aspects of the present disclosure, the pad member may be configured to be equal to the vibration apparatus.

According to some aspects of the present disclosure, the pad member may overlap with the first member.

According to some aspects of the present disclosure, the apparatus may further comprise a pad member between the vibration apparatus and the first member.

According to some aspects of the present disclosure, the supporting member may comprise a first region overlapping with a center of the vibration apparatus, a second region overlapping with a periphery of the vibration apparatus, and a third region between the first region and the second region, the first member may be disposed at the first region of the supporting member, and the second member may be disposed at the third region of the supporting member.

According to some aspects of the present disclosure, the first member may be disposed between the second member.

According to some aspects of the present disclosure, the second member may be connected to the supporting member.

According to some aspects of the present disclosure, the first member may be configured to vibrate according to a vibration of the vibration apparatus.

According to some aspects of the present disclosure, the second member may be configured to surround the first member and has a ductile characteristic.

According to some aspects of the present disclosure, the second member may include a material different from the supporting member.

According to some aspects of the present disclosure, the first member may be configured to generate a sound or a vibration toward a rear surface of the supporting member.

An apparatus according to an embodiment of the present disclosure may comprise a vibration member, a supporting member disposed at a rear surface of the vibration member, a vibration apparatus disposed between the vibration member and the supporting member to vibrate the vibration member, the supporting member includes a first member and a second member overlapping with the vibration apparatus, and the first member and the second member are disposed on a same surface in the supporting member.

An apparatus according to an embodiment of the present disclosure may comprise a display panel displaying an image, a vibration apparatus including a piezoelectric portion and a ductile portion, and configured to generate a first vibration out of a front surface of the apparatus, a first member spaced apart from the rear surface of the display panel and configured to generate a second vibration out of a rear surface of the apparatus, a second member adjacent to the first member that is disposed between two adjacent second members, and a gap space disposed between the vibration apparatus and the first member.

It will be apparent to those skilled in the art that various modifications and variations can be made in the present disclosure without departing from the technical idea or scope of the disclosures. Thus, it is intended that aspects of the present disclosure cover the modifications and variations of the disclosure provided they come within the scope of the appended claims and their equivalents.

What is claimed is:

1. An apparatus, comprising:
a display panel displaying an image;
a vibration apparatus disposed at a rear surface of the display panel and configured to vibrate the display panel; and
a supporting member separated from the vibration apparatus by an air gap and including a first member and a second member,
wherein the first member and the second member are disposed on a rear planar surface of the supporting member and the second member is disposed at least on two lateral sides of the first member to dampen vibrations of the first member,
wherein the first member and the second member are disposed to be co-planar on the rear planar surface of the supporting member, and
wherein the vibration apparatus is disposed between the display panel and the first member, and the vibration apparatus is disposed between the display panel and the second member.

2. The apparatus of claim 1, wherein the second member dampens low frequency acoustic signals travelling in a rear direction of the apparatus.

3. The apparatus of claim 1, wherein the first member is connected to the second member that is connected to the supporting member.

4. The apparatus of claim 1, wherein the vibration apparatus comprises two or more vibration structures.

5. The apparatus of claim 4, wherein each of the two or more vibration structures comprises a plurality of first portions including an inorganic material and a plurality of second portions including an organic material disposed between two adjacent first portions.

6. The apparatus of claim 5, wherein the plurality of first portions and the plurality of second portions are disposed to have an arrangement direction in one or more of a widthwise direction and a lengthwise direction of the display panel.

7. The apparatus of claim 5, wherein the plurality of first portions have a piezoelectric characteristic, and the plurality of second portions have a ductile characteristic.

8. The apparatus of claim 4, wherein each of the two or more vibration structures comprises:
a vibration layer;
a first protection member disposed at a first surface of the vibration layer; and
a second protection member disposed at a second surface different from the first surface of the vibration layer.

9. The apparatus of claim 8, wherein each of the two or more vibration structures further comprises:
a first electrode layer between the vibration layer and the first protection member; and
a second electrode layer between the vibration layer and the second protection member.

10. The apparatus of claim 4, further comprising a pad member disposed between the two or more vibration structures.

11. The apparatus of claim 10, wherein the pad member comprises:
a vibration layer;
a first electrode layer disposed at a first surface of the vibration layer; and
a second electrode layer disposed at a second surface different from the first surface of the vibration layer.

12. The apparatus of claim 10, wherein the pad member overlap with the supporting member.

13. The apparatus of claim 1, further comprising a pad member disposed at a rear surface of the vibration apparatus, wherein the pad member overlap with one or more of the first member and the second member.

14. The apparatus of claim 1, wherein the display panel comprises a first region and a second region,
wherein the vibration apparatus comprises a first vibration apparatus configured to vibrate the first region and a second vibration apparatus configured to vibrate the second region, and
wherein the first member and the second member respectively overlap with the first and second vibration apparatuses.

15. The apparatus of claim 14, wherein the first member is connected to the second member.

16. An apparatus, comprising:
a vibration member;
a vibration apparatus interfacing with the vibration member and configured to generate a sound in a forward direction of the vibration member; and
a supporting member separated from a rear surface of the vibration apparatus by an air gap,
wherein the supporting member comprises a first member overlapping with the vibration apparatus and configured to generate a sound in a reverse direction opposite to the forward direction and a second member is disposed on at least on two lateral sides of the first member to dampen vibrations of the first member,
wherein the first member and the second member are disposed to be co-planar on the rear planar surface of the supporting member, and
wherein the vibration apparatus is disposed between the display panel and the first member, and the vibration apparatus is disposed between the display panel and the second member.

17. The apparatus of claim 16, wherein the vibration member comprises a plate, and wherein the plate includes one of a metal and single nonmetal or composite nonmetal of one or more of wood, plastic, glass, cloth and leather.

18. The apparatus of claim 16, wherein the vibration member comprises one of a display panel including a plurality of pixels displaying an image, one or more non-display panels of a light emitting diode lighting panel, an organic light emitting lighting panel and an inorganic light emitting lighting panel.

19. The apparatus of claim 16, wherein the vibration member comprises one of a display panel including a pixel displaying an image, one or more of a vehicular interior material, a vehicular glass window, a vehicular exterior material, a building ceiling material, a building interior material, a building glass window, an aircraft interior material and an aircraft glass window.

20. The apparatus of claim 16, wherein the second member dampens low frequency acoustic signals travelling in the reverse direction.

21. The apparatus of claim 16, wherein the vibration apparatus comprises a plurality of vibration generators.

22. The apparatus of claim 21, wherein each of the plurality of vibration generators comprises a plurality of vibration structures.

23. The apparatus of claim 21, wherein each of the plurality of vibration generators is stacked to be displaced in a same direction.

24. The apparatus of claim 21, further comprising a pad member disposed at a rear surface of each of the plurality of vibration generators.

25. The apparatus of claim 16, further comprising a pad member between the vibration apparatus and the supporting member.

26. The apparatus of claim 25, wherein the pad member is configured to be equal to the vibration apparatus.

27. The apparatus of claim 25, wherein the pad member overlaps with the first member.

28. The apparatus of claim 16, further comprising a pad member between the vibration apparatus and the first member.

29. The apparatus of claim 16, wherein the supporting member has a first region overlapping with a center of the vibration apparatus, a second region overlapping with a periphery of the vibration apparatus, and a third region between the first region and the second region, wherein the first member is disposed at the first region of the supporting member, and wherein a second member is disposed at the third region of the supporting member.

30. The apparatus of claim 29, wherein the first member is disposed between two adjacent second member.

31. The apparatus of claim 29, wherein the second member is connected to the supporting member.

32. The apparatus of claim 16, wherein the first member is configured to vibrate according to a vibration of the vibration apparatus.

33. The apparatus of claim 32, wherein the second member surrounds the first member and has a ductile characteristic.

34. The apparatus of claim 16, wherein the second member includes a material different from the supporting member.

35. The apparatus of claim 16, wherein the first member is configured to generate the sound toward a rear surface of the supporting member.

36. An apparatus, comprising:

a display panel displaying an image;

a vibration apparatus including a piezoelectric portion and a ductile portion, and configured to generate a first vibration from a front surface of the apparatus;

a first member disposed on and planar with a rear surface of the vibration apparatus and separated from a rear surface of the display panel by an air gap and configured to generate a second vibration; and a second member that borders the first member on the rear surface of the vibration apparatus to dampen the second vibration of the first member, wherein the first member and the second member are disposed to be co-planar on the rear planar surface of the supporting member, and wherein the vibration apparatus is disposed between the display panel and the first member, and the vibration apparatus is disposed between the display panel and the second member.

37. The apparatus of claim 36, wherein the second member surrounds the first member.

38. The apparatus of claim 36, wherein the second vibration is different from the first vibration.

\* \* \* \* \*